(12) United States Patent
Kanno

(10) Patent No.: US 12,373,140 B2
(45) Date of Patent: Jul. 29, 2025

(54) STORAGE SYSTEM, INFORMATION PROCESSING SYSTEM AND METHOD FOR CONTROLLING NONVOLATILE MEMORY

(71) Applicant: KIOXIA CORPORATION, Tokyo (JP)

(72) Inventor: Shinichi Kanno, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/484,563

(22) Filed: Oct. 11, 2023

(65) Prior Publication Data

US 2024/0045619 A1 Feb. 8, 2024

Related U.S. Application Data

(63) Continuation of application No. 17/536,502, filed on Nov. 29, 2021, now Pat. No. 11,847,350, which is a
(Continued)

(30) Foreign Application Priority Data

Mar. 8, 2016 (JP) .................................. 2016-044261

(51) Int. Cl.
*G06F 3/06* (2006.01)
*G11C 16/10* (2006.01)
(Continued)

(52) U.S. Cl.
CPC .......... *G06F 3/0659* (2013.01); *G06F 3/0604* (2013.01); *G06F 3/0608* (2013.01); *G06F 3/0616* (2013.01); *G06F 3/0631* (2013.01); *G06F 3/0652* (2013.01); *G06F 3/0679* (2013.01); *G06F 3/0688* (2013.01);
(Continued)

(58) Field of Classification Search
CPC .... G06F 3/0659; G06F 3/0604; G06F 3/0608; G06F 3/0616; G06F 3/0631; G06F 3/0652; G06F 3/0679; G06F 3/0688; G11C 16/10; G11C 16/16; G11C 16/26; G11C 16/3495
See application file for complete search history.

(56) References Cited

U.S. PATENT DOCUMENTS

| 6,609,187 B1 | 8/2003 | Merrell | |
|---|---|---|---|
| 10,095,443 B2 | 10/2018 | Kanno | |
| 2010/0100667 A1* | 4/2010 | Kang | ................... G06F 12/0246 |
| | | | 711/E12.001 |
| 2011/0047347 A1* | 2/2011 | Li | ........................ G06F 12/0246 |
| | | | 711/201 |

(Continued)

FOREIGN PATENT DOCUMENTS

| CN | 103123608 A | 5/2013 |
|---|---|---|
| JP | 2000-35919 A | 2/2000 |

*Primary Examiner* — Edward J Dudek, Jr.
(74) *Attorney, Agent, or Firm* — Oblon, McClelland, Maier & Neustadt, L.L.P.

(57) ABSTRACT

According to one embodiment, a storage system performs a first allocation operation of allocating, for a first namespace, a plurality of first blocks included in the blocks of a nonvolatile memory. The storage system performs a read operation, a write operation or an erase operation on one of the first blocks in response to a command received from a host to read, write or erase the one first block, counts the total number of erase operations performed on the first blocks, and notifies the host of the counted number of erase operations in response to a command received from the host to obtain an erase count associated with the first namespace.

22 Claims, 54 Drawing Sheets

Related U.S. Application Data continuation of application No. 16/850,508, filed on Apr. 16, 2020, now Pat. No. 11,237,764, which is a continuation of application No. 16/121,161, filed on Sep. 4, 2018, now Pat. No. 10,664,197, which is a continuation of application No. 15/250,215, filed on Aug. 29, 2016, now Pat. No. 10,095,443.

(51) Int. Cl.
    *G11C 16/16* (2006.01)
    *G11C 16/26* (2006.01)
    *G11C 16/34* (2006.01)

(52) U.S. Cl.
    CPC .............. *G11C 16/10* (2013.01); *G11C 16/16* (2013.01); *G11C 16/26* (2013.01); *G11C 16/3495* (2013.01)

(56) References Cited

U.S. PATENT DOCUMENTS

| | | | |
|---|---|---|---|
| 2014/0215129 A1* | 7/2014 | Kuzmin | G06F 12/0246 711/103 |
| 2015/0095737 A1* | 4/2015 | Grimsrud | G06F 11/1004 714/758 |
| 2015/0378886 A1 | 12/2015 | Nemazie | |
| 2016/0011815 A1* | 1/2016 | Klein | G06F 3/0616 714/6.12 |
| 2016/0092121 A1 | 3/2016 | Nazari | |
| 2016/0170663 A1 | 6/2016 | Masumoto | |
| 2016/0188226 A1 | 6/2016 | Haines | |
| 2016/0321010 A1* | 11/2016 | Hashimoto | G06F 3/0608 |
| 2017/0153843 A1* | 6/2017 | Dewitt | G06F 3/0605 |
| 2017/0242722 A1* | 8/2017 | Qiu | G06F 3/0655 |
| 2017/0322739 A1 | 11/2017 | Grimsrud | |
| 2017/0371780 A1 | 12/2017 | Hashimoto | |

* cited by examiner

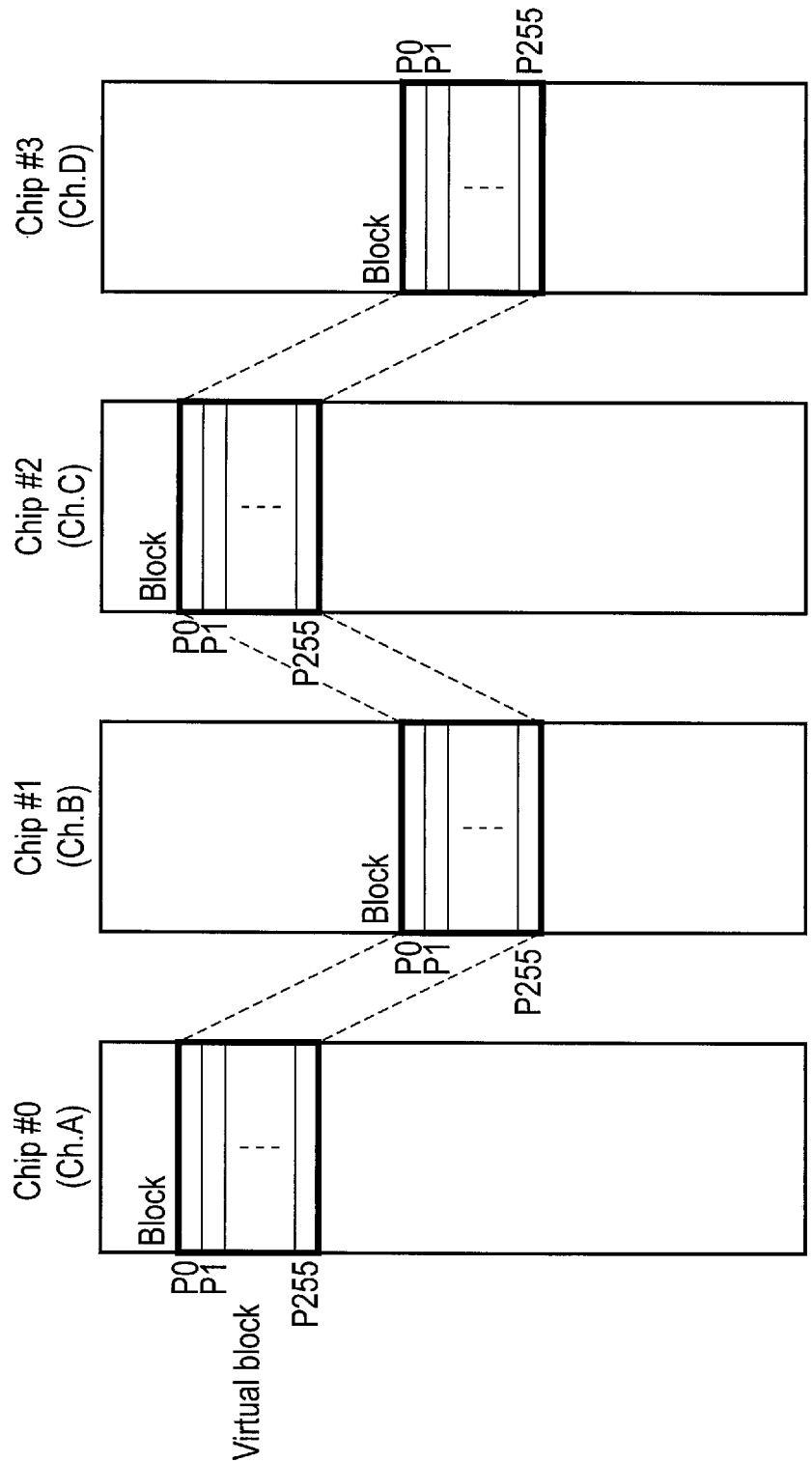
F I G. 5

33E

| Virtual block structure information |
|---|
| Equivalent block size (capacity) |
| Page size (capacity) |
| Estimated write (program) time |
| Erase time |
| Number of blocks included in one virtual block |
| Others |

| Namespace information (physical NAND access management API) |
|---|
| Total number of existing namespaces |
| Number of blocks allocated to NSID#1 (total number of blocks secured for NSID#1) |
| List of block addresses allocated to NSID#1 |
| Total erase count of NSID#1 |
| Number of blocks allocated to NSID#2 (total number of blocks secured for NSID#2) |
| List of block addresses allocated to NSID#2 |
| Total erase count of NSID#2 |
| Others |

| Namespace information (virtual NAND access management API) |
|---|
| Total number of existing namespaces |
| Number of virtual blocks allocated to NSID#1<br>(total number of virtual blocks secured for NSID#1) |
| List of virtual block addresses allocated to NSID#1 |
| Total erase count of NSID#1 |
| Number of virtual blocks allocated to NSID#2<br>(total number of virtual blocks secured for NSID#2) |
| List of virtual block addresses allocated to NSID#2 |
| Total erase count of NSID#2 |
| Others |

F I G. 12

| Virtual block address VB | Ch.A block address | Ch.B block address | Ch.C block address | Ch.D block address | Erase count |
|---|---|---|---|---|---|
| VB0 | Block 0 (VB0-0) | Block 100 (VB0-1) | Block 0 (VB0-2) | Block 100 (VB0-3) | 100 |
| VB1 | Block 1 (VB1-0) | Block 99 (VB1-1) | Block 1 (VB1-2) | Block 99 (VB1-3) | 102 |
| VB2 | Block 2 (VB2-0) | Block 98 (VB2-1) | Block 2 (VB2-2) | Block 98 (VB2-3) | 103 |
| VB3 | Block 3 (VB3-0) | Block 97 (VB3-1) | Block 3 (VB3-2) | Block 97 (VB3-3) | 101 |
| VB4 | Block 4 (VB4-0) | Block 96 (VB4-1) | Block 4 (VB4-2) | Block 96 (VB4-3) | 95 |
| --- | --- | --- | --- | --- | --- |
| VB100 | Block 100 (VB100-0) | Block 0 (VB100-1) | Block 100 (VB100-2) | Block 0 (VB100-3) | 100 |

F I G. 13

| Virtual block address VB | Ch.A block address | Ch.B block address | Ch.C block address | Ch.D block address | Erase count |
|---|---|---|---|---|---|
| VB0 | Block 0 (VB0-0) | Block 100 (VB0-1) | Block 0 (VB0-2) | Block 100 (VB0-3) | 100 |
| VB1 | Block 1 (VB1-0) | Block 99 (VB1-1) | Block 1 (VB1-2) | Block 99 (VB1-3) | 102 |
| VB2 | Block 2 (VB2-0) | Block 98 (VB2-1) | Block2→Block102 (VB2-2) | Block 98 (VB2-3) | 103 |
| VB3 | Block 3 (VB3-0) | Block 97 (VB3-1) | Block 3 (VB3-2) | Block 97 (VB3-3) | 101 |
| VB4 | Block 4 (VB4-0) | Block 96 (VB4-1) | Block 4 (VB4-2) | Block 96 (VB4-3) | 95 |
| --- | --- | --- | --- | --- | --- |
| VB100 | Block 100 (VB100-0) | Block 0 (VB100-1) | Block 100 (VB100-2) | Block 0 (VB100-3) | 100 |

Replace bad block with block (e.g., block 102) of the same channel as bad block

FIG. 14

Bad block command (physical NAND access management API)

| Input parameter | Description |
|---|---|
| Block address | Block address of block to be made bad block |
| Output parameter | Description |
| Exit status | Return success or error to host |

F I G. 15

Bad block command (virtual NAND access management API)

| Input parameter | Description |
|---|---|
| Virtual block address and block number in virtual block | Designate which block in which virtual block should be mad bad block |
| Output parameter | Description |
| Exit status | Return success or error to host |

F I G. 16

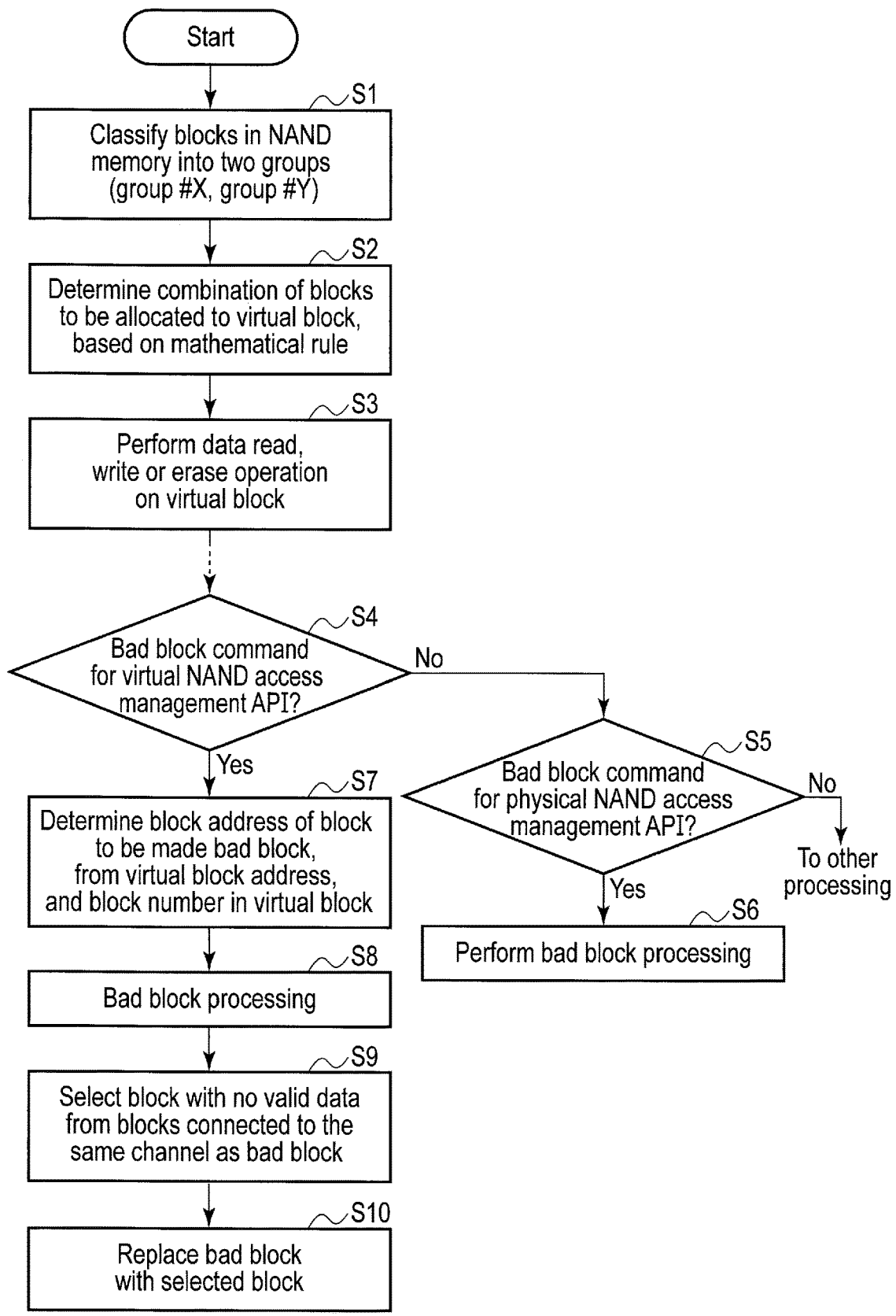
F I G. 17

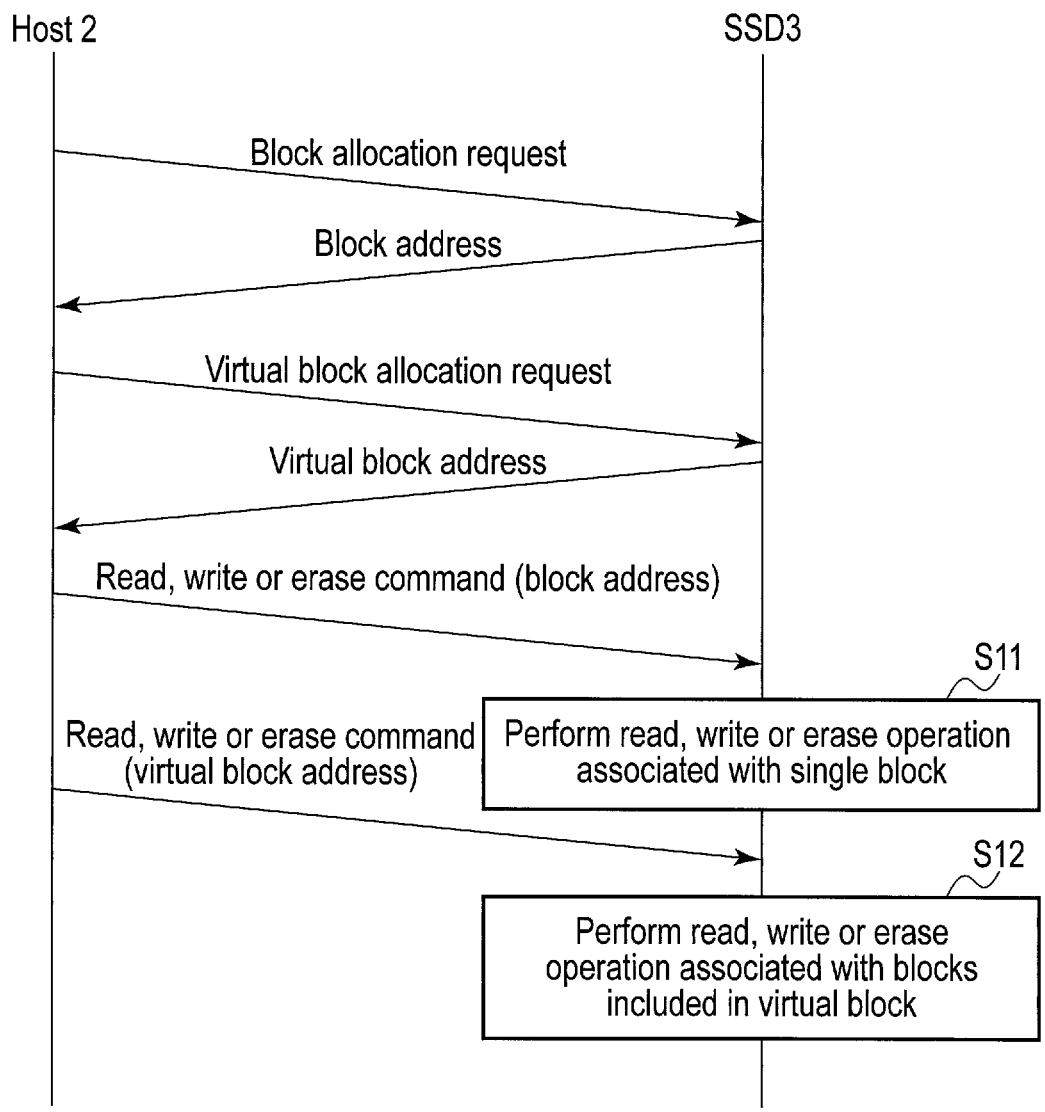
F I G. 18

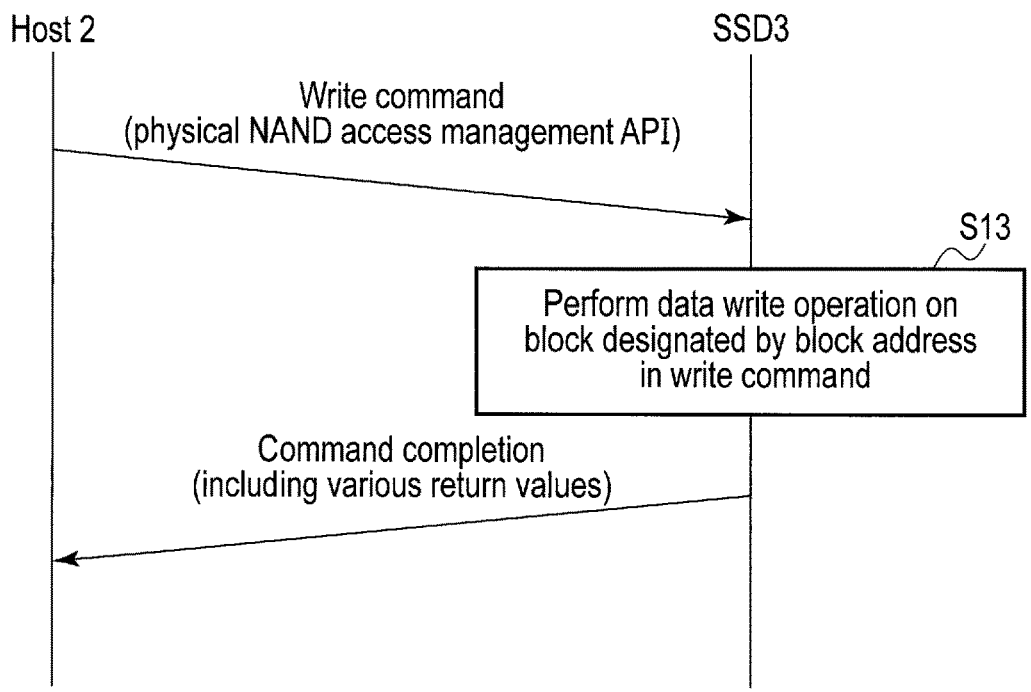
F I G. 19
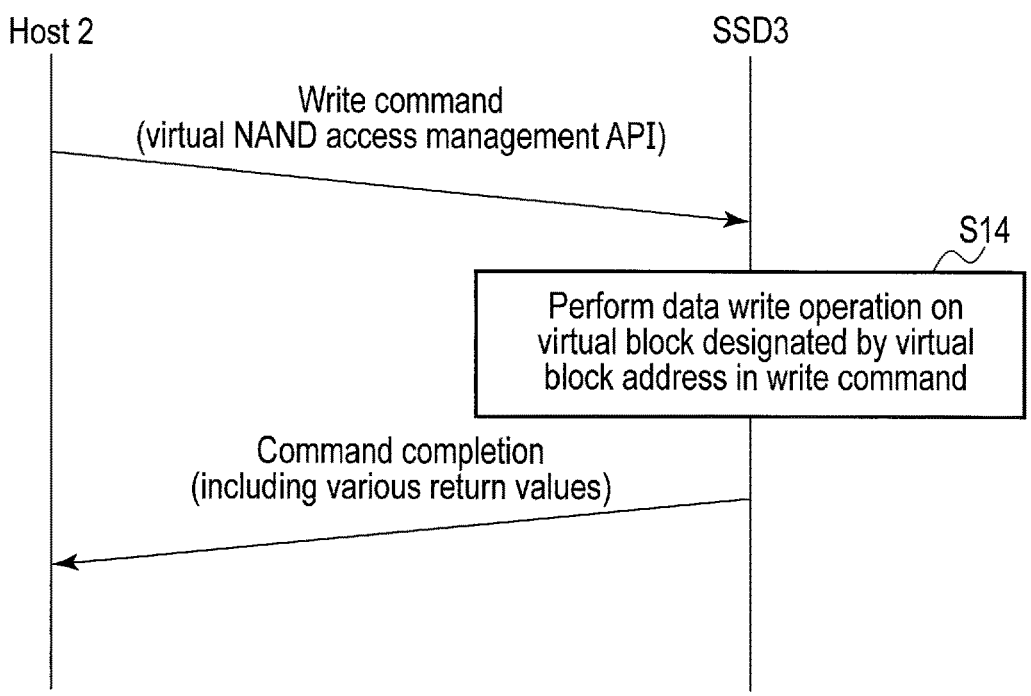
F I G. 20

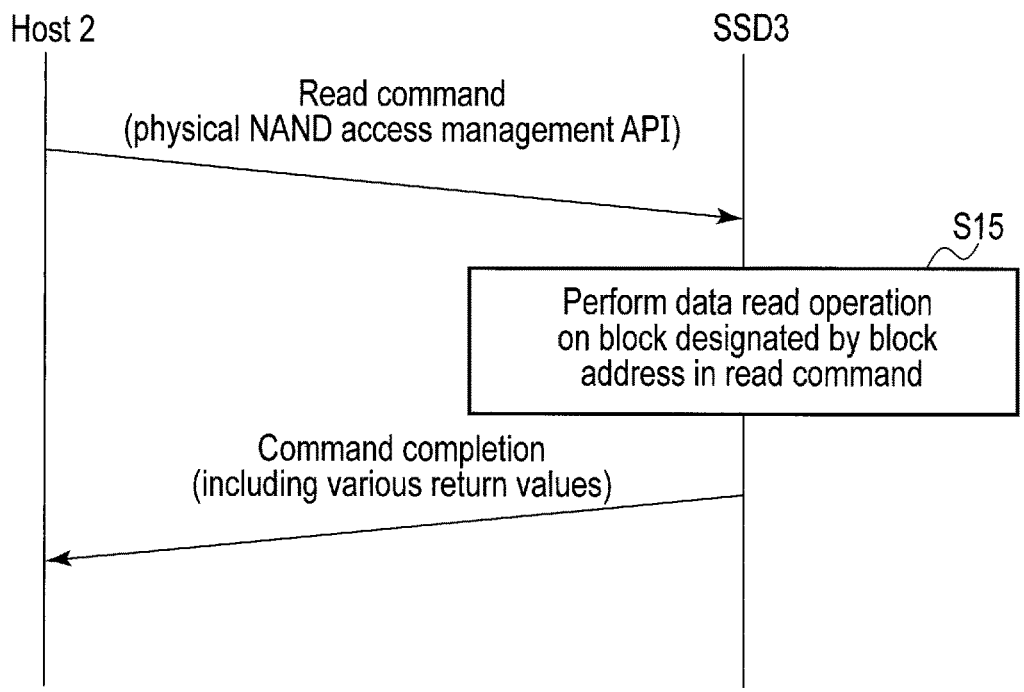
F I G. 21
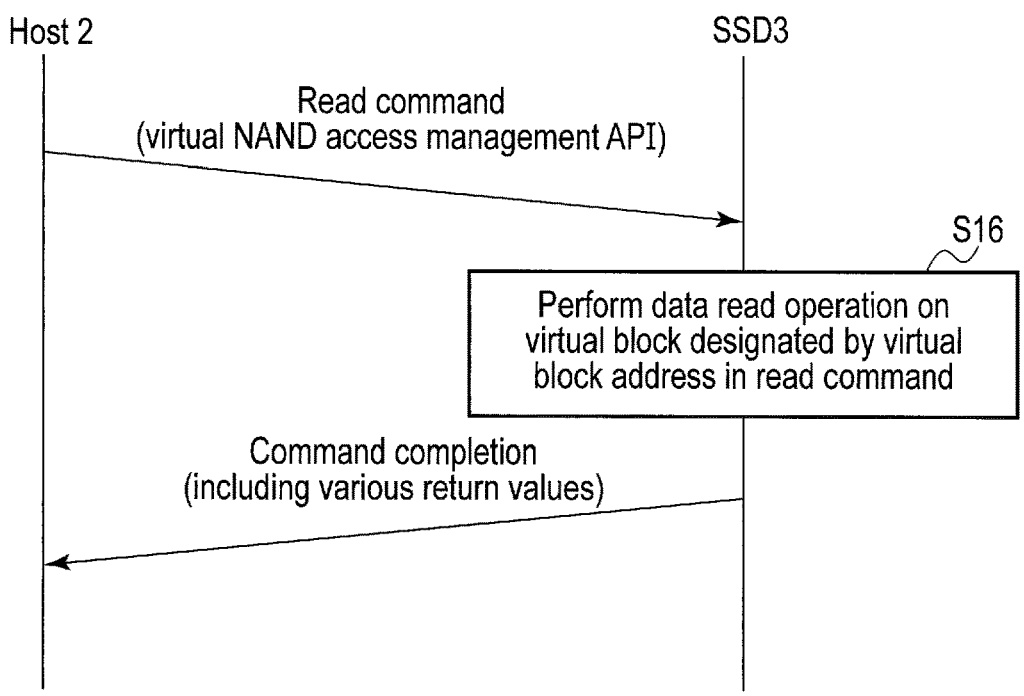
F I G. 22

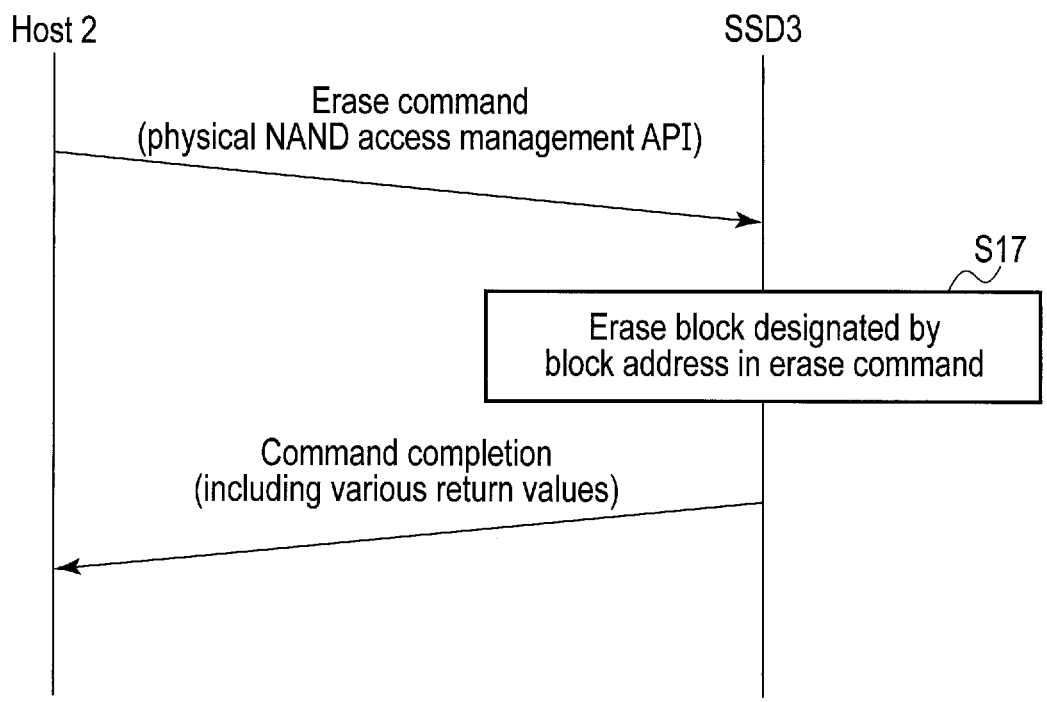
F I G. 23
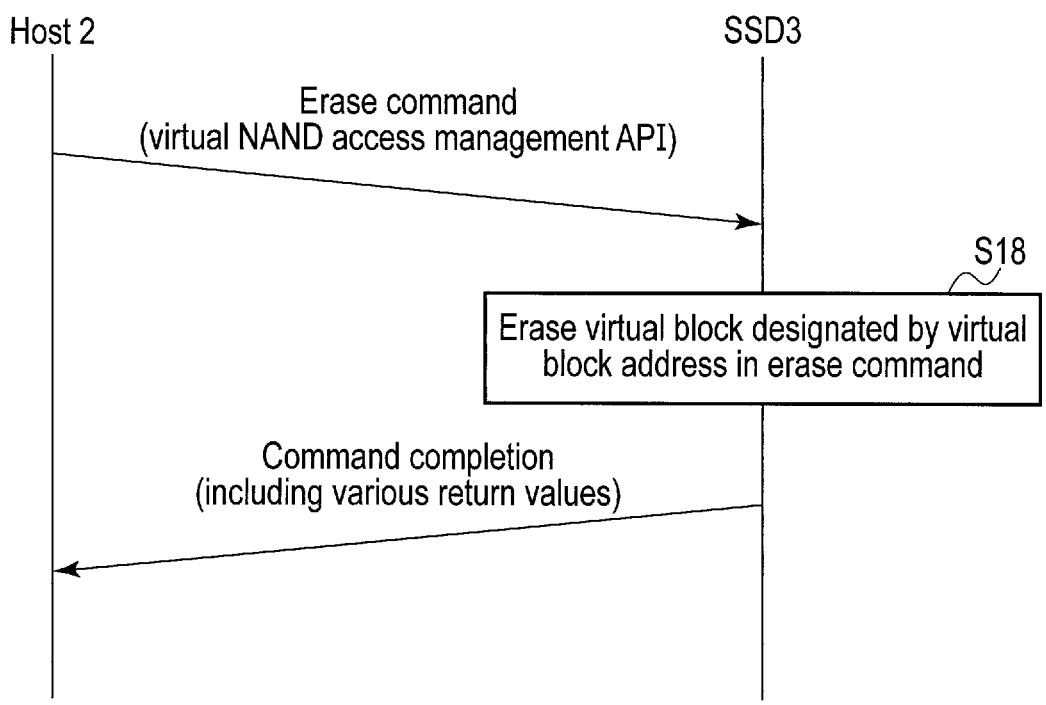
F I G. 24

Block allocate and erase command

| Input parameter | Description |
|---|---|
| Block type (block or virtual block) | Type of block to be allocated<br>Block: one block selected from free blocks is allocated and this block is erased<br>Virtual block: one virtual block (combination of blocks) selected from free virtual blocks is allocated and this virtual block is erased |
| Processing priority | Priority of command |
| NSID (optional) | NSID for which block/ virtual block should be allocated |
| Output parameter | Description |
| Exit status | Success or error is returned to host |
| Block address or virtual block address | Block address of allocated block or virtual block address of allocated virtual block is returned to host |
| Number of remaining blocks | Only when NSID is designated, the number of remaining blocks for the NSID or the number of remaining virtual blocks for the NSID is returned to host |

FIG. 26

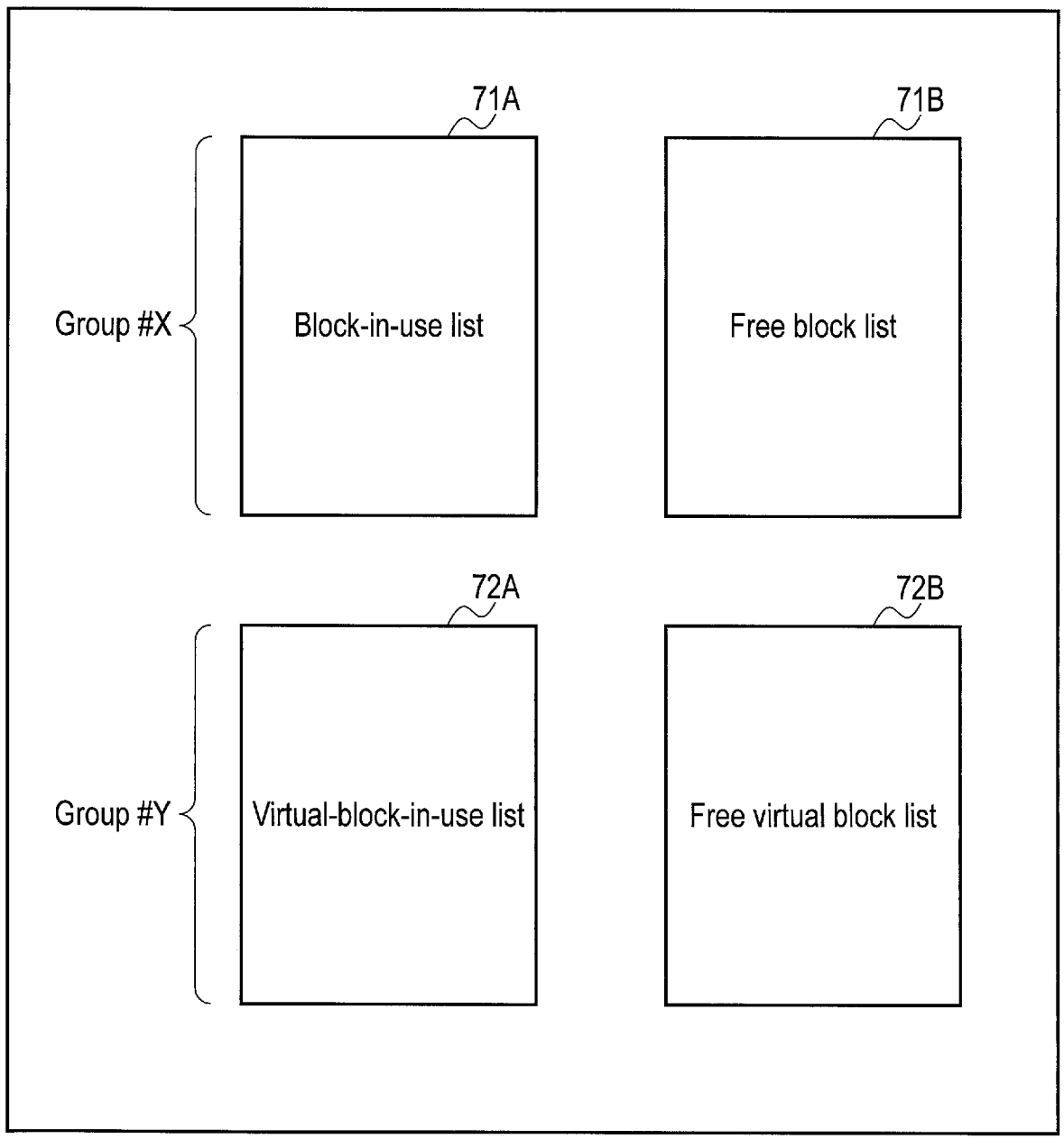
F I G. 27

Write command (physical NAND access management API)

| Input parameter | Description |
| --- | --- |
| Block address, or block address and page address | Physical address designating location in NAND memory to which data is to be written (when only block address is designated, write target page is automatically updated by SSD) |
| NSID (optional) | If block is not designated, NSID is designated. When NSID is designated, block address and page address are automatically issued by SSD. Data is written to block allocated for NSID. |
| Processing priority | Priority of write command |
| Starting address of write data | Starting address on output buffer (memory of host) that stores write data |
| Number of pages to which data is to be written | Number of pages to which data is to be written |
| NAND mode (optional) | NAND mode (SLC/MLC/TLC, etc.) |
| Output parameter | Description |
| Exit status | Success or error is returned to host |
| Block address and page address | Location in NAND memory to which data has been written |
| Number of data-written pages | Number of pages to which data has been written |
| Wrong write order warning | If wrong write order has been detected, warning or error is returned to host. |
| Readable latest page address | Page address of latest readable page that holds readable data |

FIG. 29

Write command (virtual NAND access management API)

| Input parameter | Description |
|---|---|
| Virtual block address, or virtual block address and page address | Physical address designating location in NAND memory to which data is to be written (when only virtual block address is designated, page address is automatically updated by SSD) |
| NSID (optional) | If virtual block is not designated, NSID is designated. When NSID is designated, virtual block address and page address are automatically issued by SSD. Data is written to virtual block allocated for the NSID. |
| Processing priority | Priority of write command |
| Starting address of write data | Starting address on output buffer (memory of host) that stores write data |
| Number of pages to which data is to be written | Number of pages to which data is to be written |
| NAND mode (optional) | NAND mode (SLC/MLC/TLC, etc.) |
| Output parameter | Description |
| Exit status | Success or error is returned to host |
| Virtual block address and page address | Location in NAND memory to which data has been written |
| Number of data-written pages | Number of pages to which data has been written |
| Wrong write order warning | If wrong write order has been detected, warning or error is returned to host. |
| Readable latest page address | Page address of latest readable page that holds readable data |

FIG. 30

Page P0 becomes readable after data is written to some subsequent pages

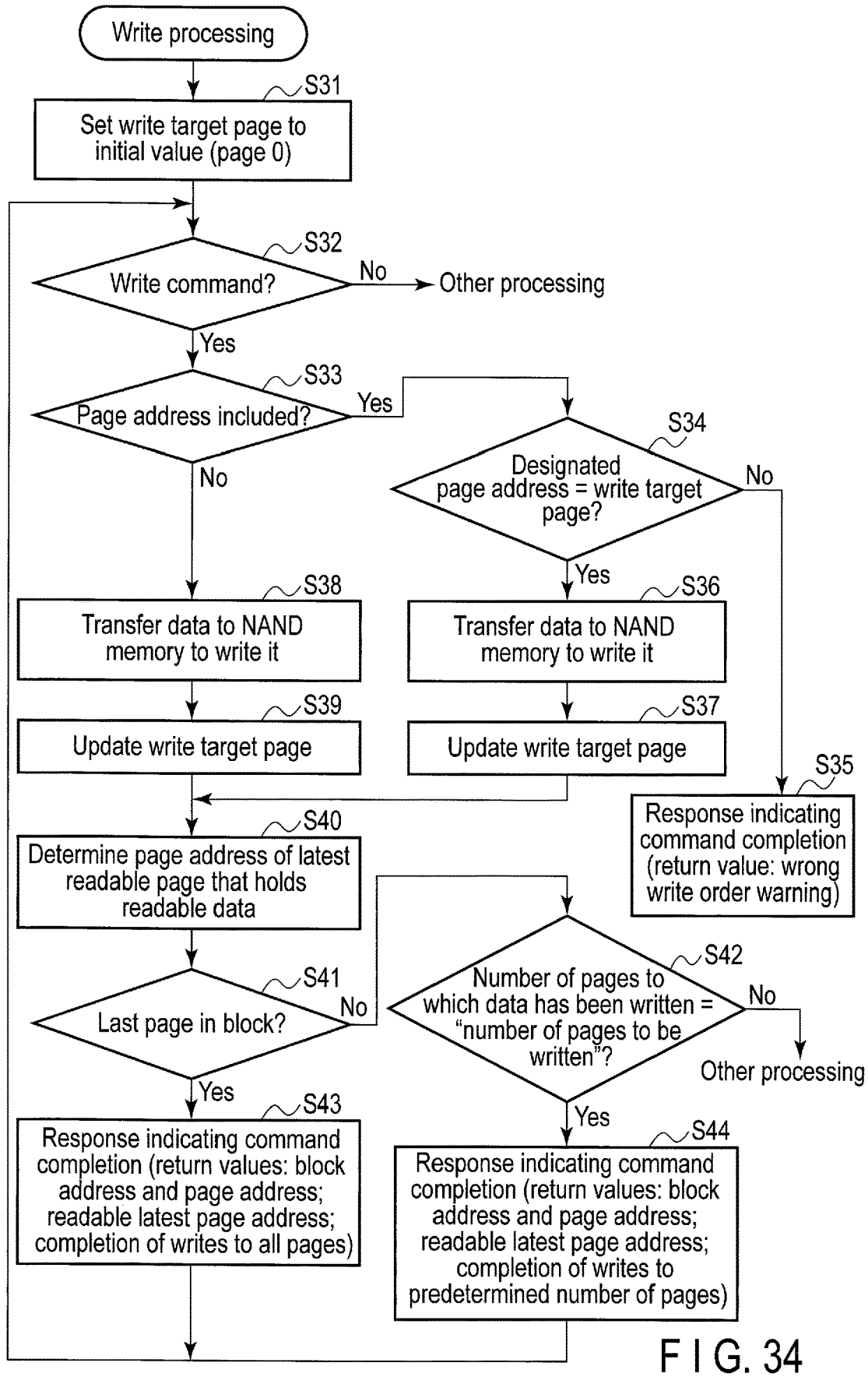
F I G. 34

Read command (physical NAND access management API)

| Input parameter | Description |
| --- | --- |
| Block address and page address | Physical address designating location in NAND memory from which data should be read |
| Processing priority | Priority of read command |
| Read data destination address | Location in input buffer (memory of host) to which read data should be transferred |
| Number of read pages | Number of pages that should be read |
| Acceptable latency | Smallest latency/normal latency/longer latency |
| Output parameter | Description |
| Exit status | Success or error is returned to host |
| Block address and page address | Location in NAND memory from which data has been read (block address and page address) |
| Number of pages | Number of pages from which data has been read |
| Starting address | Starting address of read data |

FIG. 37

Read command (virtual NAND access management API)

| Input parameter | Description |
|---|---|
| Virtual block address and page address | Physical address designating location in NAND memory from which data should be read |
| Processing priority | Priority of read command |
| Read data destination address | Location in input buffer (memory of host) to which read data should be transferred |
| Number of read pages | Number of pages that should be read |
| Acceptable latency | Smallest latency/normal latency/ longer latency |
| Output parameter | Description |
| Exit status | Success or error is returned to host |
| Virtual block address and page address | Location in NAND memory from which data has been read (virtual block address and page address) |
| Number of pages | Number of pages that have been read |
| Starting address | Starting address of read data |

F I G. 38

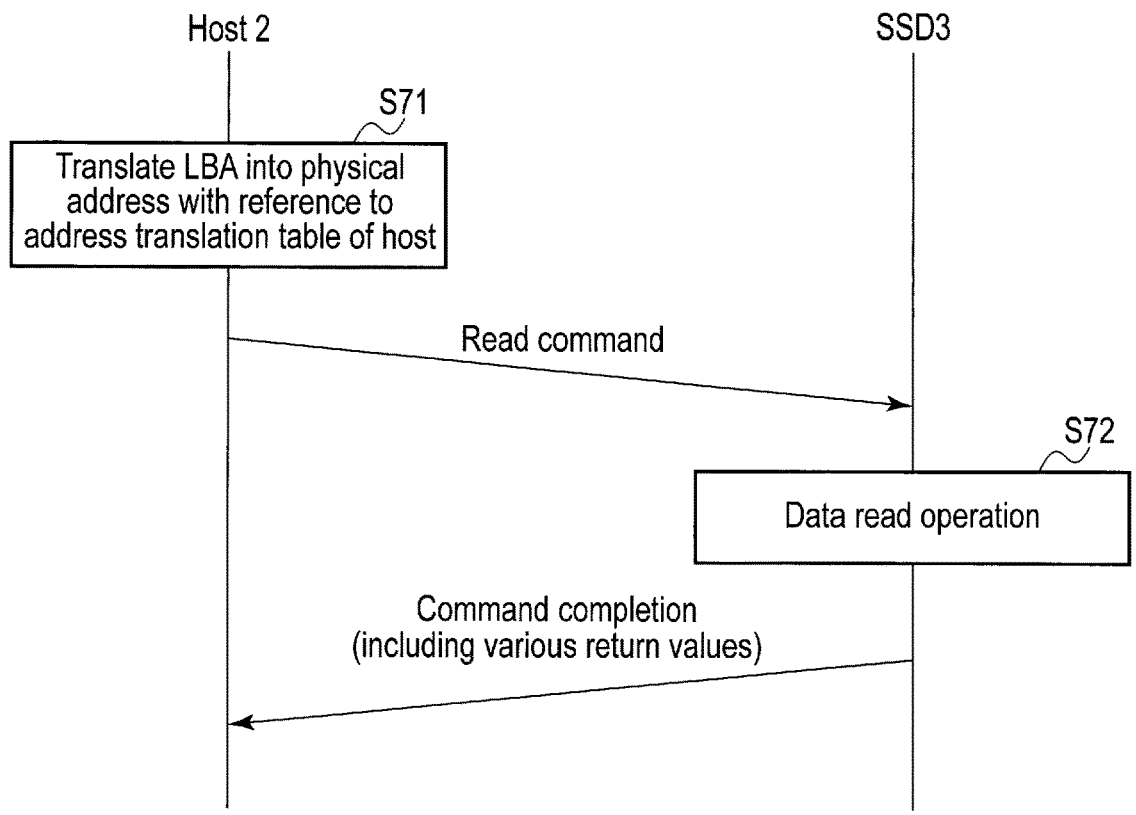
F I G. 39
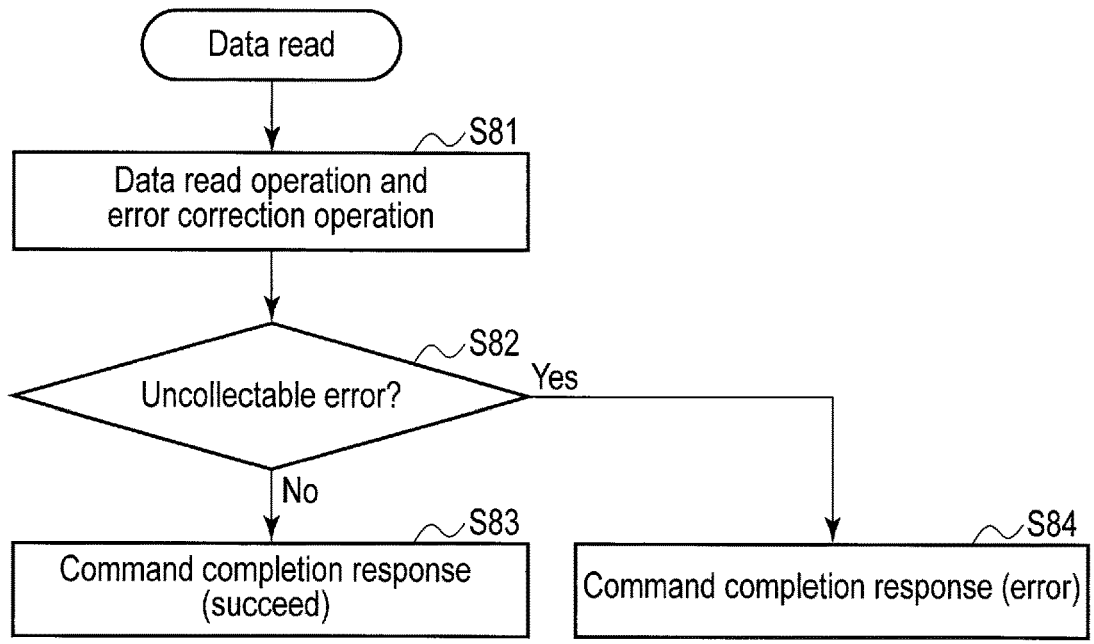
F I G. 40

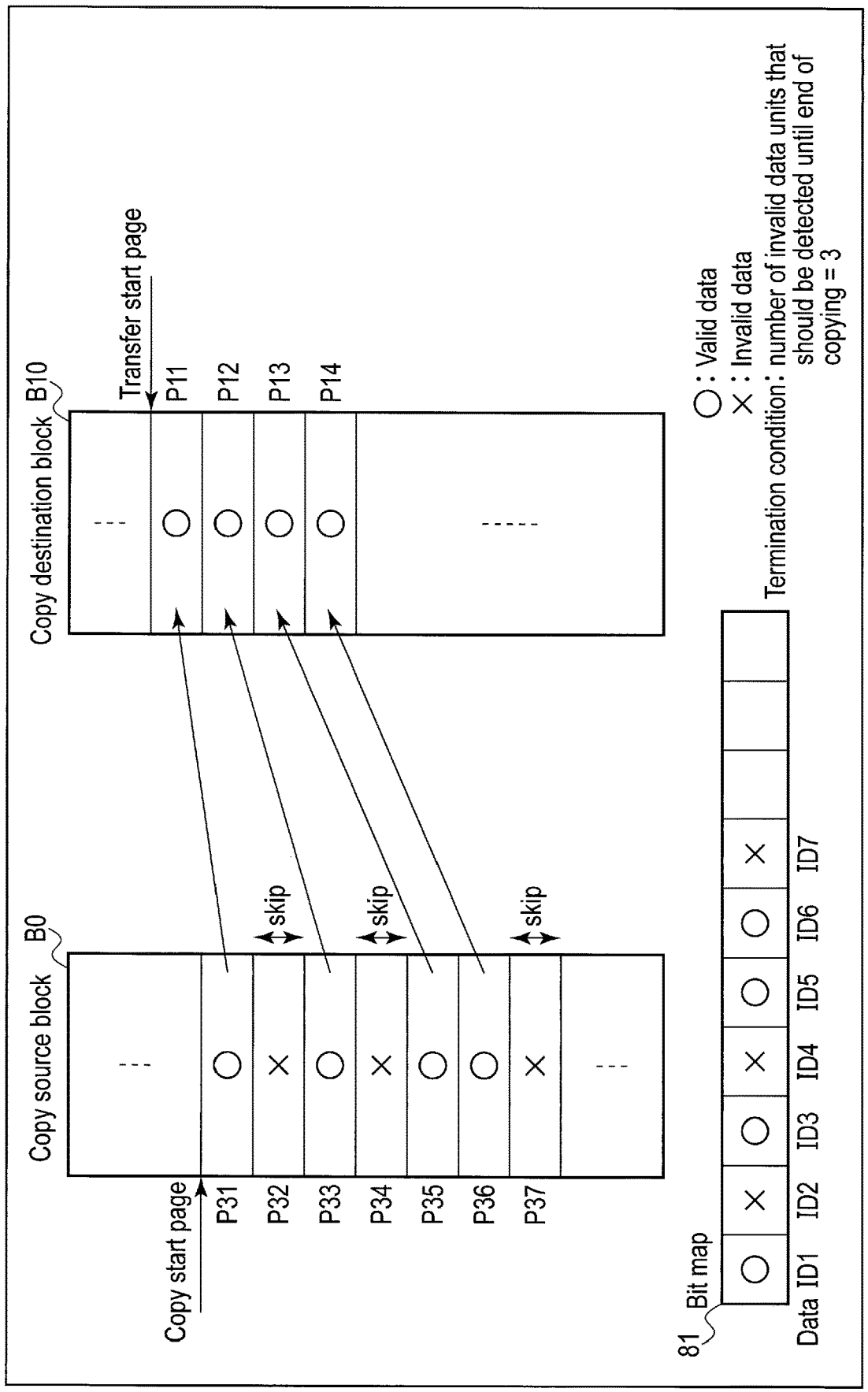
F I G. 42

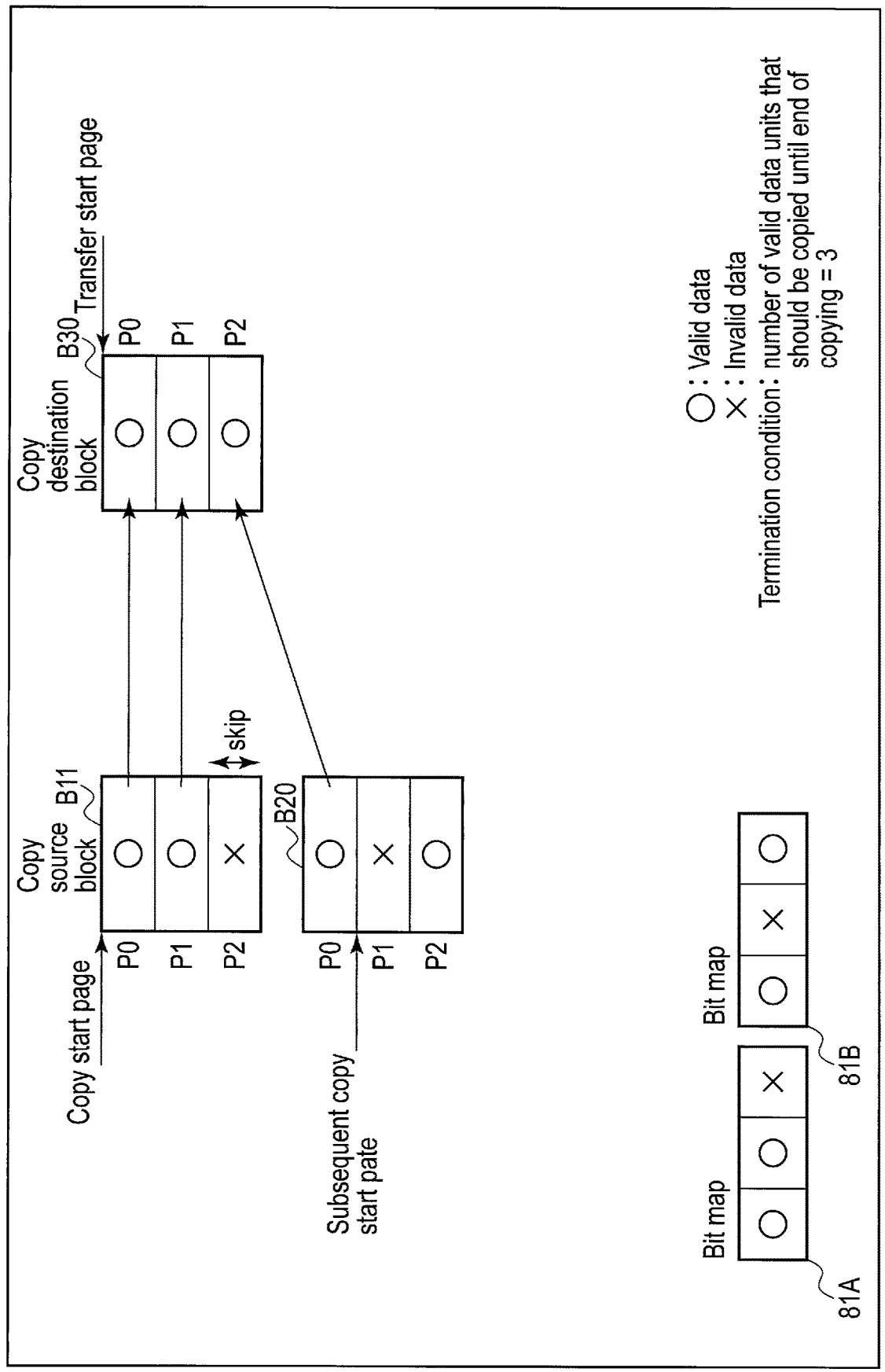
F I G. 43

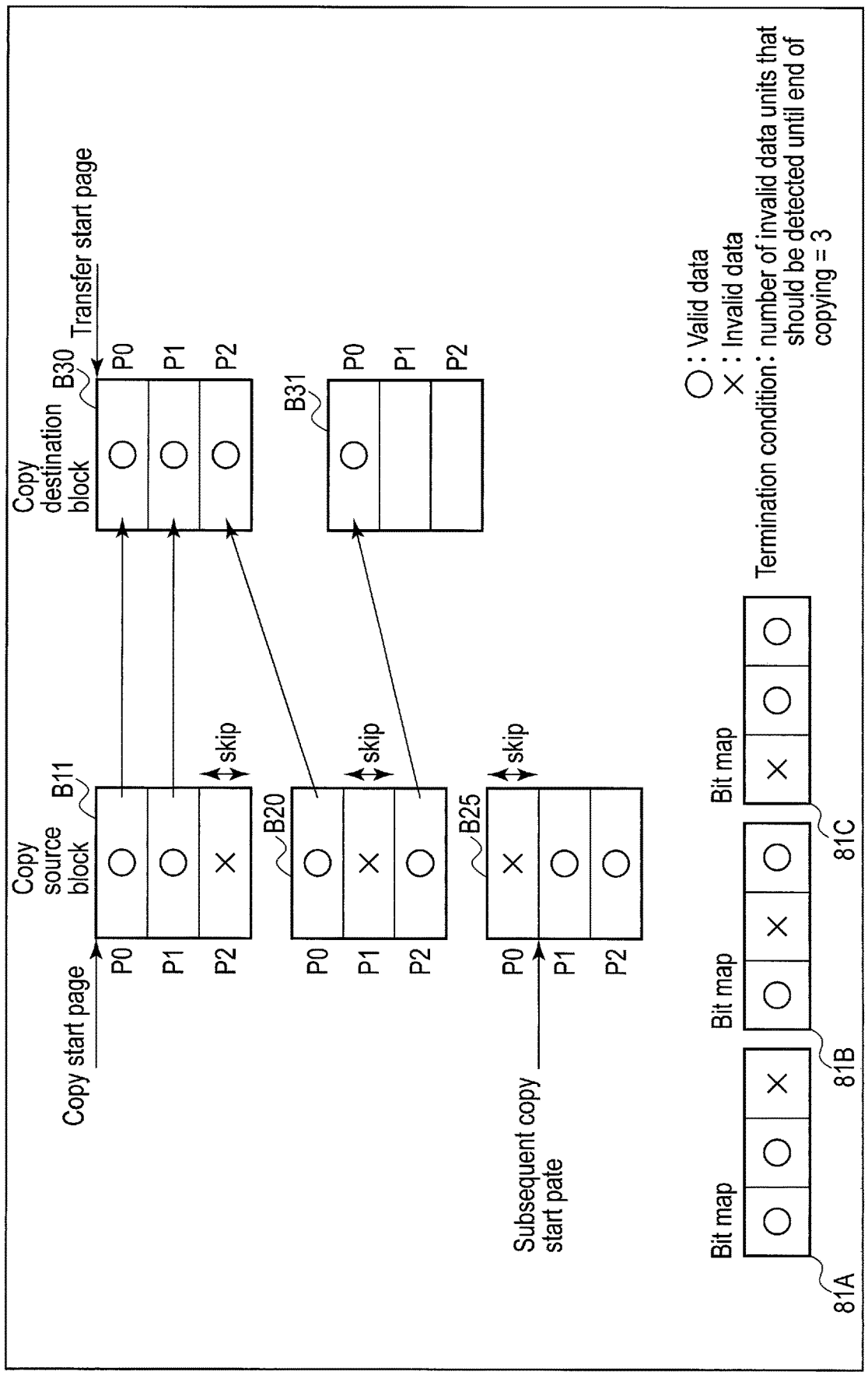
F I G. 44

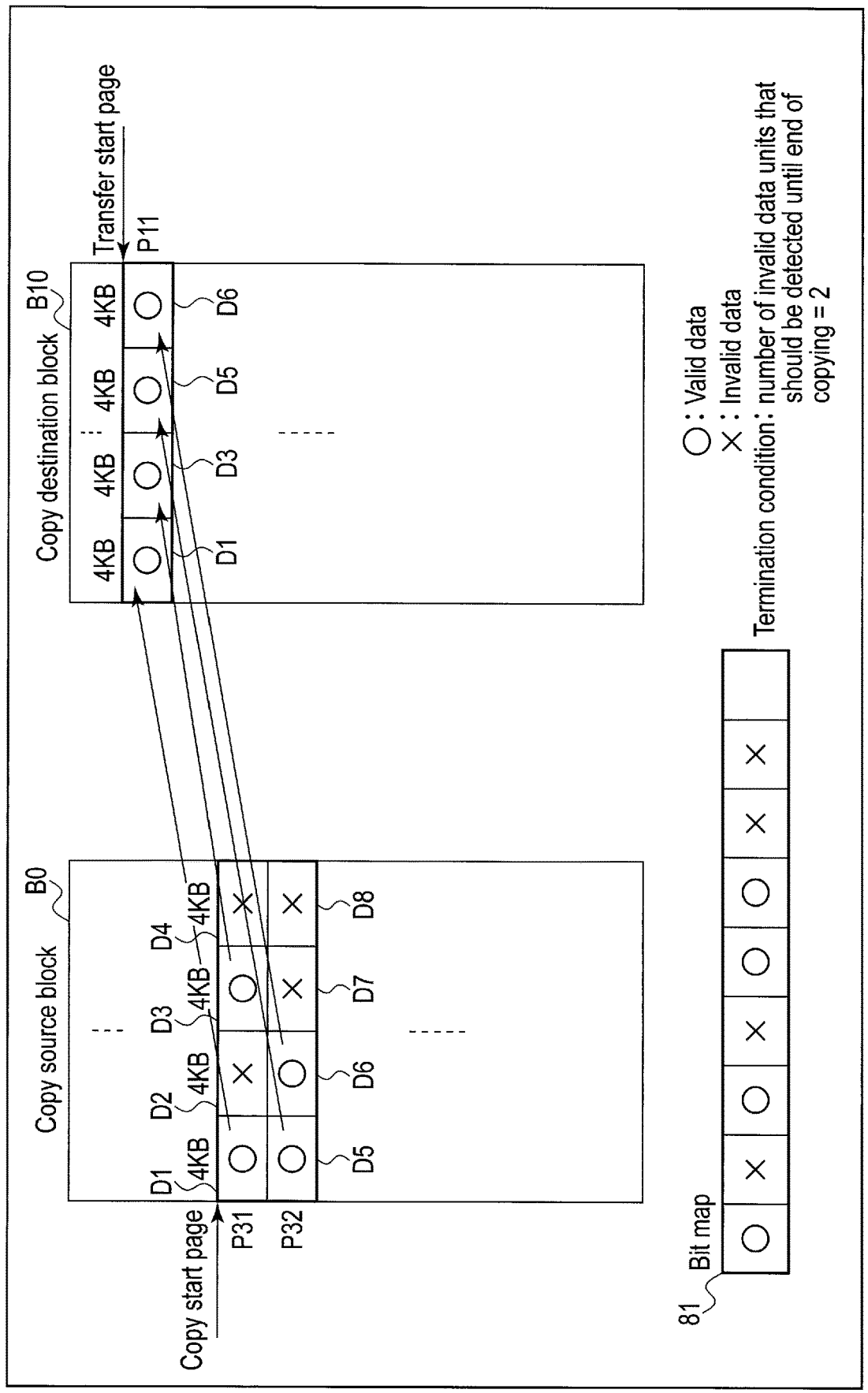
F I G. 46

Data copy command

| Input parameter | Description |
| --- | --- |
| Copy source block address (copy source block address list) | Block address of copy source block (Block address of copy source block also can be designated by virtual block address, and block number in virtual block. Copy source block address list includes block addresses of respective copy source blocks.) |
| Copy start location in copy source block | Start location in copy source block from which data should be copied (for example, copy start location in first copy source block) |
| Copy destination block address | Block address of copy destination block (block address of copy destination block also can be designated by virtual block address, and block number in virtual block) |
| Start location in copy destination block | Start location in copy destination block to which data should be transferred |
| Valid/invalid bit map | Information indicating arrangement of valid data and invalid data |
| Number of valid data units that should be copied until end of copying | Termination condition |
| Number of invalid data units that should be detected until end of copying | Termination condition |
| Size of data | |

F I G. 47

Data copy command

| Output parameter | Description |
|---|---|
| Number of invalid data units that have been detected until end of copying | |
| Total number of data units that have been copied to copy destination block | |
| Combination of identifier of data copied to copy destination block and copy destination location in copy destination block | Information indicating which data has been copied where |
| Data location from which copying should be subsequently started | Copy start location in copy source block in subsequent copying |
| Readable latest page address | Page address of latest readable page of copy destination block, which holds readable data |

F I G. 48

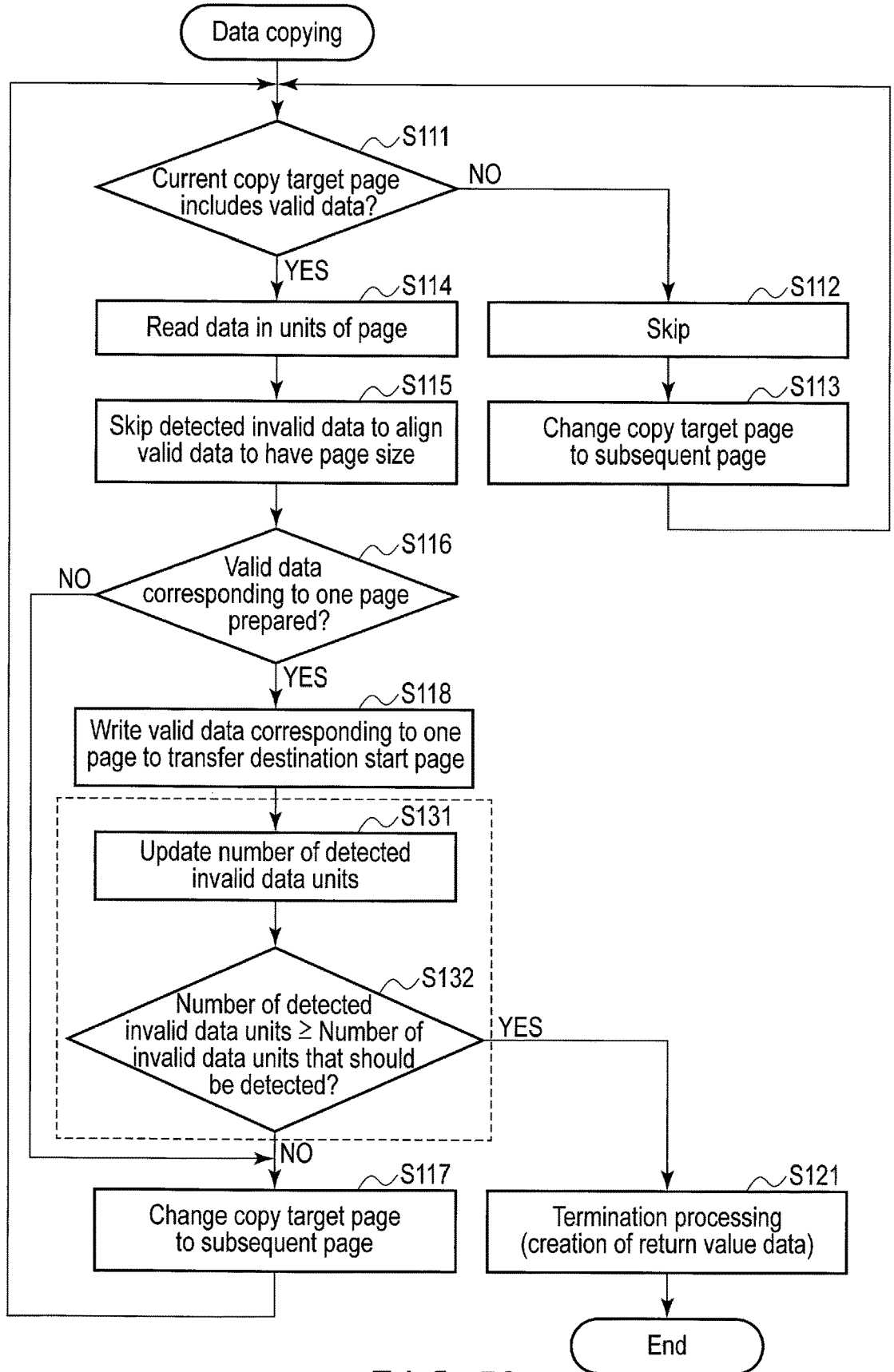
F I G. 52

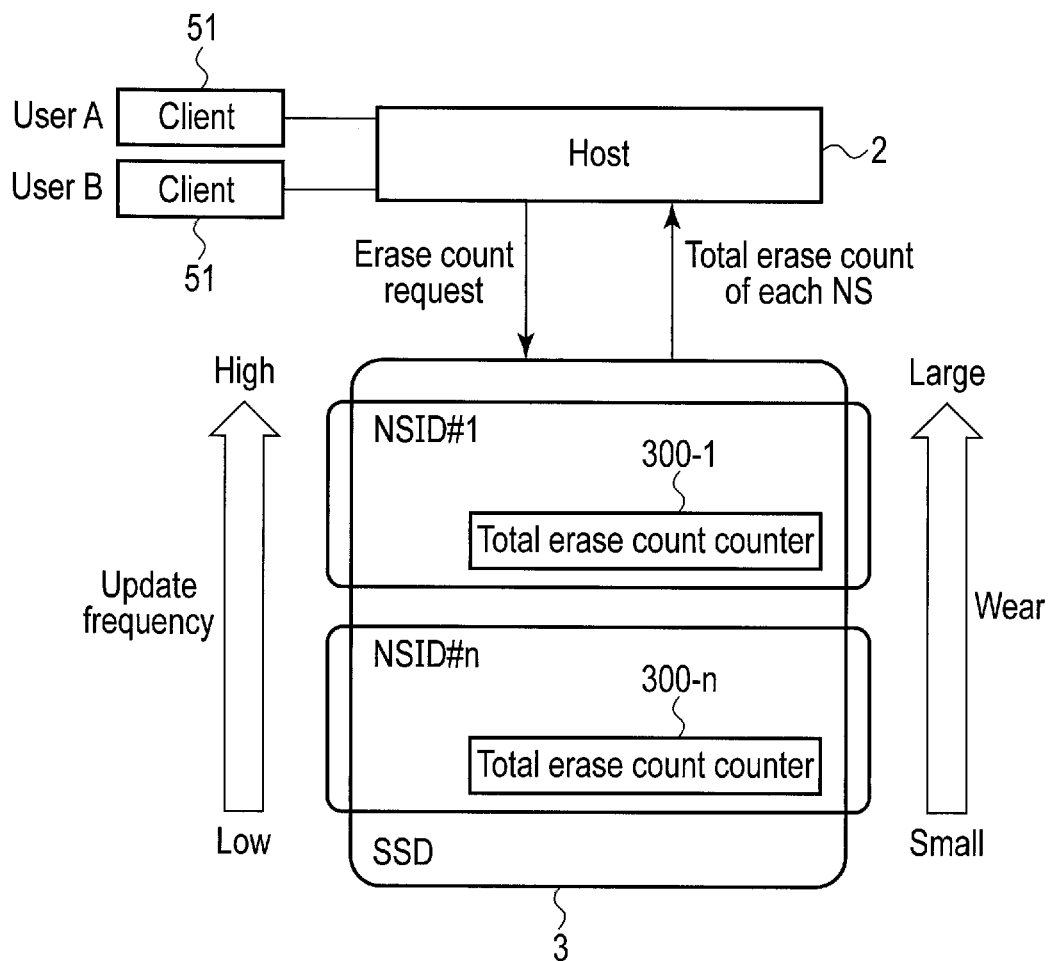
F I G. 53

Namespace allocate command

| Input parameter | Description |
|---|---|
| NSID | ID of namespace |
| Physical resource amount | Number of blocks that should be secured |
| Output parameter | Description |
| Physical resource amount | Number of secured blocks |

Block allocate and erase command (for namespace)

| Input parameter | Description |
|---|---|
| Processing priority | Priority of command |
| NSID | NSID for which block should be allocated |
| Output parameter | Description |
| Exit status | Success or error is returned to host |
| Block address | Allocated block address is returned to host |
| Number of remaining blocks | Number of remaining blocks for NSID is returned to host |

F I G. 57

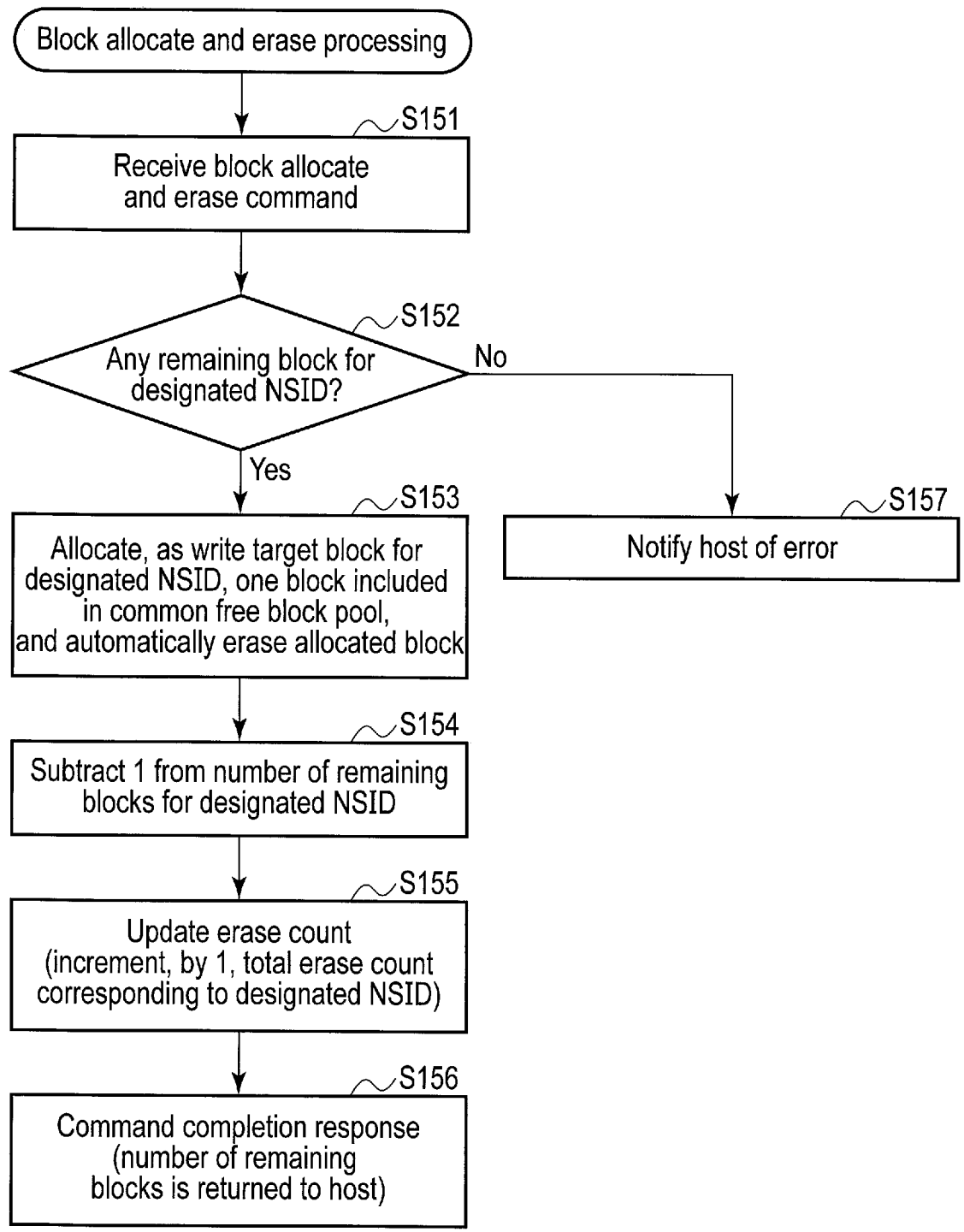
F I G. 58

Erase command (for namespace)

| Input parameter | Description |
|---|---|
| Block address | Block address of block that should be erased |
| Processing priority | Priority of command |
| NSID | NSID corresponding to block should be erased |
| Output parameter | Description |
| Exit status | Success or error is returned to host |
| Block address | Block address of block that has been erased |
| Total erase count | Total erase count of blocks allocated for this NSID |

FIG. 59

Block return command (for namespace)

| Input parameter | Description |
|---|---|
| Block address | Block address of block that should be returned |
| Processing priority | Priority of command |
| NSID | NSID corresponding to block that should be returned |
| Output parameter | Description |
| Exit status | Success or error is returned to host |
| Number of remaining blocks | Number of remaining blocks allocated for NSID |

F I G. 61

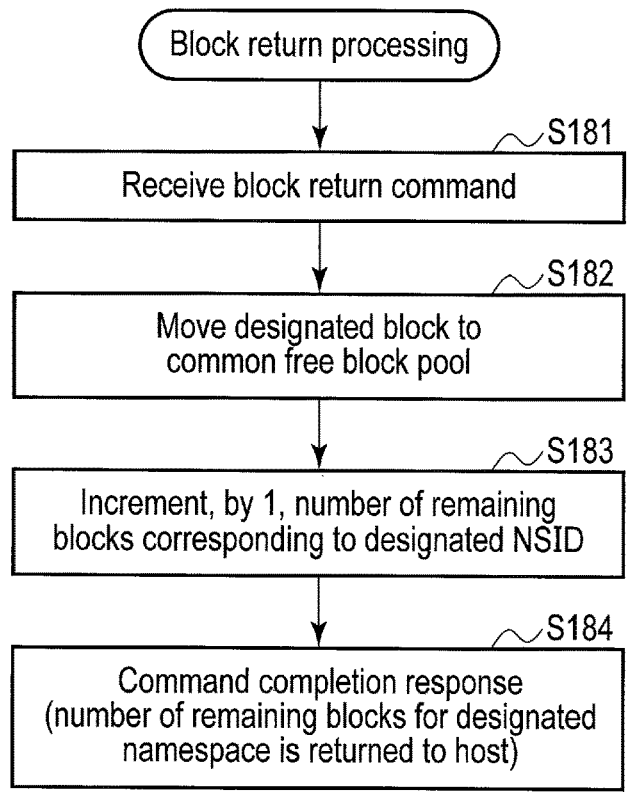

F I G. 62

Get erase count command (for namespace)
| Input parameter | Description |
|---|---|
| NSID | Target NSID |
| Processing priority | Priority of command |
| Output parameter | Description |
| Exit status | Success or error is returned to host |
| Total erase count | Total erase count of designated NSID |
F I G. 63
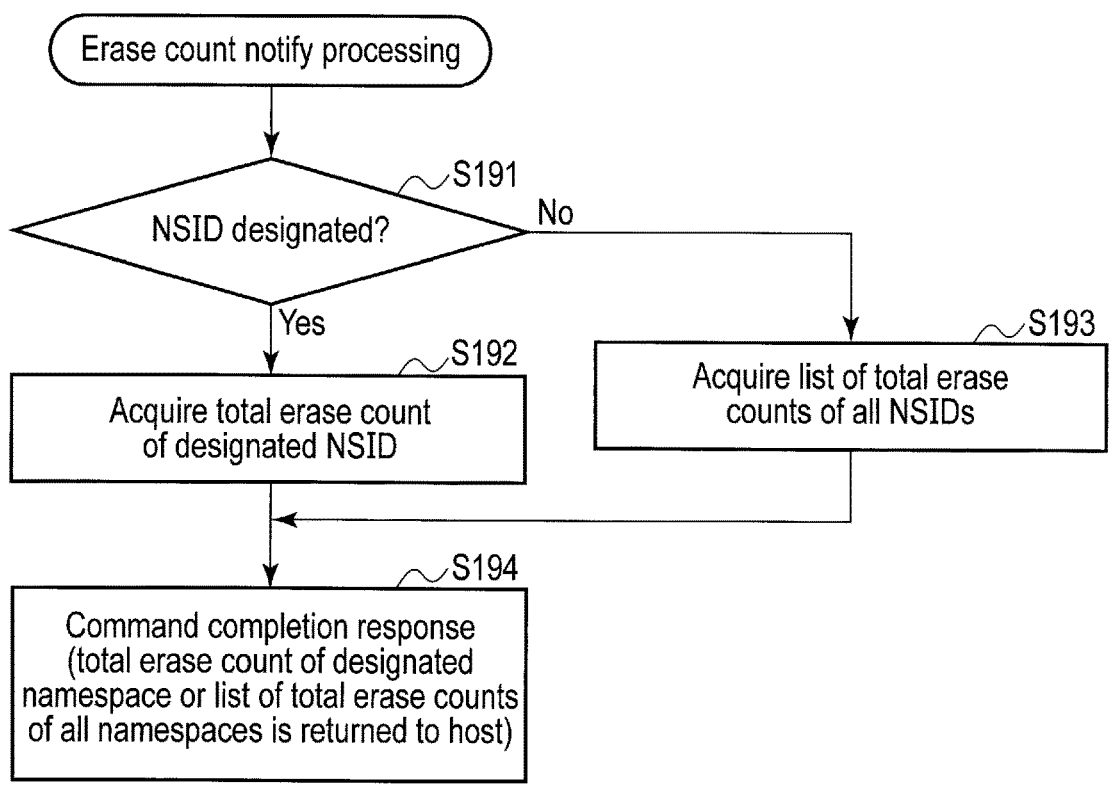
F I G. 64

STORAGE SYSTEM, INFORMATION PROCESSING SYSTEM AND METHOD FOR CONTROLLING NONVOLATILE MEMORY

CROSS-REFERENCE TO RELATED APPLICATIONS

This application is a continuation of and claims benefit under 35 U.S.C. § 120 to U.S. application Ser. No. 17/536,502, filed Nov. 29, 2021, which is a continuation of and claims benefit under 35 U.S.C. § 120 to U.S. application Ser. No. 16/850,508, filed Apr. 16, 2020 (now U.S. Pat. No. 11,237,764), which is a continuation of and claims benefit under 35 U.S.C. § 120 to U.S. application Ser. No. 16/121,161, filed Sep. 4, 2018 (now U.S. Pat. No. 10,664,197), which is a continuation of and claims benefit under 35 U.S.C. § 120 to U.S. application Ser. No. 15/250,215, filed Aug. 29, 2016 (now U.S. Pat. No. 10,095,443), which is based upon and claims the benefit of priority under 35 U.S.C. § 119 from Japanese Patent Application No. 2016-044261, filed on Mar. 8, 2016, the entire contents of each of which are incorporated herein by reference.

FIELD

Embodiments described herein relate generally to a technique for controlling a nonvolatile memory.

BACKGROUND

Recently, storage systems comprising nonvolatile memories have become widespread. As one of these storage systems, a NAND-flash technology based solid-state drive (SSD) is known. Because of their low-energy-consumption and high-performance, SSDs are used as the main storage of various computers.

Hosts have recently started various attempts to control a nonvolatile memory.

However, to enable the hosts to control the nonvolatile memory, it is necessary to realize a new function of obtaining useful information associated with the control of the nonvolatile memory.

BRIEF DESCRIPTION OF THE DRAWINGS

FIG. 5 illustrates a structure of a virtual block managed by the storage system of the embodiment.

FIG. 10 illustrates a virtual block structure information table held in the storage system of the embodiment.

FIG. 11 illustrates a namespace information table for the physical NAND access management API, which is held in the storage system of the embodiment.

FIG. 12 illustrates a namespace information table for the virtual NAND access management API, which is held in the storage system of the embodiment.

FIG. 13 illustrates the relationship between virtual blocks in the storage system of the embodiment and the block addresses of blocks constructing each virtual block.

FIG. 14 illustrates a bad-block replacement operation executed by the storage system of the embodiment.

FIG. 15 illustrates a bad-block command for the physical NAND access management API, used in the storage system of the embodiment.

FIG. 16 illustrates a bad-block command for the virtual NAND access management API, used in the storage system of the embodiment.

FIG. 17 is a flowchart illustrating a procedure of bad-block processing executed by the storage system of the embodiment.

FIG. 18 illustrates a processing sequence for physical NAND access and virtual NAND access, which is executed by the storage system of the embodiment and a host.

FIG. 19 illustrates a write processing sequence for physical NAND access, which is executed by the storage system of the embodiment and the host.

FIG. 20 illustrates a write processing sequence for virtual NAND access, which is executed by the storage system of the embodiment and the host.

FIG. 21 illustrates a read processing sequence for physical NAND access, which is executed by the storage system of the embodiment and the host.

FIG. 22 illustrates a read processing sequence for virtual NAND access, which is executed by the storage system of the embodiment and the host.

FIG. 23 illustrates an erase processing sequence for physical NAND access, which is executed by the storage system of the embodiment and the host.

FIG. 24 illustrates an erase processing sequence for virtual NAND access, which is executed by the storage system of the embodiment and the host.

FIG. 26 illustrates a block allocate and erase command used in the storage system of the embodiment.

FIG. 27 illustrates a block-in-use list, a free block list, a virtual-block-in-use list and a free-virtual-block list.

FIG. 29 illustrates a write command for the physical NAND access management API, used in the storage system of the embodiment.

FIG. 30 illustrates a write command for the virtual NAND access management API, used in the storage system of the embodiment.

FIG. 34 is a flowchart illustrating a procedure of data-write processing executed by the storage system of the embodiment.

FIG. 37 illustrates a read command for the physical NAND access management API, used in the storage system of the embodiment.

FIG. 38 illustrates a read command for the virtual NAND access management API, used in the storage system of the embodiment.

FIG. 39 illustrates a data read processing sequence executed by the storage system of the embodiment and the host.

FIG. 40 is a flowchart illustrating a procedure of data read processing executed by storage system of the embodiment.

FIG. 42 illustrates an example of a data copy operation executed by the storage system of the embodiment when the number of invalid data units to be detected is designated as termination condition.

FIG. 43 illustrates an example of a data copy operation executed by the storage system of the embodiment when a plurality of copy source blocks are designated and the number of valid data units to be copied is designated as termination condition.

FIG. 44 illustrates an example of a data copy operation executed by the storage system of the embodiment when a plurality of copy source blocks are designated and the number of invalid data units to be detected is designated as termination condition.

FIG. 46 illustrates an example of a data copy operation executed by the storage system of the embodiment when the data size is smaller than the page size and the number of invalid data units to be detected is designated as termination condition.

FIG. 47 illustrates input parameters of a data copy command used in the storage system of the embodiment.

FIG. 48 illustrates output parameters (return values) of the data copy command used in the storage system of the embodiment.

FIG. 52 is a flowchart illustrating a procedure of the data copy operation executed by the storage system of the embodiment when the data size is smaller than the page size and the number of invalid data units to be detected is designated as the termination condition.

FIG. 53 illustrates a namespace management function of the storage system of the embodiment.

FIG. 57 illustrates a block allocate and erase command including a namespace identifier (NSID) and used in the storage system of the embodiment.

FIG. 58 is a flowchart illustrating a procedure of block allocate and erase processing executed by the storage system of the embodiment upon receiving the block allocate and erase command including a namespace identifier (NSID).

FIG. 59 illustrates a erase command for namespace, used in the storage system of the embodiment.

FIG. 61 illustrates a block return command including a namespace identifier (NSID) and used in the storage system of the embodiment.

FIG. 62 is a flowchart illustrating a procedure of block return processing executed by the storage system of the embodiment upon receiving the block return command including a namespace identifier (NSID).

FIG. 63 illustrates a get erase count command including a namespace identifier (NSID) and used in the storage system of the embodiment.

FIG. 64 is a flowchart illustrating a procedure of erase count notify processing executed by the storage system of the embodiment.

DETAILED DESCRIPTION

Various embodiments will be described hereinafter with reference to the accompanying drawings.

In general, according to one embodiment, a storage system comprises a nonvolatile memory including a plurality of blocks, and a controller electrically connected to the nonvolatile memory.

The controller performs a first allocation operation of allocating, for a first namespace, a plurality of first blocks included in the plurality of blocks.

The controller performs a read operation, a write operation or an erase operation on one of the first blocks in response to a command, received from a host, to read, write or erase the one first block.

The controller counts the total number of erase operations performed on the first blocks.

The controller notifies the host of the counted number of erase operations in response to a command received from the host to obtain an erase count associated with the first namespace.

System Configuration

Figure 1:
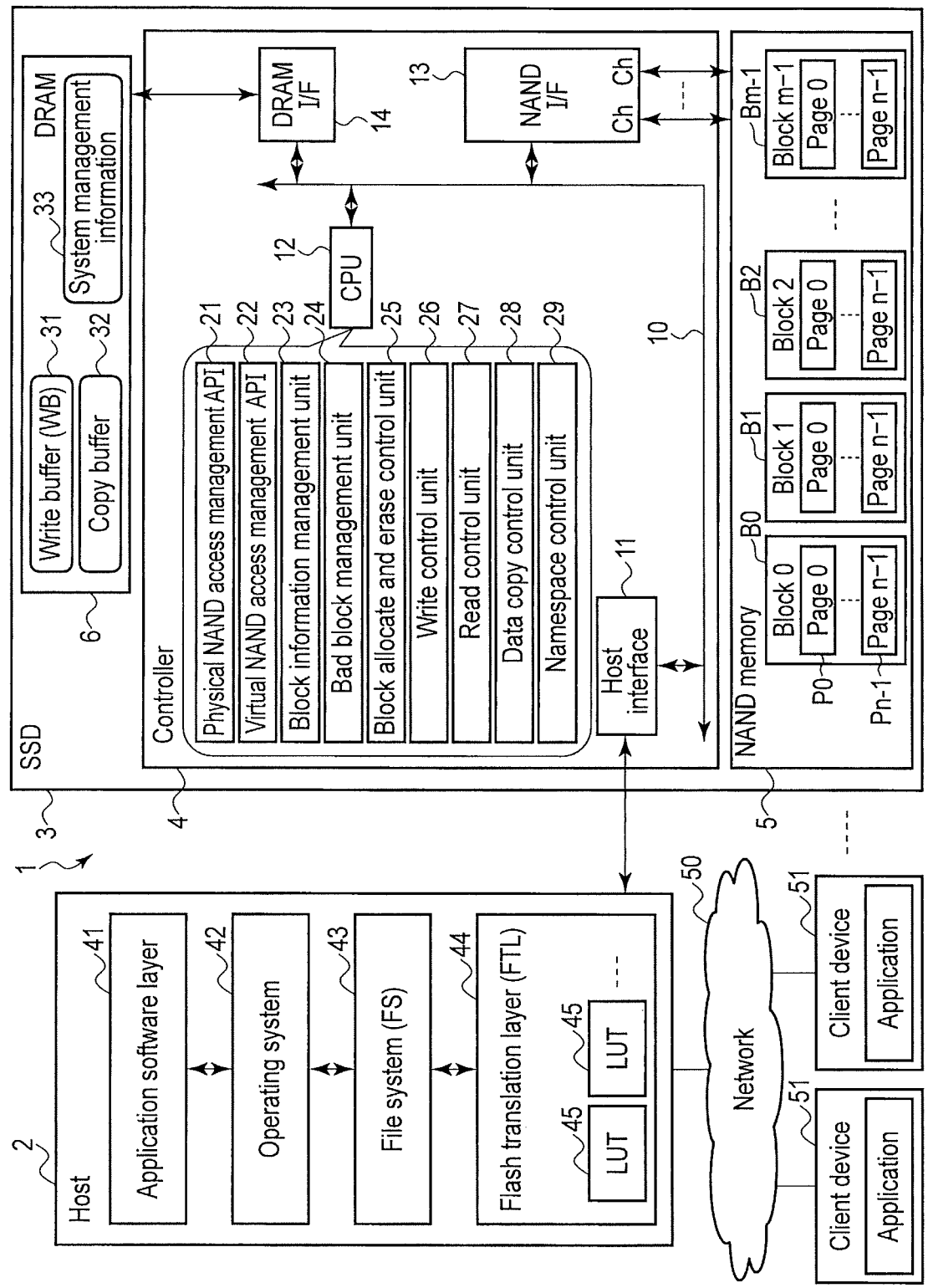
FIG. 1 is a block diagram illustrating a configuration example of an information processing system including a storage system according to an embodiment.

Referring first to FIG. 1, a description will be given of the configuration of an information processing system 1 including a storage system according to an embodiment.

In the information processing system 1, the storage system may function as the main storage (external storage device) of the information processing system 1. The storage system is configured to write data to and read data from a nonvolatile memory. The storage system may be realized as, for example, a NAND-flash technology based solid-state drive (SSD) 3. The SSD 3 is a storage device provided with a NAND flash memory as a nonvolatile memory.

The information processing system 1 manages data, such as various files, using the SSD 3 which is a storage system. The information processing system 1 may function as a computer system configured to control the read operation, the write operation and the erase operation of the nonvolatile memory in the SSD 3.

The information processing system 1 comprises a host (host device) 2 and the SSD 3. The host 2 is an information processing apparatus configured to store data in the SSD 3. Examples of the information processing apparatus include a server computer, a personal computer, and the like.

The SSD 3 may be built into an information processing apparatus that functions as the host 2, or may be connected to the information processing apparatus through a cable or a network.

As an interface for interconnecting the host 2 and the SSD 3, SCSI, Serial Attached SCSI (SAS), ATA, Serial ATA (SATA), PCI Express (PCIe), NVM Express (NVMe), Ethernet (registered trademark), Fibre Channel, etc., can be used.

The SSD 3 may comprise a controller 4, a nonvolatile memory (NAND memory) 5, and a DRAM 6. The NAND memory 5 may include a plurality of NAND flash memory chips.

The NAND memory 5 includes a memory cell array, and this memory cell array includes a large number of NAND blocks (blocks) B0 to Bm−1. Blocks B0 to Bm−1 function as erase units. The block may also be called "a physical block" or "an erase block."

Blocks B0 to Bm−1 include a large number of pages (physical pages). That is, each of blocks B0 to Bm−1 includes pages P0 to Pn−1. A plurality of memory cells connected to the same word line are organized as one page (physical page). In the NAND memory 5, a data read and a data write are performed page by page. A data erase is performed block by block.

The controller 4 is electrically connected to the NAND memory 5 as a nonvolatile memory through a NAND interface 13, such as a toggle or ONFI. The controller 14 may have a physical resources management function for managing the physical resources of the SSD 3, namely, the NAND memory. The physical resources management function of the controller 14 can be used to assist the host 2 to directly access the physical resources of the SSD 3.

In order to directly control and access the physical resources of the SSD 3, the host 2 may execute a flash translation layer (FTL) 44. The system configuration, in which the host 2 has the flash translation layer (FTL) 44, enables the host 2 to directly control and access the physical resources of the SSD 3, and to reduce the processing load of the SSD 3.

The flash translation layer (FTL) 44 may execute data management and the block management of the NAND memory 5.

The data management may include, for example, (1) management of mapping data that indicates the correspondence relationship between logical block addresses (LBAs) and the physical addresses of the NAND memory, and (2) processing of hiding read/write operations performed page by page, and erase operations performed block by block. The mapping management between the LBAs and the physical addresses is performed using a look-up table (LUT) 45 that functions as a logical-to-physical address translation table.

The FTL 44 may support a multi namespace function for managing a plurality of namespaces. In order to enable one storage device (in this case, the SSD 3) to be handled as if it was a plurality of drives, the multi namespace function can manage a plurality of logical address spaces (LBA spaces) corresponding to respective namespaces. Respective LBA ranges (LBA0 to LBAn−1) are allocated to the namespaces. The LBA ranges may have different sizes (size means the number of LBAs). Each LBA range starts with LBA0.

The FTL 44 may manage mapping between LBAs and physical addresses namespace by namespace, using the same number of look-up tables (LUT) 45 as that of created namespaces.

In a look-up table (LUT) 45 corresponding to a certain namespace, mapping between the LBAs of an LAB range associated with the certain namespace and physical addresses may be managed. The management of mapping between LBAs and physical addresses is performed in units of specific management size. As the specific management size, various sizes corresponding to system designs can be used. The specific management size may be, for example, 4 Kbytes.

The physical address corresponding to a certain LBA indicates a location in the NAND memory 5 in which data corresponding to this certain LBA is stored (i.e., a physical storage location). The physical address may be expressed by the combination of a block address and a page address. The block address is an address that designates an individual block, and is also called "a physical block address" or a "block number." The page address is an address that designates an individual page in one block, and is also called "a physical page address" or "page number."

Only one data write to a page is possible per erase cycle. In other words, data can be written only to an erased-state page (available page). The page, to which data is written, is a valid page.

In contrast, a smallest erase unit of data is a block including a plurality of pages.

Accordingly, the FTL 44 maps a write (overwrite) to the same LBA to another page of the NAND memory 5. That is, the FTL 44 writes data to a subsequent available page regardless of the LBA of this data. After that, the FTL 44 updates the look-up table (LUT) 45 to associate the LBA with the page to which the data has actually been written, and invalidate an original page (namely, old data previously associated with the LBA).

The FTL 44 can manage valid data and invalid data. The valid/invalid data may be managed using a page management table that holds valid/invalid flags corresponding to respective physical addresses. Each valid/invalid flag may indicate, specific management size (e.g., 4 Kbytes) by specific management size, whether data corresponding to a physical address is valid. Valid data means that this data is latest data. Invalid data means that this data is invalided by updating (rewriting) and is no more used.

Wear leveling, garbage collection, etc., may be included as examples of block management performed by the FTL 44. The wear leveling is an operation of leveling the number of erase operations (i.e., erase count) among blocks. The garbage collection is an operation for creating a free space in the NAND memory 5. In the garbage collection operation, all valid data in some blocks, in which valid data and invalid data are mixed, is copied to another block (copy destination free block). Further, in the garbage collection operation, the look-up table (LUT) 45 is updated to map the LBAs of copied valid data to respective correct physical addresses. The block, from which valid data is copied to another block and which currently includes only invalid data, is released as a free block, and therefore can be reused after its data erasure.

The host 2 sends, to the SSD 3, various commands (access requests) such as a write command, a read command, and an erase command. As described above, in the information processing system 1, the FTL 44 is executed on the host 2. Therefore, each of the commands can include a physical address (a block address, a page address), instead of an LBA, for designating a location in the NAND memory 5.

Next, the configuration of the controller 4 will be described.

The controller 4 comprises a host interface 11, a CPU 12, a NAND interface 13, a DRAM interface 14, etc. The CPU 12, the NAND interface 13 and the DRAM interface 14 are connected to each other via a bus 10.

The host interface 11 receives various commands (a write command, a read command, an erase command, etc.) from the host 2.

The CPU 12 is a processor configured to control the host interface 11, the NAND interface 13 and the DRAM interface 14. The CPU 12 performs, for example, physical resources management processing for managing the NAND memory 5, and command processing for processing various commands received from the host 2. The physical resources management processing and the command processing may be controlled by firmware executed by the CPU 12.

The firmware can perform processing for assisting the host 2 to control the NAND memory 5.

The firmware enables the CPU 12 to function as a physical NAND access management application program interface (API) 21, a virtual NAND access management application program interface (API) 22, a block data management unit 23, a bad-block management unit 24, a block allocate and erase control unit 25, a write control unit 26, a read control unit 27, a data copy control unit 28, and a namespace control unit 29.

<Physical NAND Access Management API and Virtual NAND Access Management API>

Each of the physical NAND access management API 21 and the virtual NAND access management API 22 is a software interface for communication between the host 2 and the SSD 3, and enables the host 2 to directly control the blocks in the NAND memory 5. In the physical NAND access management API 21, control of the blocks in the NAND memory 5 by the host 2 is executed block by block, namely, physical block by physical block. In contrast, in the virtual NAND access management API 22, control of the blocks in the NAND memory 5 by the host 2 is basically executed block group by block group, the block group being a collection of a plurality of blocks (physical blocks). The block group including a plurality of blocks will also be referred to as "a virtual block."

In both the physical NAND access management API 21 and the virtual NAND access management API 22, a location in the NAND memory 5, which is to be accessed, can be designated by a physical address (a block address, a page address) included in a command from the host 2.

The CPU 12 classifies the blocks (physical blocks) in the NAND memory 5 into a plurality of first blocks and a plurality of second blocks.

The first blocks are dedicated to the physical NAND access management API 21, and are used as blocks for accessing the NAND memory 5 block by block (physical block by physical block). In other word, the first blocks are used singly.

The second blocks are dedicated to the virtual NAND access management API 22, and are organized as a plurality of block groups (a plurality of virtual block groups) each including a set of blocks. The second blocks are used as blocks for accessing the NAND memory 5, block group by block group (each block group being a collection of a plurality of blocks (physical blocks).

In the case where the host 2 accesses the SSD 3 using the physical NAND access management API 21, the CPU 12 receives a first read, write or erase command from the host 2. The first read, write or erase command includes a physical address that designates one block (physical block) included in the first blocks. The CPU 12 responds to the first read, write or erase command, thereby performing a read, write or erase operation on this first block that is designated by the physical address of the first read, write or erase command.

In the case where the host 2 accesses the SSD 3 using the virtual NAND access management API 22, the CPU 12 receives a second read, write or erase command from the host 2. The second read, write or erase command includes a physical address that designates one virtual block (one block group) included in the virtual blocks (block groups). The CPU 12 responds to the second read, write or erase command, thereby performing a read, write or erase operation on a set of blocks included in the one virtual block that is designated by the physical address of the second read, write or erase command.

In the virtual NAND access management API 22, the read, write and erase operations are each performed virtual block by virtual block (the virtual block being formed of a plurality of physical blocks), instead of block by block. Therefore, the virtual NAND access management API 22 can be used as an interface capable of reading, writing and erasing, at high speed, data of a comparatively large size, such as user data. In the case where, for example, the page size is 16 Kbytes and one virtual block is formed of four blocks (four physical blocks), a bandwidth of 64 Kbytes (=16 Kbytes×4) can be realized at the maximum. Further, in the case where, for example, the page size is 16 Kbytes and one virtual block is formed of eight blocks, a bandwidth of 128 Kbytes (=16 Kbytes×8) can be realized at the maximum.

On the other hand, in the physical NAND access management API 21, the read, write and erase operations are each performed on a single block. The maximum bandwidth guaranteed in the physical NAND access management API 21 is narrower than that guaranteed in the virtual NAND access management API 22. In contrast, the physical NAND access management API 21 can control read/write/erase operations at a granularity smaller than in the virtual NAND access management API 22. Therefore, the physical NAND access management API 21 is useful as an interface for performing, for example, data placement control of placing data having a relatively small size, such as metadata, in a desired location in the NAND memory 5, and performing access (read/write/erase) at a small data size particle.

The host 2 may beforehand acquire, from the SSD 3, physical addresses that designate blocks for the physical NAND access management API 21, and physical addresses that designate virtual blocks for the virtual NAND access management API 22. Alternatively, the host 2 may acquire, from the SSD 3, a physical address designating one block or a physical address designating one virtual block by requesting the SSD 3 to allocate the one block or the one virtual block.

Although a combination of blocks included in one virtual block is not limited, one virtual block may be formed of, for example, a plurality of blocks (physical blocks) that can be accessed in parallel (simultaneously).

For example, if the NAND interface 13 has a plurality of channels and one or more NAND flash chips are connected to each channel, one virtual block may comprise blocks selected from NAND flash chips connected to respective channels, i.e., blocks corresponding to the number of channels. This guarantees access speed corresponding to the maximum bandwidth resulting from the structure of the NAND memory 5.

Metadata may be file management information. The file management information may include at least one of data unit indicating a storage location of data in a file, data unit indicating the date and time of creation of this file, and data unit indicating the date and time of updating of this file.

For the read command, write command and erase command associated with the physical NAND access management API 21, operation codes may be used, which differ from those for the read command, write command and erase command associated with the virtual NAND access management API 22.

<Block Information Management>

The block information management unit 23 can manage information associated with the respective blocks in the NAND memory 5 and information associated with the respective virtual blocks in the NAND memory 5, and can provide the host 2 with the information associated with the respective blocks and virtual blocks. The information associated with the respective blocks and virtual blocks may include the number of erasures of each block and the number of erasures of each virtual block.

In, for example, a data center, there may be a case where an SSD connected to a certain server computer is exchanged for another SSD previously used in, for example, another server computer.

If the SSD 3 has been relocated from a certain server computer to another server computer, the block information management unit 23 of this SSD 3 can provide the latter server computer with information associated with the use history of each block and each virtual block in the NAND memory 5. The use history information may includes, for example, the current number of erasures of each block in the NAND memory 5, and the current number of erasures of each virtual block in the NAND memory 5. Since thus, the latter server computer can correctly understand the actual number of erasures of each block or each virtual block, considering the past use history of the SSD 3, the latter server computer can accurately perform processing for wear leveling based on the number of erasures acquired from the SSD 3.

<Bad Block Management>

The bad-block management unit 24 can perform processing of managing bad blocks (primary bad blocks) that cannot be used and is designated by a primary defect list (also called "factory-shipment defect list," and bad blocks (grown bad blocks) designated by the host 2 during the operation of the system.

For instance, if one block in a certain virtual block is designated as an unavailable bad block by the primary defect list or the host 2, the bad-block management unit 24 may execute processing of replacing the bad block in the virtual block with another block for the virtual NAND access management API 22. The latter block may be selected from blocks that can be accessed simultaneously with the all blocks in the virtual block other than this bad block.

<Block Allocation and Erasure>

The block allocate and erase control unit 25 can manage both blocks including valid data, and blocks (free blocks) that do not include valid data. The block including valid data means a block currently used by a user who uses the SSD 3 through the host 2. When some client terminals (client devices) 51 are connected to the host 2 through the network 50, the users of the client terminals 51 may be users who use the SSD 3 through the host 2. The block that does not include valid data means a block that is not used by any user.

The block allocate and erase control unit 25 can also manage both virtual blocks including valid data, and virtual blocks (free virtual blocks) that do not include valid data.

When the host 2 has requested the SSD 3 to allocate one block, the block allocate and erase control unit 25 may allocate one block (physical block) in the free blocks for the host 2, and inform the host 2 of a physical address (block address) that designates the allocated block. Afterward, the host 2 can access the allocated block (for read, write and/or erase operation) using the informed physical address.

When the host 2 has requested the SSD 3 to allocate one virtual block, the block allocate and erase control unit 25 may allocate one virtual block in the free virtual blocks for the host 2, and inform the host 2 of a physical address (virtual block address) that designates the allocated virtual block. Afterward, the host 2 can access the allocated virtual block (for read, write and/or erase operation) using the informed physical address.

The physical address for accessing the virtual block may include a virtual block address, a block number in the virtual block, and a page address. The virtual block address designates one of the virtual block numbers allocated to the respective virtual blocks. The block number in the virtual block indicates that an access target block is an $n^{th}$ (n is a positive integer) block in the virtual block. The page address indicates a page number in the access target block.

The block allocate and erase control unit 25 enables the host 2 to acquire, without managing the blocks that include valid data and the blocks that do not include valid data, a block that does not include valid data. This reduces the management cost of the NAND memory 5 by the host 2.

A block (or virtual block) allocate command that instructs only allocation of a block (or virtual block) may be used. Alternatively, a command for requesting both allocation of a block (or virtual block) and erasure of the block (or virtual block), namely, a block allocate and erase command or a virtual block allocate and erase command, may be used.

The block allocate and erase command is one command obtained by combining a command function of instructing block allocation and a command function of instructing block erasure. Similarly, the virtual block allocate and erase command is one command obtained by combining a command function of instructing virtual block allocation and a command function of instructing virtual block erasure.

Upon receiving a block allocate and erase command from the host 2, the block allocate and erase control unit 25 allocates one of the free blocks for the host 2, automatically erases the allocated block (i.e., the data of the allocated block), and informs the host 2 of a physical address (block address) that designates the allocated and erased block.

Although each free block does not include valid data, it may hold old data (invalid data) previously written by one of the users. The above-mentioned function of automatically erasing the data of an allocated block can prevent leakage of user data. Moreover, the host 2 can immediately start a data write to the allocated block, without transmitting, to the SSD 3, an erase command for erasing the data of the allocated block.

Upon receiving a virtual block allocate and erase command from the host 2, the block allocate and erase control unit 25 allocates one of the free virtual blocks for the host 2, automatically erases the allocated virtual block (i.e., the data of the allocated virtual block), and informs the host 2 of a physical address (virtual block address) that designates the allocated and erased virtual block.

<Write Control>

The write control unit 26 receives a write command including a block address that designates a certain specific block, and a page address that designates a certain specific page included in the pages of the specific block, and writes data designated by the write command to the specific page of the specific block (direct address designation mode). The write control unit 26 supports both the physical NAND access management API 21 and the virtual NAND access management API 22. In the physical NAND access management API 21, a specific block is a specific physical block. In the virtual NAND access management API 22, a specific block is an access target block in a specific virtual block.

The write control unit 26 has "a readable-page notice function" for notifying the host 2 of a latest readable page in a block that holds readable data.

Depending on the type of NAND memory used as the NAND memory 5, there is a case where even when data is written to the initial page of a certain block, it cannot be read from the initial page of the block until data is further written to some subsequent pages in the block. If the initial page has been read-accessed by the host 2 before data is written to some subsequent pages, erroneous data that cannot be corrected by ECC may be read from the initial page, and a status indicating a read error may be returned to the host 2. The host 2 may recognize that this read error is caused by a physical memory defect, although actually, the data of the initial page can be normally read after data is written to some subsequent pages.

Similarly, data written to the second page of this block may not be able to be read normally until data is written to some pages subsequent to the second page. The timing when data of each page becomes to be able to be read differs among NAND memories.

The write control unit 26 can notify the host 2 of the latest readable page of a block holding data that can be read. For instance, when data of the initial page in a write target block becomes to be able to be read, by writing data to some pages subsequent to the initial page, the write control unit 26 may notify the host 2 of the page address of the initial page as a page address of a latest readable page that holds readable data. When the second page of the write target block has become to be readable by further data write to the write target block, the write control unit 26 may notify the host 2 of the page address of the second page as the page address of a latest readable page that holds readable data.

More specifically, the write control unit 26 performs the following operations:

The write control unit 26 receives, from the host 2, a write command including a block address designating a certain block (first block) included in a plurality of blocks in the NAND memory 5, and a page address designating a certain page (first page) in the pages of the first block. The write control unit 26 writes data designated by the write command to the first page of the first block. Subsequently, the write control unit 26 notifies the host 2 of a page address indicating a latest readable page that is included in the pages of the first block to which the host 2 wrote data before the data write to the first page, and that has become to be readable by the data write to the first page.

Based on this notice, the host 2 can recognize the last one of the readable pages in the block to which data has been written. This "readable-page notice function" can assist direct access of the host 2 to the NAND memory 5.

The write control unit 26 also has an "wrong write order warning" function. The "wrong write order warning" function is a function of returning, to the host 2, a signal warning a wrong write order when a constraint on write order that data must be written to a block from the initial page to the last page is not observed.

The host 2 can designate a physical address (a block address and a page address) to which data is to be written. This means that the host 2 may perform write access in wrong write order. This "wrong write order warning" function assists the host 2 to directly control writes to the NAND memory 5.

More specifically, the write control unit 26 performs the following operations:

The write control unit 26 receives, from the host 2, a write command including a block address designating a certain block (first block) included in a plurality of blocks in the NAND memory 5, and a page address designating a certain page (first page) in the pages of the first block. Based on the page address in the write command, the write control unit 26 determines whether the write command satisfies the constraint associated with the write order that data must be written to a block from the initial page to the last page. If the write command satisfies the constraint associated with the write order, the write control unit 26 writes the data designated by the write command to the first page of the first block. In contrast, if the write command does not satisfy the constraint associated with the write order, the write control unit 26 returns to the host 2 a command completion response including the wrong write order warning in order to notify the host 2 of write order violation.

In addition to the above-mentioned "direct address designation mode," the write control unit 26 may also support an "automatic address generation mode."

The direct address designation mode is a write mode in which the host 2 directly designates both a block in the NAND memory 5 and a page in the block, to which data is to be written. In the direct address designation mode, the host 2 transmits, to the SSD 3, a write command including both a block address and a page address.

On the other hand, the automatic address generation mode is a write mode in which the host 2 designates only a block in the NAND memory 5 to which data is to be written. The designated block may be a physical block or an access target block included in virtual blocks.

A write command used in the automatic address generation mode includes only a block address, and does not include a page address. The page address of a write target page in a designated block is automatically issued by the SSD 3. The page address indicating a page to which data has been written, namely, the automatically issued page address, is supplied from the SSD 3 to the host 2.

The above-described "readable-page notice function" can be used in the automatic address generation mode. In the automatic address generation mode, the write control unit 26 can perform the following operations:

The write control unit 26 receives, from the host 2, a write command including a block address and no page address. In accordance with a write order of from the initial page to the last page in the pages of the first block designated by the block address, the write control unit 26 automatically issues a page address that designates a subsequent available page in the pages of the first block. The write control unit 26 writes data designated by the write command to the subsequent available page (namely, the page designated by the automatically issued page address) in the first block. The write control unit 26 notifies the host 2 of a page address indicating the latest readable page that is included in the pages of the first block to which the host 2 wrote data before the data write to the subsequent available page, and has become readable by a data write to the subsequent available page.

The write control unit 26 also has a function of notifying the host 2 of the fact that the page to which data has been written has reached the last page of the current write target block. In accordance with this notice, the host 2 can recognize that new block allocation is needed.

The write control unit 26 further has a function of notifying the host 2 that the number of pages in the current write target block, to which data has been written, has reached a specific number. The host 2 may wish to write specific management information (for example, metadata) to a specific page, for example, the last page, in each block. Thus notifying the host 2 of the fact that the number of pages in the current write target block, to which data has been written, has reached "a specific number" assists the operation, by the host 2, of writing specific management information to, for example, the last page of the block. The "specific number of pages" can be designated by the write command from the host 2.

<Read Control>

When the read control unit 27 has received a read command from the host 2, it reads data from a page in a block, which are designated by a block address and a page address included in the read command. The designated block may be a physical block for the physical NAND access management API 21, or an access target block in virtual blocks for the virtual NAND access management API 22.

<Data Copying Control>

The data copy control unit 28 performs a data copy operation for assisting the host 2 to perform a garbage collection. The data copy operation is locally performed in the SSD 3, based on a data copy command received from the host 2. That is, a data transfer operation for copying data from a specific copy source block in the NAND memory 5 to a specific copy destination block in the same is performed in the SSD 3 without passing through the host 2.

For this reason, an operation of collecting valid data needed for a garbage collection in a specific block in the NAND memory 5 can be locally performed in the SSD 3, without performing processing of transferring, to the memory of the host 2, data read from the specific copy source block in the NAND memory 5, and writing valid data in this data from the memory of the host 2 to the specific copy destination block in the NAND memory 5.

The data copy command can designate the copy source block, a copy start page in the copy source block, the copy destination block, a transfer start page in the copy destination block, a copy completion condition (the number of valid data units to be copied to the copy destination block, or the number of invalid data units to be detected until the end of copying). The number of valid data units may be the number of valid pages, and the number of invalid data units may be the number of invalid pages. The copy source block may be a physical block for the physical NAND access management API 21, or a virtual block for the virtual NAND access management API 22. Similarly, the copy destination block may also be a physical block for the physical NAND access management API 21, or a virtual block for the virtual NAND access management API 22.

The copy start page indicates the initial page to be copied in the copy source block. The transfer start page indicates the initial page in the copy destination block, to which copied data be transferred. The designation of the copy start page and transfer start page enables a fine copy operation of copying (moving) the valid data of an arbitrary page range in the copy source block to an arbitrary page range in the copy destination block.

Moreover, in the data copy operation, the data copy control unit 28 automatically skips copying of invalid data, and copies only the valid data of a specific page range to the copy destination block. As a result, copying of valid data needed for a garbage collection can be performed without causing the host 2 to designate which data should be copied where.

<Namespace Control>

The namespace control unit 29 can support a multi-namespace function of treating a plurality of namespaces individually. In order to enable the NAND memory 5 to be logically divided into a plurality of areas, the multi-namespace function can manage a plurality of namespaces to which respective logical address spaces (LBA spaces) are allocated. Each namespace functions as one area in the NAND memory 5. Data associated with a certain specific namespace is written to a group of blocks allocated to the certain namespace.

The namespace control unit 29 supports, for example, a namespace allocate command.

The namespace allocate command specifies the number of blocks to be secured (reserved) for each namespace. The number of to-be-secured blocks may be the number of physical blocks for the physical NAND access management API 21, or the number of virtual blocks for the virtual NAND access management API 22.

Upon receiving the namespace allocate command from the host 2, the namespace control unit 29 can secure (allocate), for a specific namespace, the number of blocks designated by the host 2.

The namespace allocate command enables the host 2 (host software) to secure, for each namespace, the number of blocks suitable for a work load in the host 2. For example, for a namespace associated with a work load that utilizes a large number of random write accesses, the number of blocks equivalent to a capacity greater than the capacity corresponding to the number of logical block addresses (LBAs) for the namespace may be secured. For example, if the capacity corresponding to the number (LBA range) of logic block addresses (LBAs) for a certain namespace is 100 Gbytes and blocks equivalent to 150 Gbytes are secured for this namespace, an over-provision area having a size that is 50% of the capacity (the capacity of a user space) corresponding to the LBA range can be secured.

Over-provisioning means allocation, for the host 2, of a storage capacity that is invisible to the host 2 as an available user space (user accessible LBA space). The space, to which the storage capacity invisible to the host 2 as the user accessible LBA space is allocated, is an over-provision area. The over-provisioning enables a group of blocks that exceeds the user accessible LBA space (user area capacity) to be allocated to a specific namespace.

In a namespace where data of a high update frequency is handled, rewriting of data occurs so many times, and hence many blocks may be fragmented. Accordingly, the number of executions of the garbage collection is increased to thereby increase the write amplification, whereby the erase count of each block is increased. The increase in the erase count is a factor for causing degradation of the endurance and life of the SSD 3.

In a namespace to which a large over-provision area is allocated, the start time of the garbage collection can be delayed. Assume, for example, the case where a number of blocks (or virtual blocks) equivalent to 150 Gbytes are secured in a specific namespace having a user space (LBA range) of 100 Gbytes. In this case, even if a number of blocks equivalent to 100 Gbytes are filled with data, and include no available pages unless data is erased therefrom, blocks corresponding to the over-provision areas can be used to write data. Thus, the execution of the garbage collection in the specific namespace can be delayed. As data is written to blocks in the over-provision areas, data in blocks of the user space may be invalidated by updating. A block where all data is invalidated can be reused without its garbage collection. This means that an increase in the erase count can be suppressed by optimizing the size of the over-provision area.

Furthermore, the namespace control unit 29 can count the number of erasures (also called erase count, or total erase count) namespace by namespace, and can notify the host 2 of the counted number of erasures namespace by namespace.

The host 2 (the administrator of the host 2) can use an erase count corresponding to a specific namespace as an index for determining wear of the NAND memory 5 due to the specific namespace (due to the user using this namespace). The host 2 can utilize total erase counts corresponding to the respective namespaces for managing the namespaces.

For example, for a namespace having a large erase count, the host 2 may increase the number of blocks to be secured. In this case, the host 2 may transmit a namespace allocate command to the SSD 3 to request the SSD 3 to add a specific number of blocks. Since the addition of the specific number of blocks to the namespace increases the over-provision area of this namespace, the write amplification corresponding to the namespace is suppressed, with the result that the life of the SSD 3 can be maximized.

A data center, for example, may offer rental services for respective storage spaces to users. In this case, the NAND memory 5 is logically divided into a plurality of areas (storage spaces) corresponding to respective namespaces. A certain user accesses a storage space associated with the identifier (NSID) of a certain namespace, and another user accesses another storage space associated with the identifier (NSID) of another namespace. The operator of the data center may reflect the erase counts of the respective namespaces, namely, the amount of wear of the respective namespaces, in the usage fees (rental fees) of the respective storage spaces. For instance, for a user who uses a namespace having a very large erase count, an additional fee corresponding to the amount of wear (erase count) of the namespace may be charged, in addition to a basic usage fee determined from the capacity of the namespace (i.e., the capacity equivalent to the number of blocks secured in the namespace).

Other components in the controller 4 will now be described.

The NAND interface 13 is a NAND controller configured to control the NAND memory 5 under control of the CPU 12. The NAND interface 13 may have a plurality of channels. Each channel is connected to some NAND memory chips. The controller 4 can access, in parallel, a plurality of NAND memory chips connected to different channels of the NAND interface 13.

The DRAM interface 14 is a DRAM controller configured to control the DRAM 6 under control of the CPU 12.

A part of the storage area of the DRAM 6 may be used as a write buffer (WB) 31 for temporarily storing data to be written to the NAND memory 5. Further, the storage area of the DRAM 6 may be used as a copy buffer 32 for temporarily storing data read from a copy source block during a data copy operation. The storage area of the DRAM 6 may also be used for storing system management information 33 including various management tables. The system management information 33 may be loaded from the NAND memory 5 into the DRAM 6 when the power of the SSD 3 is turned on. When the power of the SSD 3 is to be turned off, the updated system management information 33 may be saved in the NAND memory 5. The system management information 33 may include data indicating the block structure (or virtual block structure) of the NAND memory 5, and the use history data of the NAND memory 5, such as the erase count.

The configuration of the host 2 will be described.

The host 2 is an information processing apparatus capable of executing various programs. The programs executed by the host 2 comprise an application software layer 41, an operating system (OS) 42, a file system 43, and the above-mentioned FTL 44.

As generally known, the operating system (OS) 42 is software configured to manage the entire host 2, control the hardware of the host 2, and enables applications and each client device 51 to use the hardware of the host 2 and the SSD 3.

The file system 43 is used to control the operations (creation, saving, updating, erasure, etc.) of files. For example, ZFS, Btrfs, XFS, ext4, NTFS, etc., may be used as the file system 43. Alternatively, a file object system or a key value store system may be used as the file system 43.

Various application software threads run on the application software layer 41. Examples of the application software threads include database software, a virtual machine, and the like.

When the application software layer 41 needs to send a request, such as a read request, a write request, or an erase request, to the SSD 3, it transmits the request to the OS 42. The OS 42 transmits the request to the FTL 44 through the file system 43. The FTL 44 translates the request into a command (a read command, a write command, an erase command, etc.). At this time, the FTL 44 performs a logical-to-physical address translation for translating an LBA included in the request into a physical address of the NAND memory 5. A plurality of FTLs 44 corresponding to respective namespaces may be executed. In this case, the management of mapping between logical addresses (LBAs)

and physical addresses may be performed using different LUTs 45 corresponding to the respective namespaces.

The FTL 44 sends a command to the SSD 3. Upon receiving a response from the SSD 3, the FTL 44 sends the response to the OS 42 through the file system 43.

The OS 42 sends the response to the application software layer 41.

Host Software

Figure 2:
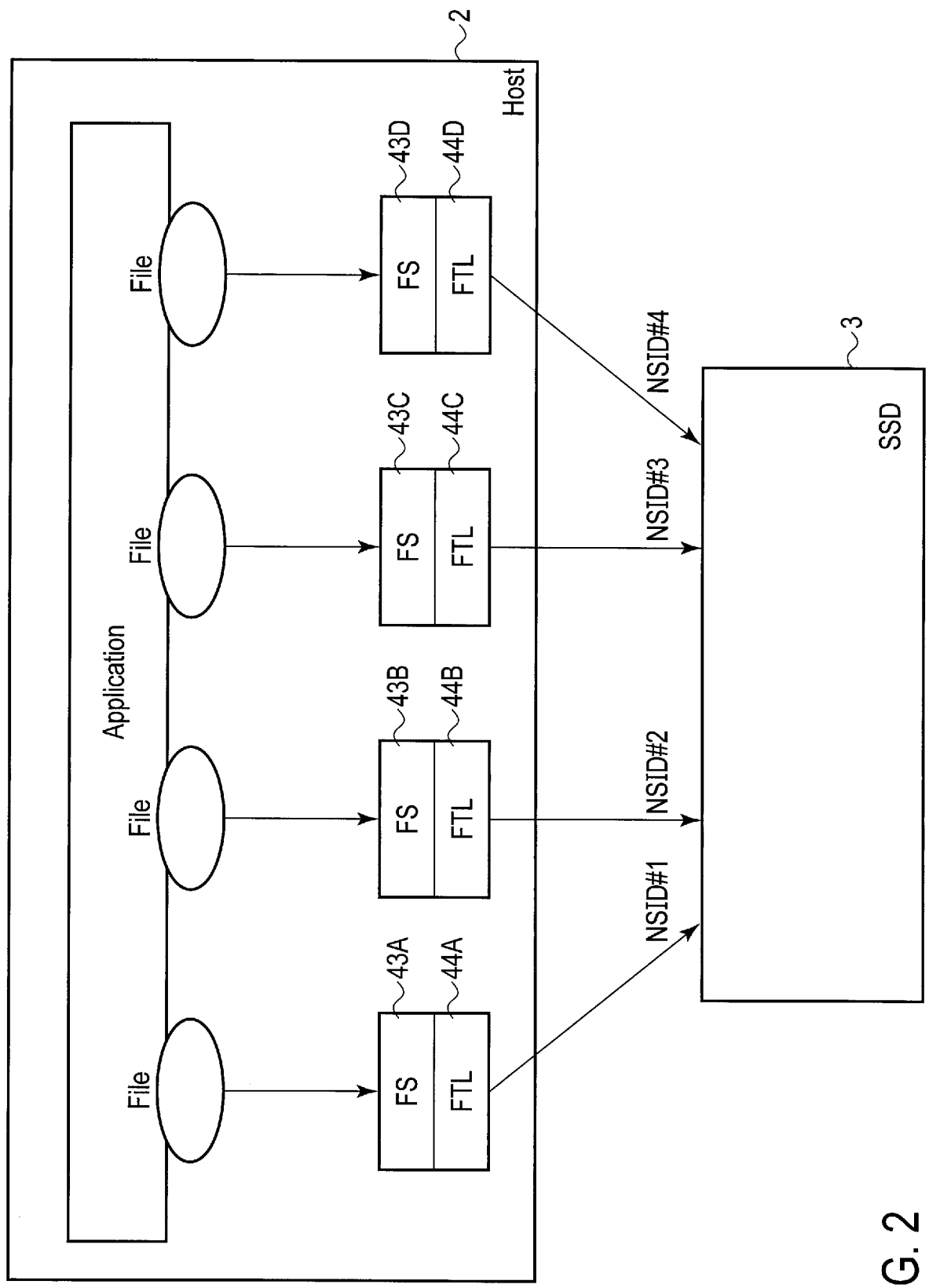
FIG. 2 is a block diagram illustrating host software for controlling the storage system of the embodiment.

FIG. 2 shows an example of software (host software) executed on the host 2.

A certain application may deal with a plurality of files. In each file, write access for writing data is performed by a sequential write. If sequential writes corresponding to the respective files have been merged by one FTL 44, the write destination LBAs of the respective sequential writes will be mixed. For this reason, the merged sequential writes may be sent as random writes to the SSD 3. An increase in random writes may be a factor for increasing the write amplification of the SSD 3.

As shown in FIG. 2, in the host 2, some FTLs 44 corresponding to the respective files may be simultaneously executed.

In the example of FIG. 2, it is assumed that four FTLs 44A, 44B, 44C and 44D are executed. FTLs 44A, 44B, 44C and 44D can operate independently of each other. For example, FTL 44A may manage mapping between LBAs corresponding to a namespace of NSID #1 and physical addresses, FTL 44B may manage mapping between LBAs corresponding to a namespace of NSID #2 and physical addresses, FTL 44C may manage mapping between LBAs corresponding to a namespace of NSID #3 and physical addresses, and FTL 44D may manage mapping between LBAs corresponding to a namespace of NSID #4 and physical addresses.

Some write requests for writing data (for example, data of file "A") associated with the namespace of NSID #1 are sent to FTL 44A through file system 43A. FTL 44A sends, to the SSD 3, some write commands corresponding to the write requests. The SSD 3 can write data designated by these write commands to a block allocated for the namespace of NSID #1. As a result, data of file "A" associated with a certain LBA range can be sequentially written to the block allocated for the namespace of NSID #1.

Similarly, some write requests for writing data (for example, data of file "B") associated with the namespace of NSID #2 are sent to FTL 44B through file system 43B. FTL 44B sends, to the SSD 3, some write commands corresponding to the write requests. The SSD 3 can write data designated by these write commands a block allocated for the namespace of NSID #2.

Therefore, since the sequential write for writing data of file "A" can be prevented from being merged into the sequential write for writing data of file "B", an increase in the write amplification of the SSD 3 can be suppressed.

Channel

Figure 3:
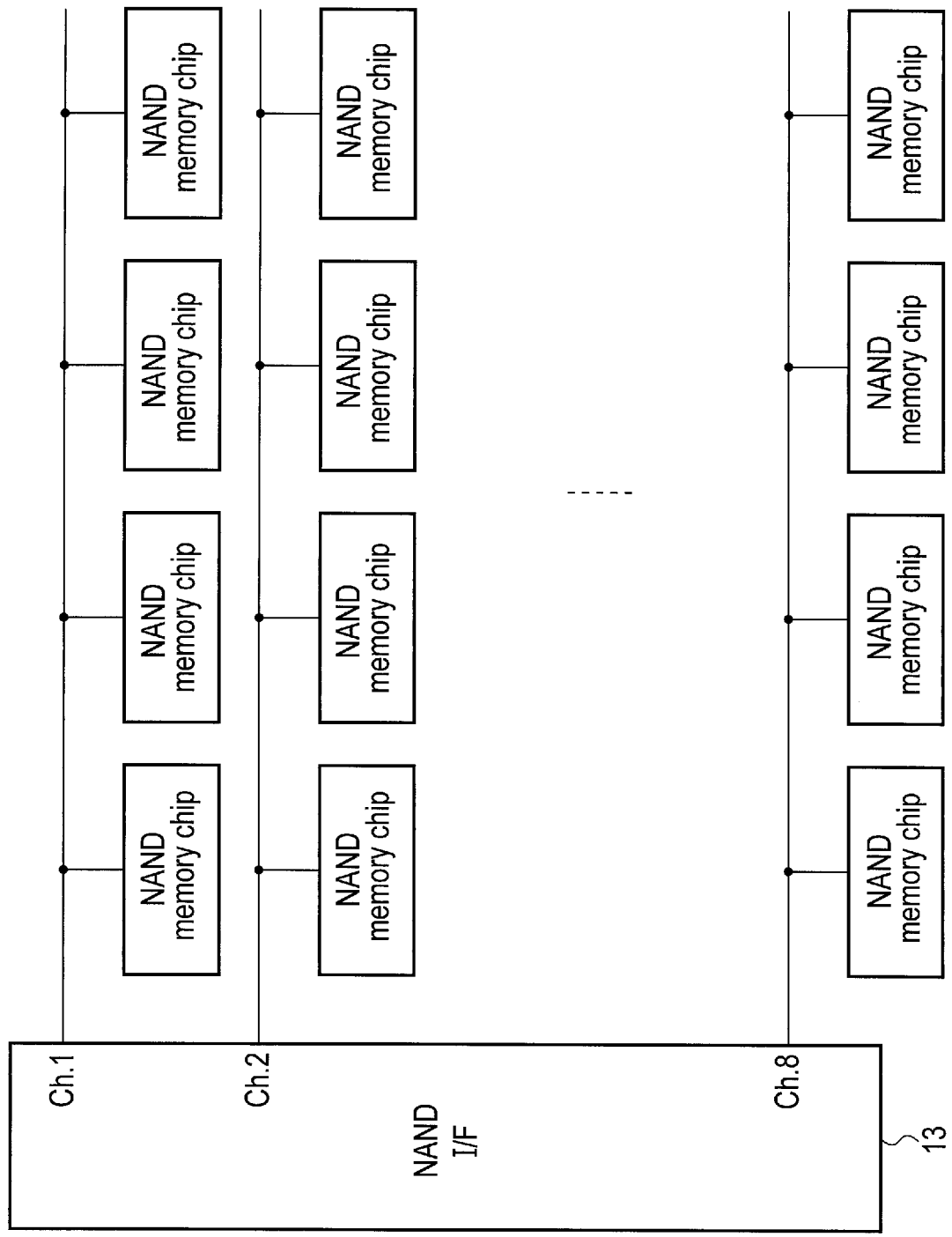
FIG. 3 is a block diagram illustrating the relationship between a NAND interface and a plurality of NAND memory chips in the storage system of the embodiment.

FIG. 3 shows the relationship between the NAND interface 13 and a plurality of NAND memory chips.

FIG. 3 shows a case where four NAND memory chips are connected to each of eight channels (Ch #1 to Ch #8) included in the NAND interface 13. Under control of the controller 4, the NAND interface 13 can perform a read, a write, and an erase on eight blocks in parallel (simultaneously) by simultaneously driving the eight NAND memory chips connected to eight channels (Ch #1 to Ch #8).

Physical Block and Virtual Block

Figure 4:
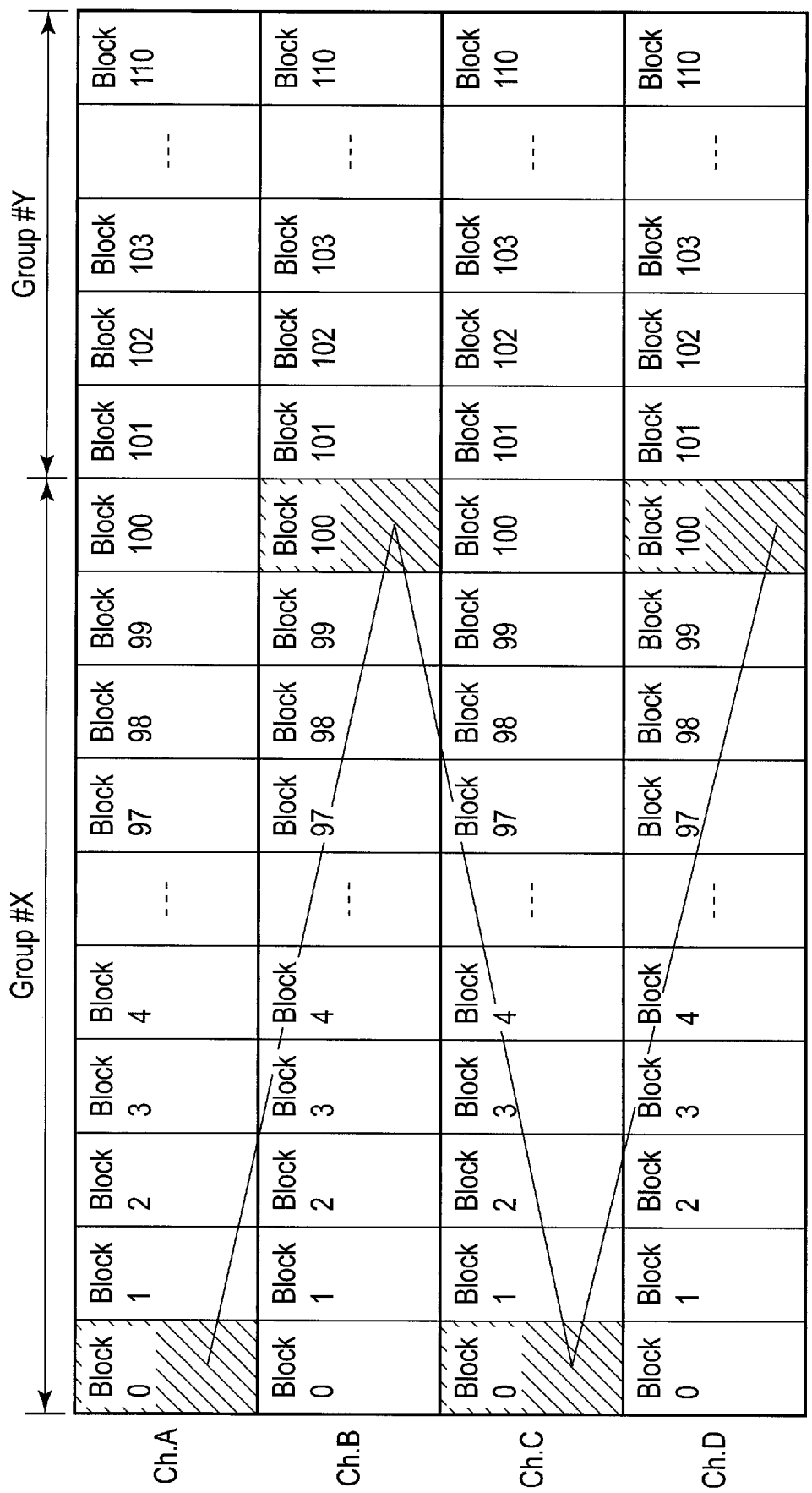
FIG. 4 illustrates blocks for a physical NAND access management application program interface (API), and blocks for a virtual NAND access management application program interface (API), which are managed by the storage system of the embodiment.

FIG. 4 shows blocks for the physical NAND access management API 21 and blocks for the virtual NAND access management API 22. The blocks for the physical NAND access management API 21 and the blocks for the virtual NAND access management API 22 are managed by the SSD 3.

It is assumed here that the NAND interface 13 has four channels (Ch.A to Ch.D).

One or more NAND memory chips are connected to each of channels Ch.A to Ch.D. The one or more NAND memory chips connected to each channel include multiple blocks, for example, 111 blocks (block addresses 0 to 110).

The controller 4 of the SSD 3 classifies a plurality of blocks (physical blocks) in the NAND memory 5 into group #X of blocks for the virtual NAND access management API 22, and group #Y of blocks for the physical NAND access management API 21. Group #X of blocks may include, for example, 101 blocks (block addresses 0 to 100) per channel. Group #Y of blocks may include, for example, ten blocks (block addresses 101 to 110) per channel.

The blocks in group #X are organized as a plurality of virtual blocks. Each of the virtual blocks includes plural blocks. Each of the virtual blocks may include combinations of blocks that can be accessed in parallel.

More specifically, one virtual block may include a block accessible through channel Ch.A, a block accessible through channel Ch.B, a block accessible through channel Ch.C, and a block accessible through channel Ch.D. When NAND memory chips #0 to #3 are connected to channels Ch.A to Ch.D, respectively, as shown in FIG. 5, one virtual block may include one block in chip #0, one block in chip #1, one block in chip #2 and one block in chip #3. The order of writing of data to this virtual block is page P0 in the block in chip #0, page P0 in the block in chip #1, page P0 in the block in chip #2, page P0 in the block in chip #3, page P1 in the block in chip #0, page P1 in the block in chip #1, page P1 in the block in chip #2, and page 1 in the block in chip #3 . . . .

In the case where a write data of 64 Kbytes is written, four data portions each having 16 Kbytes can be written in parallel to, for example, page P0 in a block in chip #0, page P0 in a block in chip #1, page P0 in a block in chip #2, page P0 in a block in chip #3.

Each block in group #Y shown in FIG. 4 is used as a block for the physical NAND access management API 21, namely, a block (physical block) accessed independently.

As described above, a plurality of blocks in the NAND memory 5 are classified into group #X of blocks for the virtual NAND access management API 22, and group #Y of blocks for the physical NAND access management API 21. This enables each block to be used as either a block for the physical NAND access management API 21, or a block for the virtual NAND access management API 22. That is, each block for the physical NAND access management API 21 does not belong to any virtual block. As a result, a specific block for the physical NAND access management API 21 is prevented from being accidentally accessed (read, written or erased) by an access actually directed to a virtual block, whereby safety can be improved.

Physical Block Information, Virtual Block Information and Namespace Information

Figure 6:
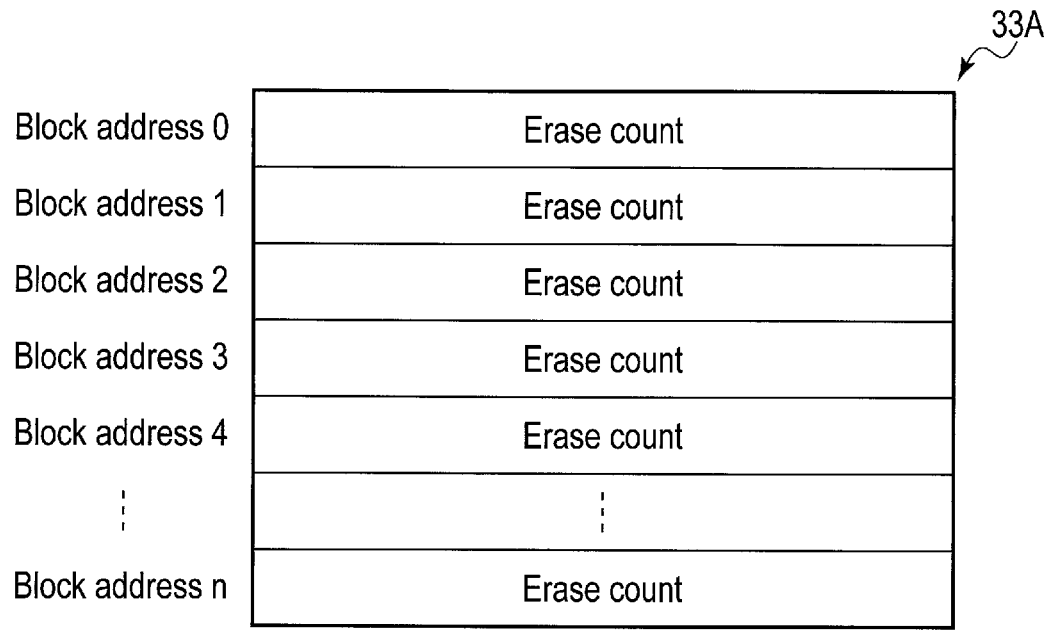
FIG. 6 illustrates an erase count management table held in the storage system of the embodiment and used to manage the erase count of each block.

FIG. 6 shows erase count management table 33A held in the SSD 3.

Erase count management table 33A manages the erase count of each block (physical block) in group #Y. For instance, when a specific block for the physical NAND access management API 21 (for example, a block with block address 0) has been erased by a command (an erase command, a block allocate and erase command) from the host 2, the controller 4 of the SSD 3 increments, by 1, the erase count of this specific block (with block address 0).

Figure 7:
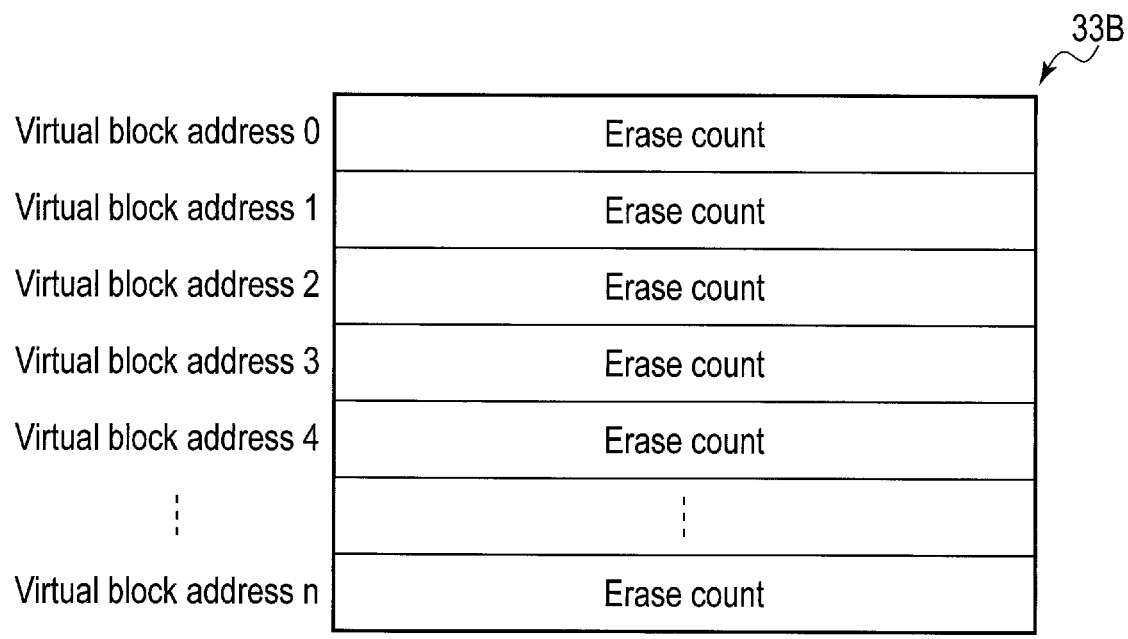
FIG. 7 illustrates another erase count management table held in the storage system of the embodiment and used to manage the erase count of each virtual block.

FIG. 7 shows another erase count management table 33B held in the SSD 3.

Ease count management table 33B manages the erase count of each virtual block in group #X. For instance, when a specific virtual block for the virtual NAND access management API 22 (for example, a virtual block with virtual block address 0) has been erased by a command (an erase command, a virtual block allocate and erase command) from the host 2, the controller 4 of the SSD 3 increments, by 1, the erase count of this specific virtual block (with virtual block address 0). In the virtual NAND access management API 22, all blocks included in one virtual block are erased simultaneously. Therefore, the erase count is managed virtual block by virtual block.

Figure 8:
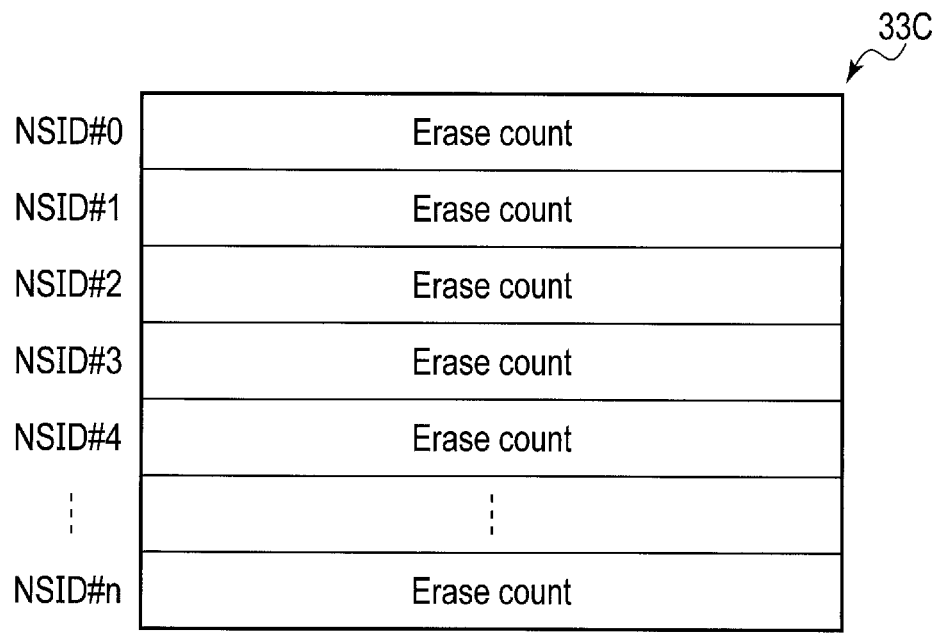
FIG. 8 illustrates yet another erase count management table held in the storage system of the embodiment and used to manage the erase count of each namespace.

FIG. 8 shows yet another erase count management table 33C held in the SSD 3.

Erase count management table 33C manages erase counts (total erase counts) corresponding to respective namespace IDs (NSIDs). An erase count (total erase count) corresponding to the namespace of a certain NSID is an accumulated number of erasures executed on a namespace (area) designated by this NSID, and is incremented by 1 whenever an erase operation is performed on a block included in the blocks of the namespace designated by the NSID. In the physical NAND access management API 21, the blocks allocated for the namespace of a certain NSID are physical blocks. In the virtual NAND access management API 22, the blocks allocated for the namespace of a certain NSID are virtual blocks.

For instance, when a specific block (having, for example, block address 0) has been erased by a command (an erase command or a block allocate and erase command) from the host 2, the controller 4 in the SSD 3 specifies an NSID for which this specific block (having, for example, block address 0) is allocated, and increments the erase count of the namespace of the specified NSID by 1. Similarly, when a specific virtual block (having, for example, virtual block address 0) has been erased by a command (an erase command or a virtual block allocate and erase command) from the host 2, the controller 4 in the SSD 3 specifies an NSID for which this specific virtual block (having, for example, virtual block address 0) is allocated, and increments the erase count of the namespace of the specified NSID by 1.

Figure 9:
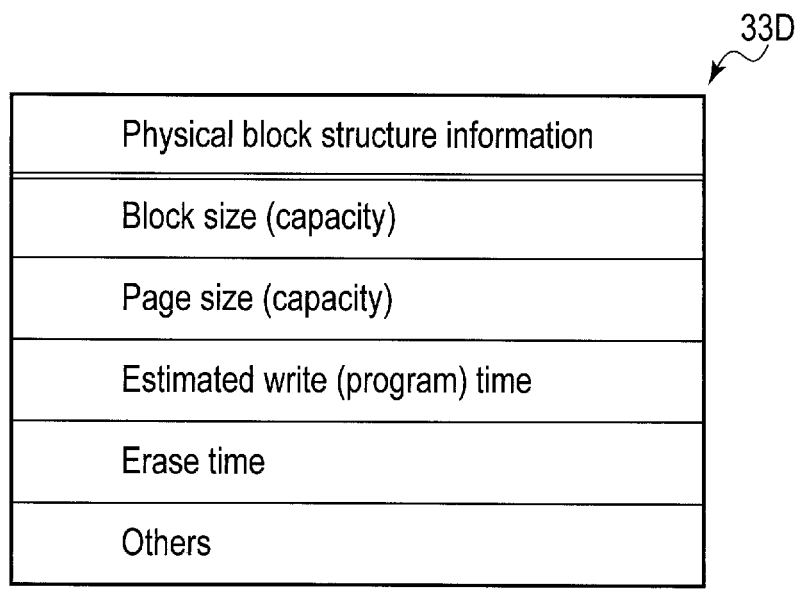
FIG. 9 illustrates a physical block structure information table held in the storage system of the embodiment.

FIG. 9 shows a physical block structure information table 33D held in the SSD 3.

The physical block structure information table 33D shows data indicating the structure of each block (physical block) in the NAND memory 5. The physical block structure information table 33D includes a block size, a page size, an estimated write (program) time, an erase time, etc. The block size indicates the size (capacity) of one block. The page size indicates the size (capacity) of one page. The estimated write (program) time indicates a time (tProg) required to program data from a page buffer to a memory cell.

FIG. 10 shows a virtual block structure information table 33E held in the SSD 3.

The virtual block structure information table 33E shows data indicating the structure of each virtual block. The virtual block structure information table 33E includes an equivalent block size, a page size, an estimated write (program) time, an erase time, the number of blocks included in one virtual block, etc. The equivalent block size may be the total sum of the capacities of blocks included in one virtual block.

FIG. 11 shows a namespace information table 33F for the physical NAND access management API 21 held in the SSD 3.

The namespace information table 33F manages (1) the total number of existing namespaces, (2) the numbers of blocks allocated for the respective namespaces, (3) a list of block addresses corresponding to the respective namespaces, and (4) the erase counts (total erase counts) of the respective namespaces.

For example, in the case of NSID #1, the number of blocks allocated for the namespace of NSID #1 may indicate the total number of blocks (physical blocks) secured for the namespace of NSID #1. The list of block addresses corresponding to the namespace of NSID #1 indicates the block addresses of the respective blocks allocated for the namespace of NSID #1 and actually used.

FIG. 12 shows a namespace information table 33G for the virtual NAND access management API 22, held in the SSD 3.

The namespace information table 33G manages (1) the total number of existing namespaces, (2) the numbers of virtual blocks allocated for the respective namespaces, (3) a list of virtual block addresses corresponding to the respective namespaces, and (4) the erase counts (total erase counts) of the respective namespaces.

For example, in the case of NSID #1, the number of virtual blocks allocated for the namespace of NSID #1 may indicate the total number of virtual blocks secured for the namespace of NSID #1. The list of virtual block addresses corresponding to the namespace of NSID #1 indicates the virtual block addresses of the respective virtual blocks allocated for the namespace of NSID #1 and actually used.

Virtual Block Management

FIG. 13 shows the relationship between a plurality of virtual blocks in the SSD 3 and block addresses corresponding to blocks (physical blocks) that construct the virtual blocks.

The combinations of the block addresses of a plurality of blocks (physical blocks) belonging to each virtual block are determined uniquely based on a mathematical rule, from the virtual block address of each virtual block. Using the method of uniquely determining the combinations of block addresses based on the mathematical rule from the virtual block address enables combinations of block addresses belonging to a respective virtual block to be easily determined only from the respective virtual block address, without using a dedicated management table holding the block addresses belonging to the respective virtual block.

As the mathematical rule, an arbitrary rule that can uniquely determine the combinations of block addresses from the virtual block addresses can be used.

FIG. 13 shows an example case of using a mathematical rule that block addresses 0 to 100 associated with channel Ch.A are allocated in ascending order to virtual block addresses VB0 to VB100, block addresses 0 to 100 associated with channel Ch.B are allocated in descending order to virtual block addresses VB0 to VB100, block addresses 0 to 100 associated with channel Ch.C are allocated in ascending order to virtual block addresses VB0 to VB100, and block addresses 0 to 100 associated with channel Ch.D are allocated in descending order to virtual block addresses VB0 to VB100.

In this case, for example, the combinations of the block addresses of a plurality of blocks belonging to a virtual block having virtual block address VB0 are determined as block address 0 of channel Ch.A, block address 100 of channel Ch.B, block address 0 of channel Ch.C and block address 100 of channel Ch.D. Similarly, the combinations of the block addresses of a plurality of blocks belonging to a virtual block having virtual block address VB1 are determined as block address 1 of channel Ch.A, block address 99 of channel Ch.B, block address 1 of channel Ch.C and block address 99 of channel Ch.D.

The applicable mathematical rule is not limited to this, but may be a mathematical rule of, for example, selecting, from each channel, a block address having the same value as a virtual block address. In this case, the combinations of the block addresses of a plurality of blocks belonging to a virtual block having, for example, virtual block address VB0, are determined as block address 0 of channel Ch.A, block address 0 of channel Ch.B, block address 0 of channel Ch.C, and block address 0 of channel Ch.D. Similarly, the combinations of the block addresses of a plurality of blocks belonging to a virtual block having, for example, virtual block address VB1, are determined as block address 1 of channel Ch.A, block address 1 of channel Ch.B, block address 1 of channel Ch.C, and block address 1 of channel Ch.D.

The host 2 needs to recognize a physical address (virtual block address) that can designate a respective virtual block, but does not have to recognize the block address itself of each of blocks included in the virtual block.

For example, in the case of in the virtual block having virtual block address VB0, VB0-0 represents the combination of virtual block address VB0 and block number 0 of a first block in this virtual block. If VB0-0 is designated by the host 2, the SSD 3 can convert VB0-0 into block address 0 of channel Ch.A to thereby access block address 0 of channel Ch.A. Similarly, VB0-1 represents the combination of virtual block address VB0 and block number 1 of a second block in this virtual block. If VB0-1 is designated by the host 2, the SSD 3 can convert VB0-1 into block address 100 of channel Ch.B to thereby access block address 100 of channel Ch.B.

Management of Bad Block in Virtual Block

FIG. 14 shows an operation of the SSD 3 for replacing a bad block.

For instance, if block VB2-2 corresponding to channel Ch.C in a virtual block having virtual block address VB2 has been designated as a bad block, the controller 4 of the SSD 3 can specify a block address (=2) of channel Ch.C from VB2-2, based on a mathematical rule. After that, the controller 4 registers a block having this block address (=2) of channel Ch.C in a bad block list. Subsequently, the controllers 4 replaces the block having block address 2 with another block that can be accessed in parallel with the other blocks in the virtual block (virtual block address VB2). The other blocks in the virtual block (virtual block address VB2) are a block having block address 2 of channel Ch.A, a block having block address 98 of channel Ch.B, and a block having block address 98 of channel Ch.D). For instance, a block, which is included in the groups of channel Ch.C and is not currently used for physical NAND access or virtual NAND access, e.g., a block having block address 102 of channel Ch.C, is used as the above-mentioned "another" block.

It is sufficient if the controller 4 stores data indicating that block address 2 of channel Ch.C of virtual block address VB2 has been replaced with block address 102 of channel Ch.C.

Bad Block Command

FIG. 15 shows a bad block command for the physical NAND access management API 21 applied to the SSD 3.

The bad block command for the physical NAND access management API 21 requests the SSD 3 to make a specific block be a bad block. The host 2 may determine a block to be made a bad block, based on, for example, the number of read errors. The bad block command includes the following input parameter:

(1) Block address: The block address designates a block (physical block) to be made a bad block.

The bad block command includes the following output parameter:

(1) Exit status: A exit status indicating success or failure (error) of the bad block command is returned to the host 2.

FIG. 16 shows a bad block command for the virtual NAND access management API 22 applied to the SSD 3.

The bad block command for the virtual NAND access management API 22 requests the SSD 3 to make a block in a specific virtual block be a bad block. The host 2 may determine an $n^{th}$ block (n: natural number) in the specific virtual block to be made a bad block, based on, for example, the number of read errors. The bad block command includes the following input parameter:

(1) Virtual block address and block number in virtual block

A virtual block address and a block number in a virtual block corresponding to the virtual block address designate the virtual block and the $n^{th}$ block of the virtual block that is to be made a bad block. The block number in the virtual block may be a value designating a channel number.

The bad block command includes the following output parameter:

(1) Exit status: A exit status indicating success or failure (error) of the bad block command is returned to the host 2.

Procedure of Bad Block Processing

The flowchart of FIG. 17 shows a procedure of processing for the virtual NAND access management API 22 and bad block processing, performed by the SSD 3.

The controller 4 of the SSD 3 classifies the blocks in the NAND memory 5 into two groups (group #X, group #Y) (step S1), and organizes the blocks of group #X as a plurality of virtual blocks (each virtual block including a set of blocks) (step S2).

In step S2, the controller 4 determines combinations of block addresses that should belong to each virtual block, based on a mathematical rule. If a block in a certain virtual block is designated as a bad block in the above-mentioned primary defect list, the controller 4 may select, from group #Y, a block connected to the same channel as the bad block, and replace the bad block with the selected block. The remaining blocks in group #Y are used as blocks for the physical NAND access management API 21.

After that, the controller 4 responds to a read, write or erase command received from the host 2 and including a physical address (e.g., a virtual block address, a block number in a virtual block, a page address) for designating the virtual block, thereby performing a read, write or erase operation on the virtual block (step S3). In step S3, the controller 4 determines the block address of an access target block in an access target virtual block from the physical address (the virtual block address, the block number in the virtual block), based on a mathematical rule, and performs the read, write or erase operation on the target block.

If the controller 4 receives a bad block command from the host 2, the controller 4 determines whether the bad block command is associated with the virtual NAND access management API 22, or the physical NAND access management API 21 (steps S4 and S5). If the bad block command for the virtual NAND access management API 22 and the bad block command for the physical NAND access management API 21 have different operation codes, this determination is performed based on the operation code of the received bad block command. In contrast, if the bad block command for the virtual NAND access management API 22 and the bad block command for the physical NAND access management API 21 have the same operation code, the above determination may be performed based on the type of the address (the block address, or the virtual block address and the block number in the virtual block) included in the received bad block command.

If the received bad block command is a bad block command for the physical NAND access management API 21 (YES in step S5), the controller 4 registers, in the bad block list, a block having a block address designated by the bad block command, and manages the block having the block address as a bad block (step S56). Processing for replacing this bad block with another block is not performed.

If the received bad block command is a bad block command for the virtual NAND access management API 22 (YES in step S4), the controller 4 determines the block address of a block to be made a bad block, from the virtual block address and the block number in the virtual block, based on the same mathematical rule as that used in step S2 (step S7).

The controller 4 registers, in the bad block list, the block having the determined block address, and manages the block having the determined block address as a bad block (step S8).

After that, the controller 4 selects, from blocks connected to the same channel as the block (bad block) having the determined block address, a block that is currently not used for physical NAND access or virtual NAND access (step S9), and replaces the block (bad block) having the determined block address with the selected block (step S10).

Processing Sequence for Physical NAND Access and Virtual NAND Access

FIG. 18 shows a processing sequence for physical NAND access and virtual NAND access performed by the SSD 3 and the host 2.

When the host 2 wants to access the SSD 3 using the physical NAND access management API 21, it may request the SSD 3 to allocate one block. This request may be the above-mentioned block allocate and erase command. The controller 4 of the SSD 3 selects, from the blocks of group #Y, a block (a currently unused block) which does not include valid data, allocates the selected block for the host 2, and notifies the host 2 of the physical address (block address) of this allocated block.

When the host 2 wants to access the SSD 3 using the virtual NAND access management API 22, it may request the SSD 3 to allocate one virtual block. This request may be the above-mentioned virtual block allocate and erase command. The controller 4 of the SSD 3 selects, from a plurality of virtual blocks, a virtual block (a currently unused virtual block) which does not include valid data, allocates the selected virtual block for the host 2, and notifies the host 2 of the physical address (virtual block address) of this allocated virtual block.

The host 2 transmits, to the SSD 3, a read, write or erase command including the notified block address, namely, a read, write or erase command for the physical NAND access management API 21. Upon reception of the read, write or erase command including the block address, namely, the read, write or erase command for the physical NAND access management API 21, the controller 4 performs a read, write or erase operation on a specific single block designated by this block address (step S11).

The host 2 transmits, to the SSD 3, a read, write or erase command including the notified virtual block address. Upon reception of the read, write or erase command including the virtual block address, namely, a read, write or erase command for the virtual NAND access management API 22, the controller 4 performs a read, write or erase operation on a set of blocks included in a specific virtual block designated by the virtual block address (step S12).

Write Processing

FIG. 19 shows a write processing sequence for physical NAND access, performed by the SSD 3 and the host 2 to access a single physical block.

The host 2 transmits, to the SSD 3, a write command for the physical NAND access management API 21. The write command includes a block address that designates a block to which data is to be written. In the case of the above-mentioned direct address designation mode, the write command includes both the block address and a page address. Upon reception of the write command for the physical NAND access management API 21, the controller 4 of the SSD 3 writes data designated by the write command to a write target page in a block designated by the block address included in the write command (step S13). In the case of the direct address designation mode, the write target page is designated by the page address included in the write command. In the case of the above-mentioned automatic address generation mode, the write target page is designated by a page address automatically generated by the controller 4.

After executing the write command, the controller 4 transmits a write command completion response to the host 2.

FIG. 20 shows a write processing sequence performed by the SSD 3 and the host 2 for virtual NAND access in which a virtual block including a plurality of physical blocks is accessed.

The host 2 transmits, to the SSD 3, a write command for the virtual NAND access management API 22. This write command includes a virtual block address that designates a virtual block to which data is to be written. In the case of the above-mentioned direct address designation mode, the write command includes both the virtual block address and a page address. As described above, the write command may include the virtual block address, a block number in the virtual block, and the page address.

Upon reception of the write command for the virtual NAND access management API 22, the controller 4 of the SSD 3 writes data designated by the write command to a write target page in a virtual block designated by the virtual block address included in the write command (step S14). In the case of the direct address designation mode, the write target page is designated by the page address included in the write command. In the case of the above-mentioned automatic address generation mode, the write target page is designated by a page address automatically generated by the controller 4. In the automatic address generation mode, both the block number in the virtual block and the page address may be generated automatically.

After executing the write command, the controller 4 transmits a write command completion response to the host 2.

Read Processing

FIG. 21 shows a read processing sequence for physical NAND access, performed by the SSD 3 and the host 2.

The host 2 transmits, to the SSD 3, a read command for the physical NAND access management API 21. This read command includes a block address and a page address. Upon reception of the read command for the physical NAND access management API 21, the controller 4 of the SSD 3 reads data from a read target page in a block designated by the block address and the page address included in the read command (step S15). After executing the read command, the controller 4 transmits the read data and a read command completion response to the host 2.

FIG. 22 shows a read processing sequence for virtual NAND access, performed by the SSD 3 and the host 2.

The host 2 transmits, to the SSD 3, a read command for the virtual NAND access management API 22. This read command includes a virtual block address and a page address. The read command may include the virtual block address, a block number in a virtual block, and the page address.

Upon reception of the read command for the virtual NAND access management API 22, the controller 4 of the SSD 3 reads data from a read target page in a virtual block designated by the virtual block address, the block number in the virtual block, and the page address, which are included in the read command (step S16). After executing the read command, the controller 4 transmits the read data and a read command completion response to the host 2.

Erase Processing

FIG. 23 shows an erase processing sequence for physical NAND access, performed by the SSD 3 and the host 2.

The host 2 transmits, to the SSD 3, an erase command for the physical NAND access management API 21. This erase command includes a block address. Upon reception of the erase command for the physical NAND access management API 21, the controller 4 of the SSD 3 erases a block designated by the block address in the erase command to thereby set all pages of this block in an erased state (step S17). After executing the erase command, the controller 4 transmits an erase command completion response to the host 2.

FIG. 24 an erase processing sequence for virtual NAND access, performed by the SSD 3 and the host 2.

The host 2 transmits, to the SSD 3, an erase command for the virtual NAND access management API 22. This erase command includes a virtual block address. Upon reception of the erase command for the virtual NAND access management API 22, the controller 4 of the SSD 3 simultaneously erases blocks in a virtual block designated by the virtual block address in the erase command to thereby set all pages of these blocks in an erased state (step S18). After executing the erase command, the controller 4 transmits an erase command completion response to the host 2.

Priority Management

Figure 25:
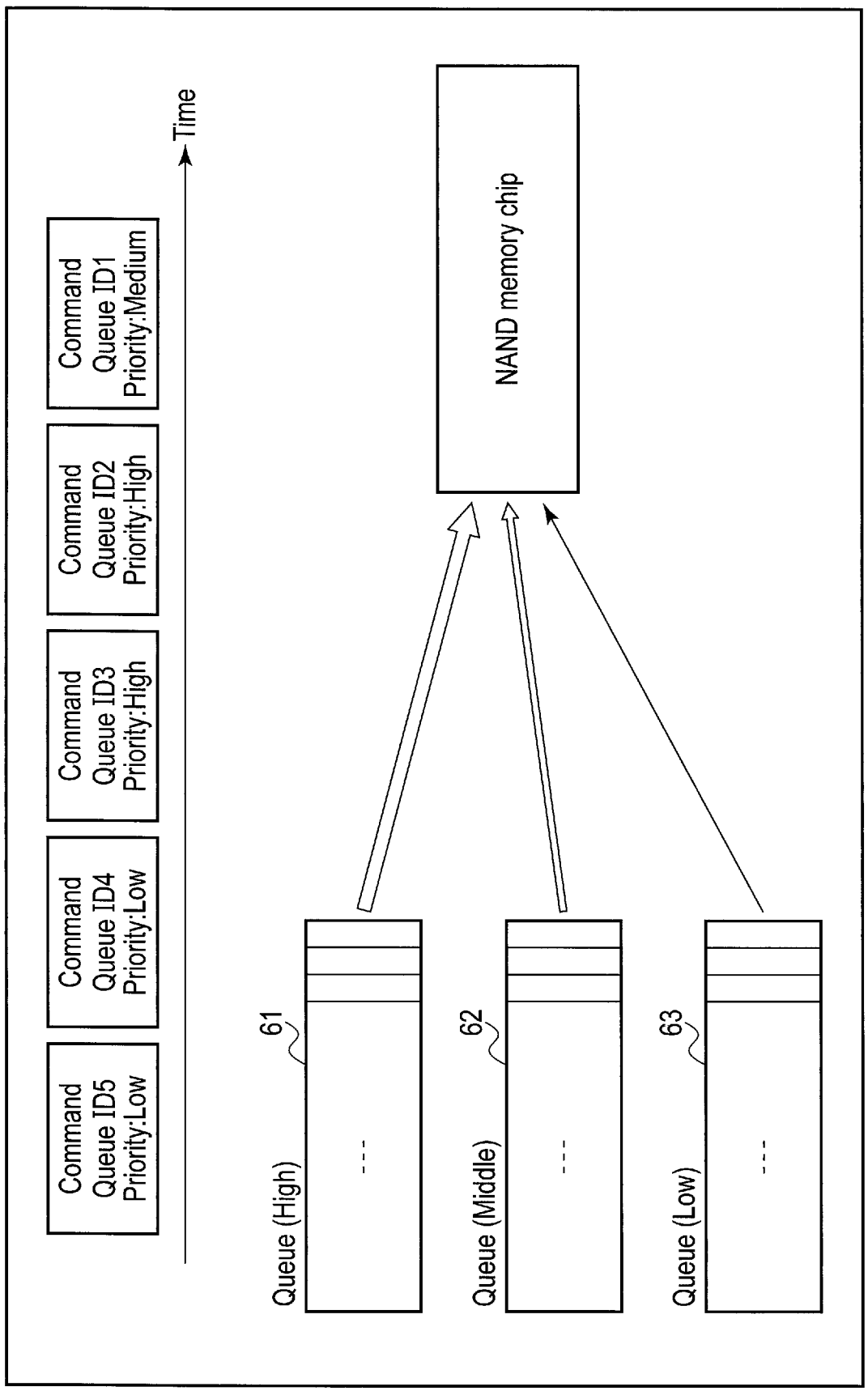
FIG. 25 illustrates a command priority management operation executed by the storage system of the embodiment.

FIG. 25 shows a command priority management operation executed by the controller 4.

The host 2 may add, to all commands to transmit, values (priorities) that indicate the priority levels (priority classes) of execution of the commands. Each command may have an input parameter that indicates its priority.

The number of types of priorities (priority classes) may be an arbitrary number not less than 2. The types of priority classes may include, for example, "High" representing the highest priority, "Low" representing the lowest priority, and "Medium" representing the medium priority.

In the priority management performed by the controller 4, a command with a higher priority can be executed before a command with a lower priority. The order of execution between commands having the same priority may be determined by a first-in first-out (FIFO) scheme. If there is a command, such as an erase command, which requires a lot of time until it is completely executed, the execution of this command may be interrupted to execute a command of a higher priority, and may be continued after the command of the higher priority is executed.

For the priority management, queues 61, 62 and 63 with respective priorities may be provided NAND chip by NAND chip. Further, queue IDs may be added to all commands and all command completion responses in order to identify which command has been executed. The host 2 may add the queue IDs to all commands.

Each command with priority "High" is queued in priority queue 61. Each command with priority "Medium" is queued in priority queue 62. Each command with priority "Low" is queued in priority queue 63. Extraction of a command from priority queue 61 takes preference of extraction of a command from priority queue 62 and extraction of a command from priority queue 63. Extraction of a command from priority queue 62 takes preference of extraction of a command from priority queue 63.

Block Allocate and Erase Command

Referring now to FIG. 26, a description will be given of a block allocate and erase command for the physical NAND access management API 21 and a block allocate and erase command for the virtual NAND access management API 22.

The block allocate and erase command for the physical NAND access management API 21 includes the following input parameters:

(1) Block type=block: The block type indicates the type of a block to be allocated. The block type corresponding to the block allocate and erase command for the physical NAND access management API 21 is a block (physical block). One block selected from the free blocks is allocated for the host 2, and an erase operation on this block is automatically performed to erase this block.

(2) Processing priority: The processing priority indicates the priority of this command.

(3) NSID (optional): NSID indicates the ID of the namespace for which the block is to be allocated.

The block allocate and erase command for the physical NAND access management API 21 includes the following output parameters:

(1) Exit status: An exit status indicating the success or failure (error) of the block allocate and erase command is returned to the host 2.

(2) Block address: The block address of an allocated block is returned to the host 2.

(3) Number of remaining blocks: Only when NSID is designated, the number of remaining blocks secured for this NSID is returned to the host 2.

The block allocate and erase command (also referred to "the virtual block allocate and erase command") for the virtual NAND access management API 22 includes the following input parameters:

(1) Block type=virtual block: The block type corresponding to the block allocate and erase command for the virtual NAND access management API 22 is a virtual block. One virtual block selected from the free virtual blocks is allocated for the host 2, and erase operations on blocks in this virtual block are automatically performed to erase these blocks in this virtual block.

(2) Processing priority: The processing priority indicates the priority of this command.

(3) NSID (optional): NSID indicates the ID of the namespace for which the virtual block is to be allocated.

The block allocate and erase command for the virtual NAND access management API 22 includes the following output parameters:
(1) Exit status: An exit status indicating the success or failure (error) of the block allocate and erase command is returned to the host 2.
(2) Block address: The virtual block address of an allocated virtual block is returned to the host 2.
(3) Number of remaining blocks: Only when NSID is designated, the number of remaining virtual blocks secured for this NSID is returned to the host 2.

Physical Block Management and Virtual Block Management

FIG. 27 shows a block-in-use list 71A, a free block list 71B, a virtual-block-in-use list 72A and a free virtual block list 72B, which are managed by the controller 4 of the SSD 3.

The block-in-use list 71A indicates a list of blocks (physical blocks) that are included in the blocks of group #Y and hold valid data, i.e., a list of blocks currently used by the host 2. The free block list 71B indicates a list of blocks that are included in the blocks of group #Y and do not hold valid data, i.e., a list of free blocks that are currently not used by the host 2.

The virtual-block-in-use list 72A indicates a list of virtual blocks that are included in the virtual blocks of group #X and hold valid data, i.e., a list of virtual blocks currently used by the host 2. The free virtual block list 72B indicates a list of virtual blocks that are included in the virtual blocks of group #X and do not hold valid data, i.e., a list of free virtual blocks that are currently not used by the host 2.

Block Allocate and Erase Processing

Figure 28:
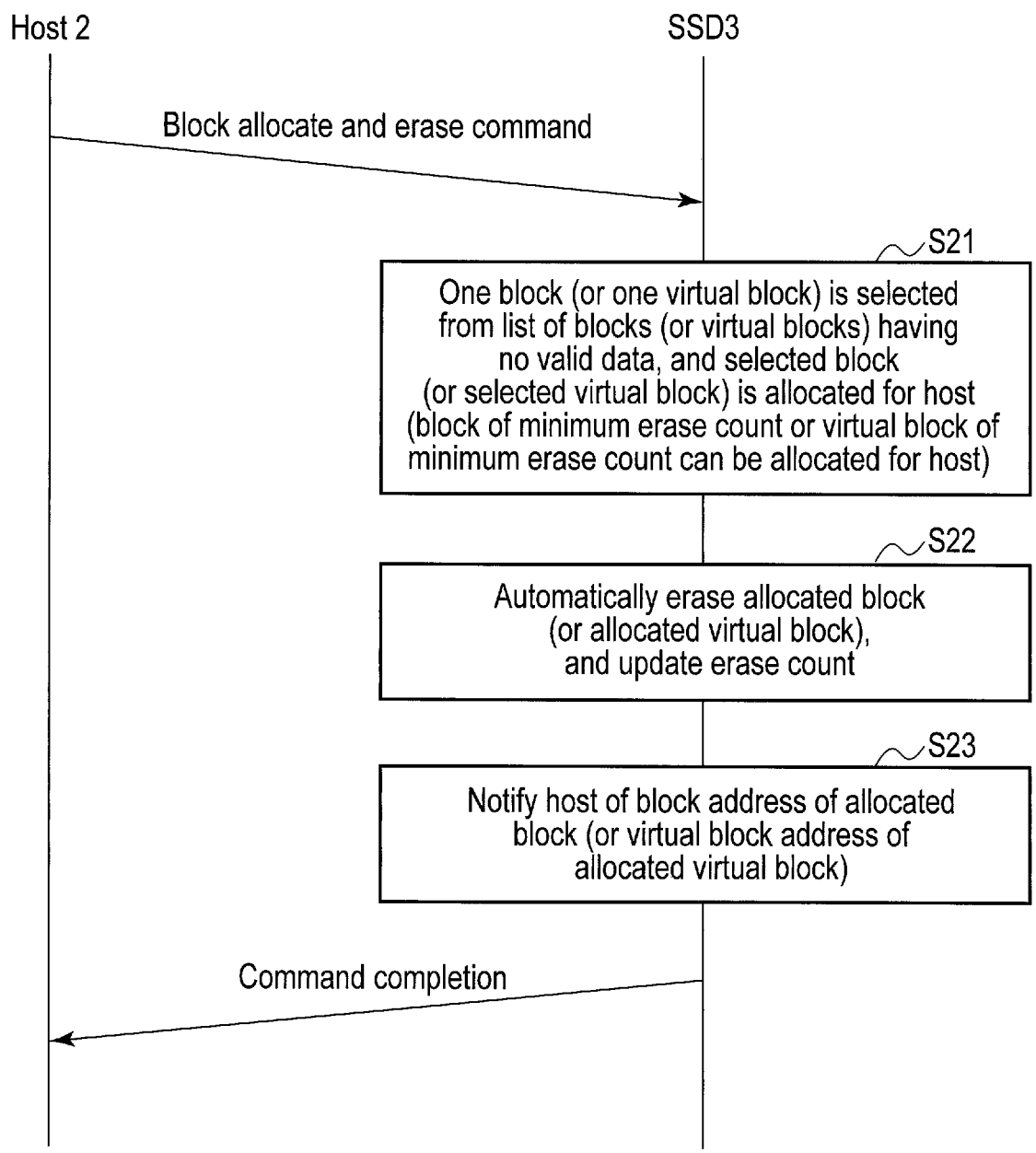
FIG. 28 illustrates a block allocate and erase processing sequence executed by the storage system of the embodiment and the host.

FIG. 28 shows a block allocate and erase processing sequence performed by the SSD 3 and the host 2.

First, a description will be given of the block allocate and erase processing for the physical NAND access management API 21.

When blocks (physical blocks) currently allocated for the host 2 are filled with data from the host 2, the host 2 may transmit, to the SSD 3, a block allocate and erase command for the physical NAND access management API 21.

Upon receiving the block allocate and erase command from the host 2, the controller 4 of the SSD 3 selects one block (physical block) from the free block list 71B, and allocates, for the host 2, the selected block (physical block) as a write target block (step S21). The controller 4 has authority of selection of a block (a write target block) from the free block list 71B. Therefore, the controller 4 can allocate, for the host 2, a block of high reliability as the write target block. In step S21, the controller 4 may select a block having a minimum erase count from the free block list 71B, and may allocate, for the host 2, the block having the minimum erase count as the write target block.

The controller 4 erases the allocated block and updates the erase count of the allocated block (step S22). In the step S22, controller 4 performs an erase operation on the allocated block to erase the data of the allocated block. The controller 4 notifies the host 2 of the block address of this allocated block (step S23). The host 2 may be notified of this block address as a return value included in a command completion response to the block allocate and erase command.

Next, block allocate and erase processing for the virtual NAND access management API 22 will be described.

When virtual blocks currently allocated for the host 2 are filled with data supplied from the host 2, the host 2 may transmit, to the SSD 3, a block allocate and erase command for the virtual NAND access management API 22.

Upon receiving the block allocate and erase command from the host 2, the controller 4 of the SSD 3 selects one virtual block from the free virtual block list 72B, and allocates, for the host 2, the selected virtual block as a write target virtual block (step S21). The controller 4 has authority of selection of a virtual block (a write target virtual block) from the free virtual block list 72B. Therefore, the controller 4 can allocate, for the host 2, a virtual block of high reliability as the write target virtual block. In step S21, the controller 4 may select a virtual block having a minimum erase count from the free virtual block list 72B, and may allocate, for the host 2, the virtual block having the minimum erase count as the write target virtual block.

The controller 4 simultaneously erases a plurality of blocks included in the allocated virtual block, and updates the erase count of the allocated virtual block (step S22). In the step S22, controller 4 performs erase operations on all blocks included in the allocated virtual block to erase the data of the allocated virtual block. The controller 4 notifies the host 2 of the virtual block address of the allocated virtual block (step S23). The host 2 may be notified of the virtual block address as a return value included in a command completion response to the block allocate and erase command.

Write Command

FIG. 29 shows a write command for the physical NAND access management API 21, applied to the SSD 3.

The write command includes the following input parameters:
(1) Block address, or block address and page address: This input parameter value(s) represents a physical address that designates a location in the NAND memory 5, to which data is to be written. If only the block address is designated, a write target page is updated automatically by the SSD 3.
(2) NSID (optional): If the block address is not designated, NSID is designated. If NSID is designated, the block address and the page address are automatically issued by the SSD 3. Data is written to a block lastly allocated for the NSID (namely, a current write target block).
(3) Processing priority: The processing priority indicates the priority of this write command.
(4) Starting address of write data: The starting address of write data indicates a starting address on an output buffer (a memory of the host) that stores the write data.
(5) Number of write pages: The number of write pages indicates the number of pages to which data is to be written, namely, the above-mentioned "specific number of pages." When the number of pages in a block, to which data has been written, has reached the number of write pages ("specific number of pages"), the host 2 is notified of this fact.
(6) NAND mode (optional): The NAND mode includes SLC, MLC, TLC, etc.

The write command includes the following output parameters:
(1) Exit status: An exit status indicating success or failure (error) of the write command is returned to the host 2.
(2) Block address and page address: The block address and the page address represent a location in the NAND memory 5, to which data has been written. When the write command includes only the block address, or only NSID, the host 2 can detect the location in the NAND memory 5 to which data has been written, based on its return value.

(3) Number of write pages: This value indicates the number of pages to which data has been written.

(4) Wrong write order warning: When an wrong write order has been detected, a warning or error is returned to the host 2 to notify the host 2 of write order violation.

(5) Readable latest page address: The page address of a latest readable page that holds readable data is returned to the host 2. As a result, the host 2 can detect up to which page in the block data can be read.

FIG. 30 shows a write command for the virtual NAND access management API 22, applied to the SSD 3.

This write command includes the following input parameters:

(1) Virtual block address, or virtual block address and page address: This is a physical address that designates a location in the NAND memory 5, to which data is to be written. This physical address may be expressed by the virtual block address, a block number in the virtual block, and the page address. If only the virtual block address is designated, the block number in the virtual block and the page address may be updated automatically by the SSD 3.

(2) NSID (optional): If the virtual block address is not designated, NSID is designated. If NSID is designated, the virtual block address, the block number in the virtual block and the page address are automatically issued by the SSD 3. Data is written to the virtual block allocated for the NSID.

(3) Processing priority: The processing priority indicates the priority of the write command.

(4) Starting address of write data: The starting address of write data indicates a starting address on an output buffer (a memory of the host) that stores the write data.

(5) Number of write pages: The number of write pages indicates the number of pages to which data is to be written, namely, the above-mentioned "specific number of pages." When the number of pages in a block, to which data has been written, has reached the number of write pages, the host 2 is notified of this fact.

(6) NAND mode (optional): The NAND mode includes SLC, MLC, TLC, etc.

The write command includes the following output parameters:

(1) Exit status: An exit status indicating success or failure (error) of the write command is returned to the host 2.

(2) Virtual block address and page address: These values organize a physical address that designates a location in the NAND memory 5, to which data has been written. The physical address may be expressed by the virtual block address, a block number in the virtual block, and a page address. If the write command includes only the virtual block address, or only NSID, the host 2 can detect the location in the NAND memory 5 to which data has been written, based on its return value.

(3) Number of write pages: This value indicates the number of pages to which data has been written.

(4) Wrong write order warning: When an wrong write order has been detected, a warning or error is returned to the host 2 to notify the host 2 of write order violation.

(5) Readable latest page address: The page address of a latest readable page that holds readable data is returned to the host 2. As a result, the host 2 can detect up to which page in an access target block of the virtual block data can be read.

Figure 31:
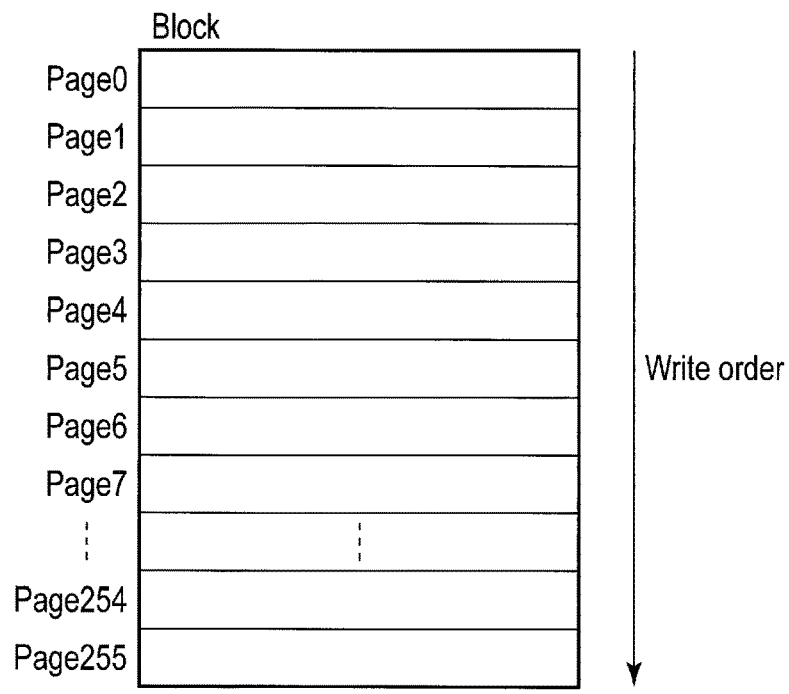
FIG. 31 illustrates the constraint associated with the order of data write to a large number of pages in a block.

Write (program) order constraint FIG. 31 shows a constraint associated with the order of writing data to a large number of pages in a block.

Assume here a case where one block includes pages 0 to 255. In each block, an arbitrary number of pages therein can be read in an arbitrary order. In contrast, in each block, it is necessary to sequentially write data in the order of pages 0, 1, 2, 3, . . . , 254 and 255. Therefore, the "wrong write order warning" function can assist the host 2 to directly use the address designation mode, i.e., to control a block address and a page address to which data is to be written.

Constraint Associated with the Time of Reading Data from Page

There is a NAND memory in which data cannot be read from a certain page immediately after it is written thereto, and becomes to be able to be read therefrom after data is written to one or more pages subsequent to the certain page.

Figure 32:
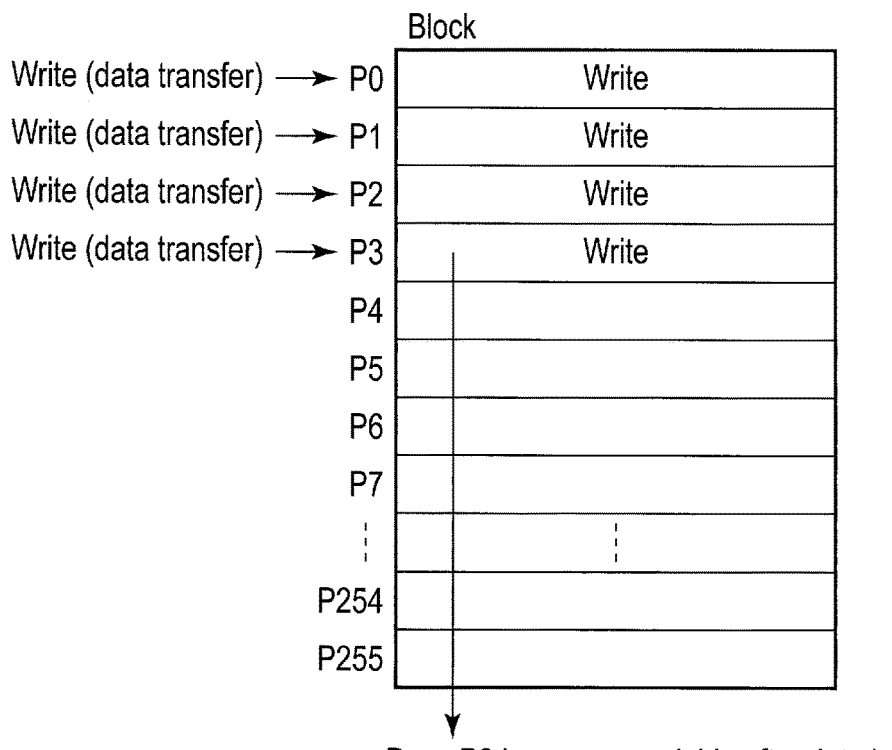
FIG. 32 illustrates the constraint associated with the time of data read from a page.

FIG. 32 shows a constraint associated with the time of reading data from a page.

FIG. 32 shows an example case where page P0 assumes a state in which data can be read therefrom, after data is written to pages P0 to P3. Thus, even if data has been written to a certain page (for example, page P0), it may not be correctly read therefrom until writing of data to some pages (for example, pages P1 to P3) subsequent to the certain page is completed.

The above constraint associated with the time of reading data from a page is caused by a program operation executed in the NAND memory.

That is, in the NAND memory, the cells are very finely fabricated, and hence a program disturb may occur in which when data has been written to a cell, the threshold voltage level of cells adjacent to the first-mentioned cell varies. In view of this, in the NAND memory, a program operation, which collects threshold voltage level of each cell in one or more previous pages by writing data to each cell in the next page, may be performed. If data is read from a page where correction is uncompleted, erroneous data different from actual data will be read. The time of completion of correction differs depending upon the type of the NAND memory used.

The controller 4 can notify the host 2 of the time of completion of correction. In other words, the controller 4 can notify the host 2 of the last page of a block, in which written data is readable.

More specifically, the controller 4 performs the following processing:

The controller 4 receives, from the host 2, a write command including a block address designating a certain specific block, and a page address designating a write target page in this specific block. The controller 4 writes data to the write target page in the specific block in accordance with the write command. Subsequently, the controller 4 notifies the host 2 of a page address indicating the latest readable page of the specific block that has become a readable state by a data write to the write target page of the specific block (namely, a page that has become readable lastly among the pages of the specific block).

The host 2 may update, in accordance with this notice, the readable-page address management information in the host 2, which indicates the pages from which written data is readable. After receiving a notice that indicates that the data of a certain page is readable, the host 2 may release a memory area (write buffer) of the host 2 that holds the data of this page. In other words, first, the host 2 temporarily stores, in a memory thereof, data to be written to the NAND memory 5 of the SSD 3, and transmits, to the SSD 3, a write command for writing the to-be-written data. After that, the host 2 holds this data in the memory thereof until this data can be read from the nonvolatile memory 5.

Figure 33:
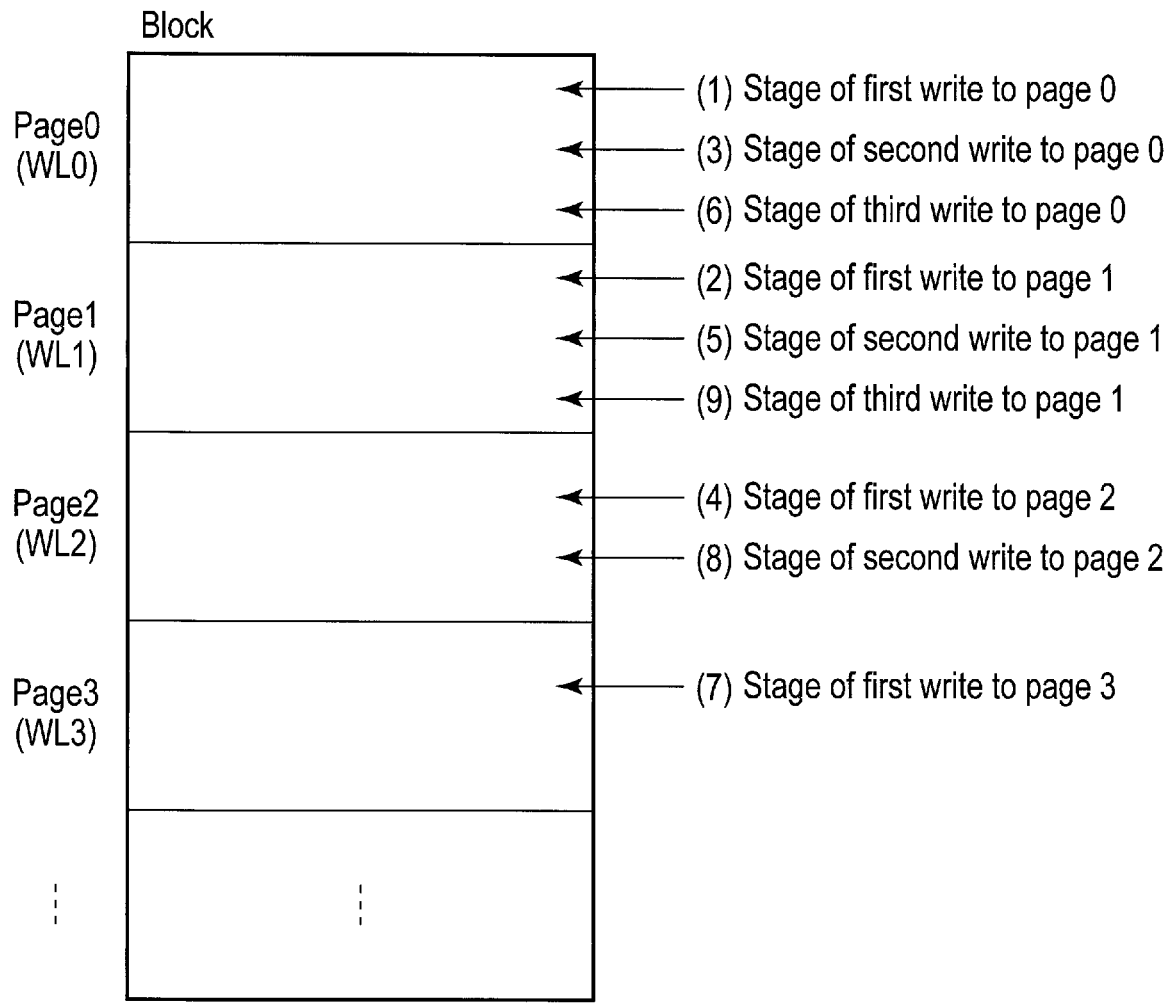
FIG. 33 illustrates an example of a program operation that includes a plurality of write stages and is executed by a NAND memory incorporated in the storage system of the embodiment.

Moreover, in order to reduce the influence of the program disturb, the NAND memory may also execute a program operation in accordance with a program procedure as shown in FIG. 33. In FIG. 33, a program operation for writing data to each page includes two or more write stages. At least a last write stage included in the write stages associated with each page is executed after one or more write stages associated with subsequent one or more pages are completed. Also in this case, even if a write to a certain specific page (for example, page P0) is completed by transferring, to the NAND memory, data to be written to the specific page, data may not be correctly read from the specific page until writes to one or more other pages are completed by transferring, to the NAND memory, data to be written to the one or more other pages.

In TLC writing in which 3-bit data is written per cell, a program operation may be performed in accordance with the following program procedure:
  (1) First write stage to page 0 (writing of lower page data to page 0)
  (2) First write stage to page 1 (writing of lower page data to page 1)
  (3) Second write state to page 0 (writing of middle page data to page 0)
  (4) Second write stage to page 2 (writing of lower page data to page 2)
  (5) Second write stage to page 1 (writing of middle page data to page 1)
  (6) Third write state to page 0 (writing of upper page data to page 0)
  (7) First write stage to page 3 (writing of lower page data to page 3)
  (8) Second write stage to page 2 (writing of middle page data to page 2)
  (9) Third write state to page 1 (writing of upper page data to page 1)

The available program procedure is not limited to the above, but various program procedures can be used for different NAND memories.

Procedure of Write Processing

The flowchart of FIG. 34 shows a procedure of data write processing performed by the SSD 3.

Upon receiving a block allocate and erase command, the controller 4 of the SSD 3 allocates a write target block to the host 2, and sets a write target page to an initial value (page 0) (step S31). If the controller 4 has received a write command from the host 2 (YES in step S32), the controller 4 determines whether the received write command is a write command of the direct address designation mode including a page address (step S33).

If the received write command is a write command of the direct address designation mode (YES in step S33), the controller 4 determines whether the page address designated by this write command coincides with the current write target page (in this case, page 0) (step S34).

If the page address designated by the write command does not coincide with the current write target page (NO in step S34), the controller 4 determines that an wrong write order has occurred, and notifies the host 2 of a command completion response including warning of the wrong write order (step S35). In step S35, the controller 4 notifies the host 2 of a command completion response including the warning of the wrong write order, without writing data to the page address designated by the write command.

In contrast, if the page address designated by the write command coincides with the current write target page (YES in step S34), the controller 4 transfers data designated by the write command to the NAND memory 5, and writes it to the write target page designated by the page address of the write command (step S36). The controller 4 updates the write target page based on the constraint associated with the write order of sequentially writing data from the initial page to the last page (in this case, the write target page is updates from page 0 to page 1) (step S37).

If the received write command is not a write command of the direct address designation mode (NO in step S33), the controller 4 automatically issues the page address (in this case, page 0) of the current write target page, transfers the data designated by the write command to the NAND memory 5, and writes the data to the current write target page in the write target block (step S38). The controller 4 updates the write target page based on the constraint associated with the above-mentioned write order (in this case, updates the same from page 0 to page 1) (step S39).

After step S37 or S39, the controller 4 determines the page address of a latest readable page that holds readable data (step S40).

Subsequently, the controller 4 determines whether data has been written up to the last page of the write target block by the current writing, and whether the number of pages, to which data has been written, has reached the number of pages to which the data should be written (i.e., the above-mentioned "specific number of pages") (steps S41 and S42).

After that, the controller 4 creates return values and transmits, to the host 2, a command completion response including the return values.

Figure 35:
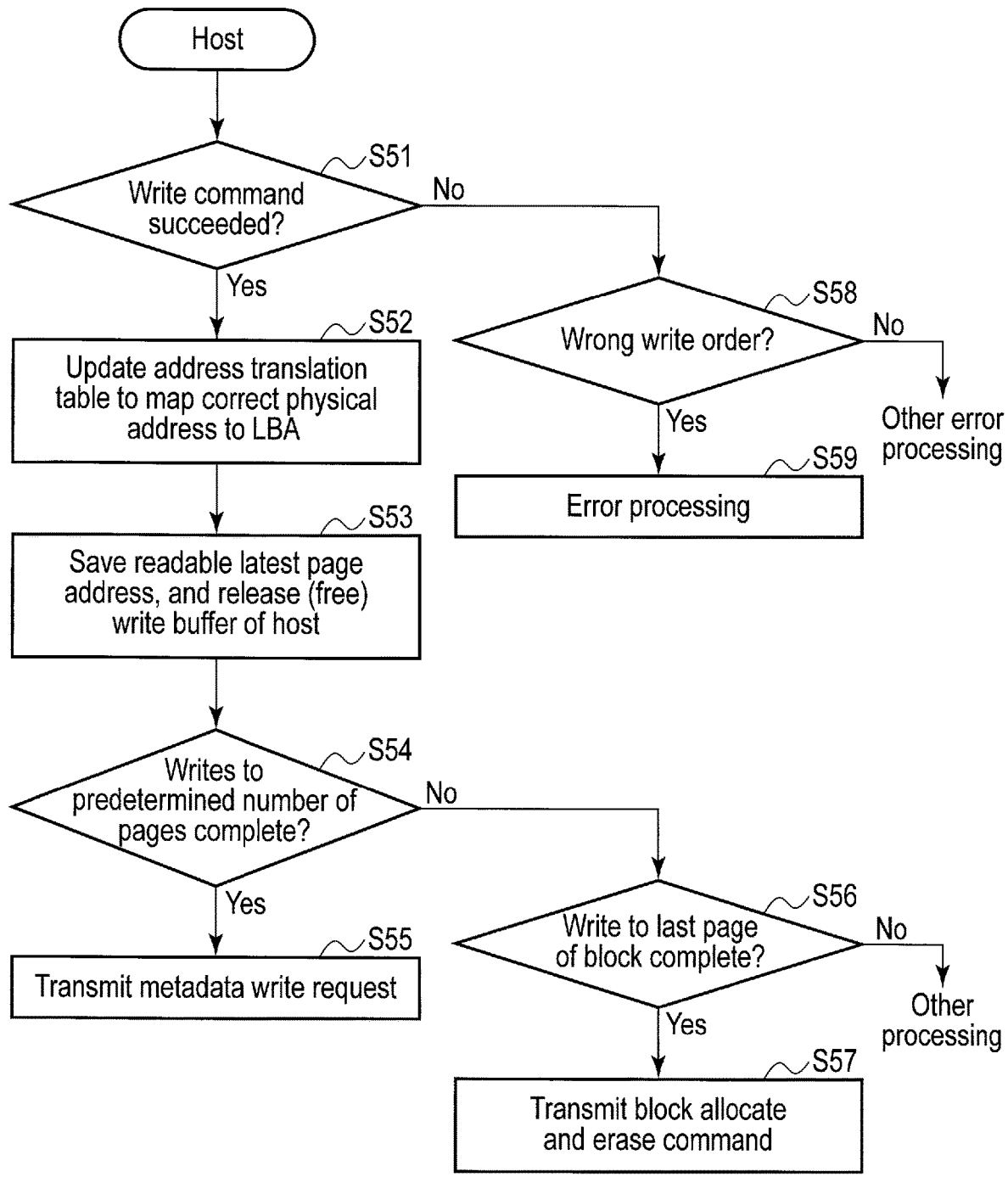
FIG. 35 is a flowchart illustrating a procedure of processing executed by the host upon receiving a response indicating completion of a write command.

If data has been written up to the last page of the write target block (YES in step S41), the controller 4 transmits, to the host 2, a command completion response including a exit status value and the return values (step S43). The return values include the following values:
  (1) Physical address that indicates a location in the NAND memory 5, in which data has been written (this physical address may include a block address and a page address, or may include a virtual block address and a page address)
  (2) Readable latest page address
  (3) Status value indicating completion of data writes to all pages in a block If the number of pages, to which data has been written, has reached "the number of pages to which data should be written" (i.e., the above-mentioned "specific number of pages") (YES in step S42), the controller 4 transmits, to the host 2, a command completion response including a exit status value and return values (step S44). The return values include the following values:
  (1) Physical address indicating a location in the NAND memory 5, in which data has been written (this physical address may include a block address and a page address, or may include a virtual block address and a page address)
  (2) Readable latest page address
  (3) Status value indicating completion of data writes to a specific number of pages The flowchart of FIG. 35 shows a procedure of processing executed by the host 2 upon receiving a command completion response to a write command.

Upon receiving, from the SSD 3, a command completion response to a write command, the host 2 determines whether the processing of the write command has succeeded (step S51).

If the processing of the write command has succeeded (YES in step S51), the host 2 updates the address translation table (i.e., the look-up table LUT 45), using a block address and a page address included in the command completion response, thereby mapping a correct physical address to an LBA corresponding to the data written by the write command (step S52). After that, the host 2 updates the above-mentioned readable-page address management information, based on the readable latest page address, and releases (frees up) a memory area of the host 2 storing the data that has been written to the readable latest page (step S53).

That is, the data written in accordance with the write command is maintained in the memory area (write buffer) of the host 2 until it becomes able to be read from the SSD 3. After the data written in accordance with the write command can be read from the SSD 3, the access destination of a read demand to this data is switched from the write buffer to the SSD 3.

After that, the host 2 determines whether writes to a specific number of pages have completed, and whether writes up to the last page of a block have completed (step S54, S56).

If the writes to the specific number of pages have completed (YES in step S54), the host 2 transmits, to the SSD 3, a write command to write management information, such as metadata (step S55). As a result, management information, such as metadata, can be written to, for example, the last page of each block.

If writes up to the last page of the block have completed (YES in step S56), the host 2 transmits a block allocate and erase command to the SSD 3 (step S57).

If the processing of the write command has failed (NO in step S51), the host 2 determines whether this failure is caused by a wrong write order (step S58).

If it is caused by the wrong write order (YES in step S58), the host 2 executes error processing including processing for specifying the cause of the wrong write order (step S59).

Figure 36:
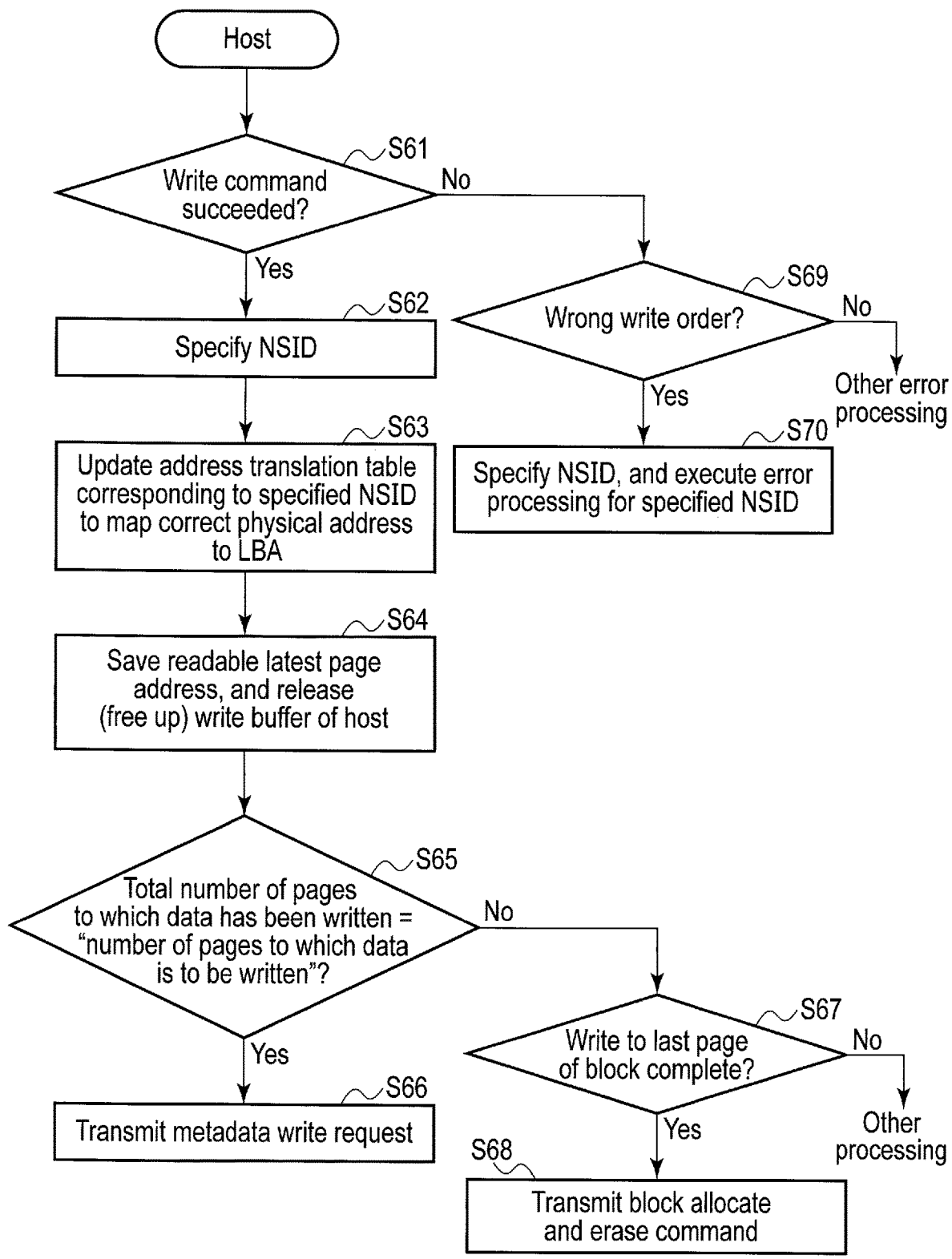
FIG. 36 is a flowchart illustrating a procedure of processing executed by the host upon receiving a response indicating completion of a write command including a namespace identifier (NSID).

The flowchart of FIG. 36 shows a procedure of processing executed by the host 2 upon receiving a command completion response to a write command including NSID.

Upon receiving, from the SSD 3, a command completion response to a write command, the host 2 determines whether the processing of the write command has succeeded (step S61).

If the processing of the write command has succeeded (YES in step S61), the host 2 specifies NSID associated with data written in accordance with this write command (step S62). The command completion response may include the same NSID as NSID in the write command.

The host 2 updates an address translation table (namely, the look-up table LUT 45) corresponding to the specified NSID, using a block address and a page address included in the command completion response, thereby mapping a correct physical address to an LBA corresponding to data written by this processing (step S63). Thereafter, the host 2 updates the above-mentioned readable page address management information by storing a readable latest page address into the readable page address management information, and releases a memory area (write buffer) of the host 2 that holds the data written to a readable latest page indicated by the readable latest page address (step S64).

After that, the host 2 determines whether writes to a specific number of pages have completed, and whether writes up to the last page of a block have completed (step S65, S67).

If the writes to the specific number of pages have completed (YES in step S65), the host 2 transmits, to the SSD 3, a write command to write management information, such as metadata (step S66).

If writes up to the last page of the block have completed (YES in step S67), the host 2 transmits a block allocate and erase command to the SSD 3 (step S68).

If the processing of the write command has failed (NO in step S61), the host 2 determines whether this failure is caused by a wrong write order (step S69).

If it is caused by the wrong write order (YES in step S69), the host 2 executes processing of specifying NSID associated with data to be written in accordance with the write command, and error processing including processing for specifying the cause of the wrong write order (step S70).

Read Command

FIG. 37 shows a read command for the physical NAND access management API 21, applied to the SSD 3.

The read command includes the following input parameters:

(1) Block address and page address: These addresses are used as a physical address that designates a location in the NAND memory 5, from which data is to be read.

(2) Processing priority: The processing priority indicates the priority of this read command.

(3) Read data destination address: The read data destination address indicates a location in an input buffer (a memory of the host) to which read data should be transferred.

(4) Number of read pages: The number of read pages indicates the number of pages that should be read.

(5) Acceptable latency: The acceptable latency designates smallest latency, normal latency or longer latency.

The read command includes the following output parameters:

(1) Exit status: An exit status indicating the success or failure (error) of the read command is returned to the host 2.

(2) Block address and page address: The block address and the page address represent a location in the NAND memory 5, from which data has been read.

(3) Number of pages: This value indicates the number of pages from which data has been read.

(4) Starting address: This indicates the starting address of read data.

FIG. 38 shows a read command for the virtual NAND access management API 22, applied to the SSD 3.

This read command includes the following input parameters:

(1) Virtual block address and page address: These addresses are used as a physical address that designates a location in the NAND memory 5, from which data is to be read.

(2) Processing priority: The processing priority indicates the priority of this read command.

(3) Read data destination address: The read data destination address indicates a location in an input buffer (a memory of the host) to which read data should be transferred.

(4) Number of read pages: The number of read pages indicates the number of pages that should be read.

(5) Acceptable latency: The acceptable latency designates smallest latency, normal latency or longer latency.

The read command includes the following output parameters:

(1) Exit status: An exit status indicating the success or failure (error) of the read command is returned to the host 2.
(2) Virtual block address and page address: The virtual block address and the page address represent a location in the NAND memory 5, from which data has been read.
(3) Number of pages: This value indicates the number of pages from which data has been read.
(4) Starting address: This indicates the starting address of read data.

Procedure of Read Processing

With reference to FIGS. 39 and 40, the procedure of data read processing performed by the SSD 3 and the host 2 will be described.

As shown in FIG. 39, the host 2 translates the LBA of data to be read into a physical address of the NAND memory 5 with reference to an address translation table (namely, the look-up table LUT 45) (step S71). Subsequently, the host 2 transmits a read command including this physical address to the SSD 3.

The controller 4 of the SSD 3 reads data from a page of a block designated by the physical address (step S72). In step S72, the controller 4 performs processing shown in FIG. 40.

That is, as shown in FIG. 40, the controller 4 performs a read operation of reading data from a physical location (a certain page in a certain block) designated by the physical address, and an error correction operation on the read data (step S81). After that, the controller 4 determines whether the read data includes an error that cannot be corrected by ECC (step S82). If a page that is in non-readable state is read, the read data includes a large number of errors that cannot be corrected by ECC.

If the read data does not include an error that cannot be corrected (NO in step S82), the controller 4 transmits this read data to the host 2, and also transmits, to the host 2, a command completion response indicating a success (step S83).

In contrast, if the read data includes an error that cannot be corrected (YES in step S82), the controller 4 transmits, to the host 2, a command completion response indicating a failure (error) (step S84).

Data Copying

Figure 41:
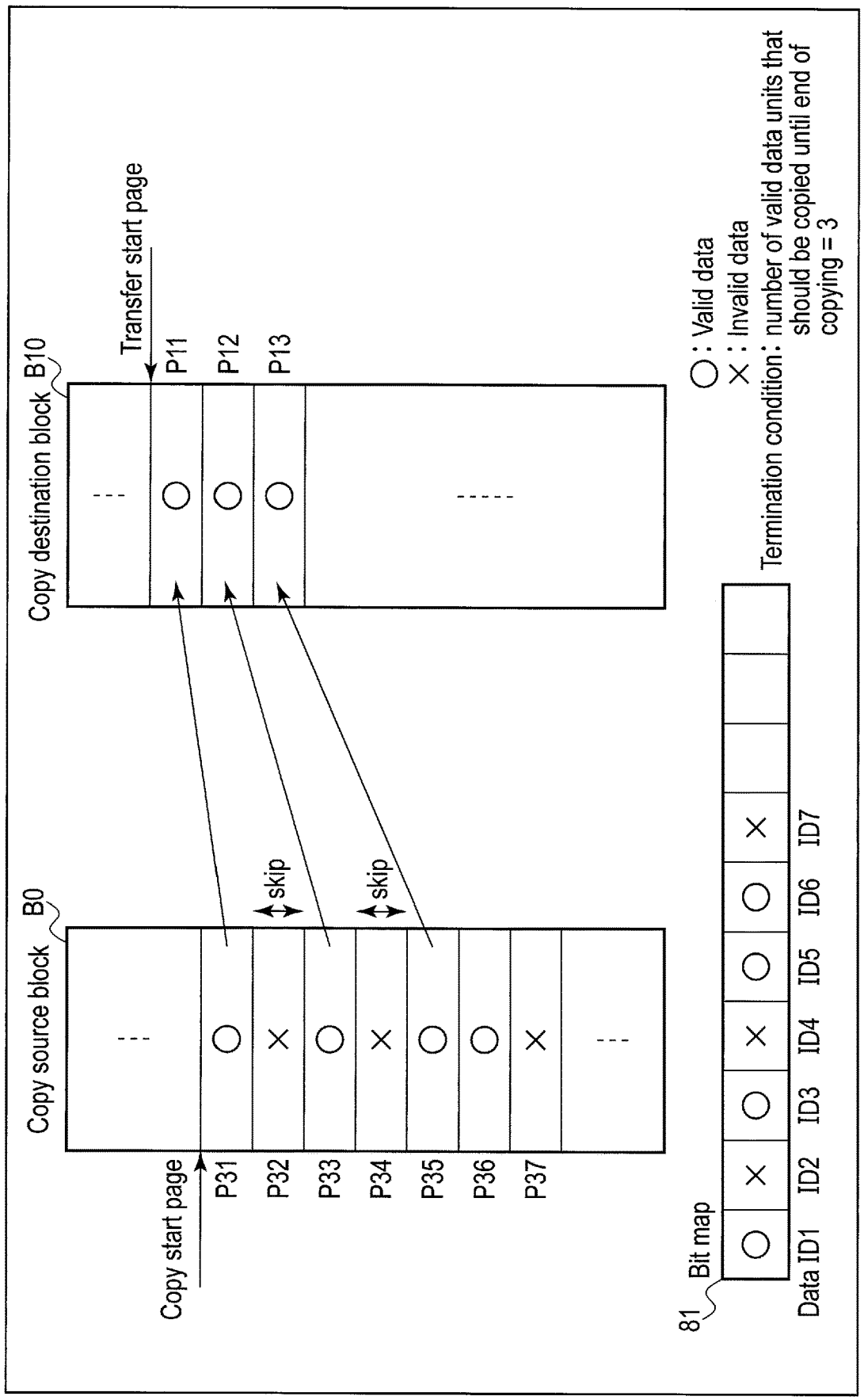
FIG. 41 illustrates an example of a data copy operation executed by the storage system of the embodiment when the number of valid data units to be copied is designated as termination condition.

FIG. 41 shows a data copy operation example performed by the SSD 3.

The controller 4 of the SSD 3 does not copy all data in a copy source block to a copy destination block, but skips invalid data in a designated page range in the copy source block, thereby copying only valid data in this page range to a designated page range in the copy destination block. This data copy operation is performed for the purpose of the above-mentioned garbage collection.

In the data copy operation, the controller 4 automatically skips copying of an invalid page that does not include valid data, as described above. This enables the host 2 to copy only valid pages to a copy destination block, without designating each page to be copied.

Moreover, the copy command enables the host 2 to designate not only the copy source block and the copy destination block, but also a copy start page in the copy source block and a transfer start page in the copy destination block. As a result, the host can perform a fine copy operation in which specific pages in the copy source block are copied to specific pages in the copy destination block. A plurality of copy source blocks may be designated.

Further, the host 2 may designate, as a termination condition for data copying, whichever of "the number of valid data units to be copied until the end of the copy operation" and "the number of invalid data units to be detected until the end of the copy operation."

If "the number of valid data units to be copied until the end of the copy operation" is designated as the termination condition for the data copy operation, the data copy operation is continued until a desired number of valid data units are copied to the copy destination block. When the desired number of valid data units have been copied to the copy destination block, the data copy operation is complete. For instance, if the number of data units corresponding to one block is designated as "the number of valid data units to be copied until the end of the copy operation," the copy destination block can be filled with the valid data units copied from some copy source blocks, and these copy source blocks can be made free blocks including only invalid data. It is not always necessary to increase the number of free blocks by 1 whenever a data copy operation is performed. Multiple number of times of data copy operation may be performed to increase the number of free blocks by 1. Thus, "the number of valid data units to be copied until the end of the copy operation" may be set to any arbitrary value.

If "the number of invalid data units to be detected until the end of the copy operation" is designated as the termination condition for the data copy operation, the data copy operation is continued until the number of skippings of the copying of invalid data reaches a desired number. When the number of skippings of the copying of invalid data has reached the desired number, the data copy operation is complete. Normally, some selected copy source blocks are blocks in which valid data and invalid data are mixed. Further, the total of invalid data units included in the selected copy source blocks is at least the number of data units corresponding to one block. Accordingly, if, for example, the number of data units corresponding to one block is selected as "the number of invalid data units to be detected until the end of the copy operation," at least one copy source block can be made to be a free block including only invalid data, until the copy operation is completed. Since, as described above, a certain number of data copy operations may be performed to increase the number of free blocks by 1, "the number of invalid data units to be detected until the end of the copy operation" also may be set to an arbitrary value.

In FIG. 41, for simplifying the description, it is assumed that a data copy command from the host 2 designates the following parameters:

(1) Copy source block=block B0
(2) Copy start page=P31
(3) Copy destination block=block B10
(4) Transfer start page=P11
(5) Valid/invalid bit map=bit map data 81
(6) Number of valid data units to be copied until end of copying=3

The bit map data 81 indicates validity/invalidity of the data of each page in a copying target range. The controller 4 first determines validity/invalidity of the data of copy start page P31 of copy source block B0. In the case of FIG. 41, the data of page P31 is valid. Accordingly, the controller 4 reads data from page P31, and copies the read data to transfer start page P11 of copy destination block B10. At this time, the number of valid data units copied to copy destination block B10 becomes 1.

The controller 4 determines validity/invalidity of the data of page P32 of copy source block B0. In the case of FIG. 41, the data of page P32 is invalid. Accordingly, the controller 4 skips copying of data from page P32. The number of valid data units copied to copy destination block B10 is kept at 1.

The controller 4 determines validity/invalidity of the data of page P33 of copy source block B0. In the case of FIG. 41, the data of page P33 is valid. Accordingly, the controller 4 reads data from page P33, and copies the read data to page P12 of copy destination block B10. The number of valid data units copied to copy destination block B10 becomes 2.

The controller 4 determines validity/invalidity of the data of page P34 of copy source block B0. In the case of FIG. 41, the data of page P34 is invalid. Accordingly, the controller 4 skips copying of data from page P34. The number of valid data units copied to copy destination block B10 is kept at 2.

The controller 4 determines validity/invalidity of the data of page P35 of copy source block B0. In the case of FIG. 41, the data of page P35 is valid. Accordingly, the controller 4 reads data from page P35, and copies the read data to page P13 of copy destination block B10. The number of valid data units copied to copy destination block B10 becomes 3. Since the number of valid data units copied to copy destination block B10 has reached the termination condition (the number of valid data units to be copied until the end of copying), the copy operation is completed.

In FIG. 42, it is assumed that a data copy command from the host 2 designates the following parameters:
(1) Copy source block=block B0
(2) Copy start page=P31
(3) Copy destination block=block B10
(4) Transfer start page=P11
(5) Valid/invalid bit map=bit map data 81
(6) Number of valid data units to be copied until end of copying=3

The controller 4 first determines validity/invalidity of the data of copy start page P31 of copy source block B0. In the case of FIG. 42, the data of page P31 is valid. Accordingly, the controller 4 reads data from page P31, and copies the read data to transfer start page P11 of copy destination block B10.

The controller 4 determines validity/invalidity of the data of page P32 of copy source block B0. In the case of FIG. 42, the data of page P32 is invalid. Accordingly, the controller 4 skips copying of data from page P32. At this time, the number of detected invalid data units (namely, the number of skippings of the copying of data) becomes 1.

The controller 4 determines validity/invalidity of the data of page P33 of copy source block B0. In the case of FIG. 42, the data of page P33 is valid. Accordingly, the controller 4 reads data from page P33 and copies the read data to page P12 of copy destination block B10. The number of detected invalid data units is kept at 1.

The controller 4 determines validity/invalidity of the data of page P34 of copy source block B0. In the case of FIG. 42, the data of page P34 is invalid. Accordingly, the controller 4 skips copying of data from page P34. The number of detected invalid data units becomes 2.

The controller 4 determines validity/invalidity of the data of page P35 of copy source block B0. In the case of FIG. 42, the data of page P33 is valid. Accordingly, the controller 4 reads data from page P35 and copies the read data to page P13 of copy destination block B10. The number of detected invalid data units is kept at 2.

The controller 4 determines validity/invalidity of the data of page P36 of copy source block B0. In the case of FIG. 42, the data of page P36 is valid. Accordingly, the controller 4 reads data from page P36 and copies the read data to page P14 of copy destination block B10. The number of detected invalid data units is kept at 2.

The controller 4 determines validity/invalidity of the data of page P37 of copy source block B0. In the case of FIG. 42, the data of page P37 is invalid. Accordingly, the controller 4 skips copying of data from page P37. The number of detected invalid data units becomes 3. Since at this time, the number of detected invalid data units has reached the termination condition (the number of invalid data units to be detected until the end of copying), the copy operation is completed.

FIG. 43 shows a data copy operation example performed when a plurality of copy source blocks are designated, and the number of valid data units to be copied is designated as a termination condition.

In FIG. 43, for simplifying the illustration, it is assumed that the number of pages included in one block is 3, and the number of valid data units to be copied until the end of copying is 3. Bit map data units 81A and 81B indicate valid/invalid bit maps corresponding to blocks B11 and B20, respectively.

Blocks B11 and B20 are copy source blocks designated by a copy command from the host 2, and block B30 is a copy destination block designated by the copy command.

First, the controller 4 determines validity/invalidity of the data of copy start page P0 of copy source block B11. In the case of FIG. 43, the data of page P0 is valid. Accordingly, the controller 4 reads data from page P0, and copies the read data to transfer start page P0 of copy destination block B30. At this time, the number of valid data units copied to copy destination block B30 becomes 1.

The controller 4 determines validity/invalidity of the data of page P1 of copy source block B11. In the case of FIG. 43, the data of page P1 is valid. Accordingly, the controller 4 reads data from page P1, and copies the read data to page P1 of copy destination block B30. The number of valid data units copied to copy destination block B30 becomes 2.

The controller 4 determines validity/invalidity of the data of page P2 of copy source block B11. In the case of FIG. 43, the data of page P2 is invalid. Accordingly, the controller 4 skips copying of data from page P2. The number of valid data units copied to copy destination block B30 is kept at 2.

The controller 4 determines validity/invalidity of the data of page P0 of subsequent copy source block B20. In the case of FIG. 43, the data of page P0 of copy source block B20 is valid. Accordingly, the controller 4 reads data from page P0 of copy source block B20, and copies the read data to page P2 of copy destination block B30. The number of valid data units copied to copy destination block B30 becomes 3. Since at this time, the number of valid data units copied to copy destination block B30 has reached the termination condition (the number of valid data units to be copied until the end of copying), the copy operation is completed.

The controller 4 notifies the host 2 of data copy information as a command completion response to the copy command. The data copy information is indicate of identifiers (valid data IDs) of valid data units that have copied to the copy destination block, and locations in the copy destination block, where the valid data units have copied. Based on the data copy information, the host 2 updates the address translation table (LUT 45), and maps the LBAs of the copied data units to correct physical addresses. The data of page P0 of block B11 and the data of page P1 of block B11 are invalidated. As a result, block B11 becomes a free block that includes no valid data. Similarly, the data of page P0 of block B20 is invalidated.

Further, the controller 4 determines page P1 of copy source block B20 as a subsequent copy start page, and notifies the host 2 of the physical address (the block address of copy source block B20 and the page address of page P1) of the subsequent copy start page.

Yet further, the controller 4 determines a page address (latest page address) indicating a latest readable page holding readable data, which is included in the pages of the copy destination block to which valid data has been copied by the data copy operation. Subsequently, the controller 4 notifies the host 2 of the determined latest page address. This enables the host 2 to recognize the readable last page of copy destination block B30.

FIG. 44 shows a data copy operation example performed when a plurality of copy source blocks are designated, and the number of invalid data units to be detected is designated as the termination condition.

In FIG. 44, for simplifying the illustration, it is assumed that the number of pages included in one block is 3, and the number of invalid data units to be detected until the end of copying is 3. Bit map data units 81A, 81B and 81C indicate valid/invalid bit maps corresponding to blocks B11, B20 and B25, respectively.

Blocks B11, B20 and B25 are copy source blocks designated by a copy command from the host 2, and blocks B30 and B31 are copy destination blocks designated by the copy command.

First, the controller 4 determines validity/invalidity of the data of copy start page P0 of copy source block B11. In the case of FIG. 44, the data of page P0 is valid. Accordingly, the controller 4 reads data from page P0, and copies the read data to transfer start page P0 of copy destination block B30.

The controller 4 determines validity/invalidity of the data of page P1 of copy source block B11. In the case of FIG. 44, the data of page P1 is valid. Accordingly, the controller 4 reads data from page P1, and copies the read data to page P1 of copy destination block B30.

The controller 4 determines validity/invalidity of the data of page P2 of copy source block B11. In the case of FIG. 44, the data of page P2 is invalid. Accordingly, the controller 4 skips copying of data from page P2. At this time, the number of detected invalid data units (namely, the number of data units whose copying has been skipped) becomes 1.

The controller 4 determines validity/invalidity of the data of page P0 of subsequent copy source block B20. In the case of FIG. 44, the data of page P0 of copy source block B20 is valid. Accordingly, the controller 4 reads data from page P0 of copy source block B20, and copies the read data to page P2 of copy destination block B30. Since at this time, the number of detected invalid data units has not yet reached the termination condition, the copy operation is continued.

The controller 4 determines validity/invalidity of the data of page P1 of copy source block B20. In the case of FIG. 44, the data of page P1 of copy source block B20 is invalid. Accordingly, the controller 4 skips copying of data from page P1 of copy source block B20. The number of detected invalid data units becomes 2.

The controller 4 determines validity/invalidity of the data of page P2 of copy source block B20. In the case of FIG. 44, the data of page P2 of copy source block B20 is valid. Accordingly, the controller 4 reads data from page P2 of copy source block B20, and copies the read data to page P0 of copy destination block B31.

The controller 4 determines validity/invalidity of the data of page P0 of subsequent copy source block B25. In the case of FIG. 44, the data of page P0 of copy source block B25 is invalid. Accordingly, the controller 4 skips copying of data from page P0 of copy source block B25. The number of detected invalid data units becomes 3. Since at this time, the number of detected invalid data units has reached the termination condition (the number of invalid data units to be detected until the end of copying), the copy operation is completed.

The controller 4 notifies the host 2 of data copy information as a command completion response to the copy command. The data copy information is indicative of the ID of each copied data unit and the copy destination location of each copied data unit. Based on the data copy information, the host 2 updates the address translation table (LUT 45), and maps the LBAs of the copied data units to correct physical addresses. The data of page P0 of block B11 and the data of page P1 of block B11 are invalidated. As a result, block B11 becomes a free block that includes no valid data. Similarly, the data of page P0 of block B20 and data of page P22 of block B20 are invalidated. As a result, block B20 becomes a free blocks including no valid data.

Further, the controller 4 determines page P1 of copy source block B25 as a subsequent copy start page, and notifies the host 2 of the physical address (the block address of copy source block B25 and the page address of page P1) of the subsequent copy start page.

Yet further, the controller 4 determines a latest page address indicating the latest readable page of copy destination block B30 that holds readable data, and a latest page address indicating the latest readable page of copy destination block B31 that holds readable data, and notifies the host 2 of these latest page addresses. As a result, the host 2 can recognize readable last pages included in the pages of the copy destination blocks.

Figure 45:
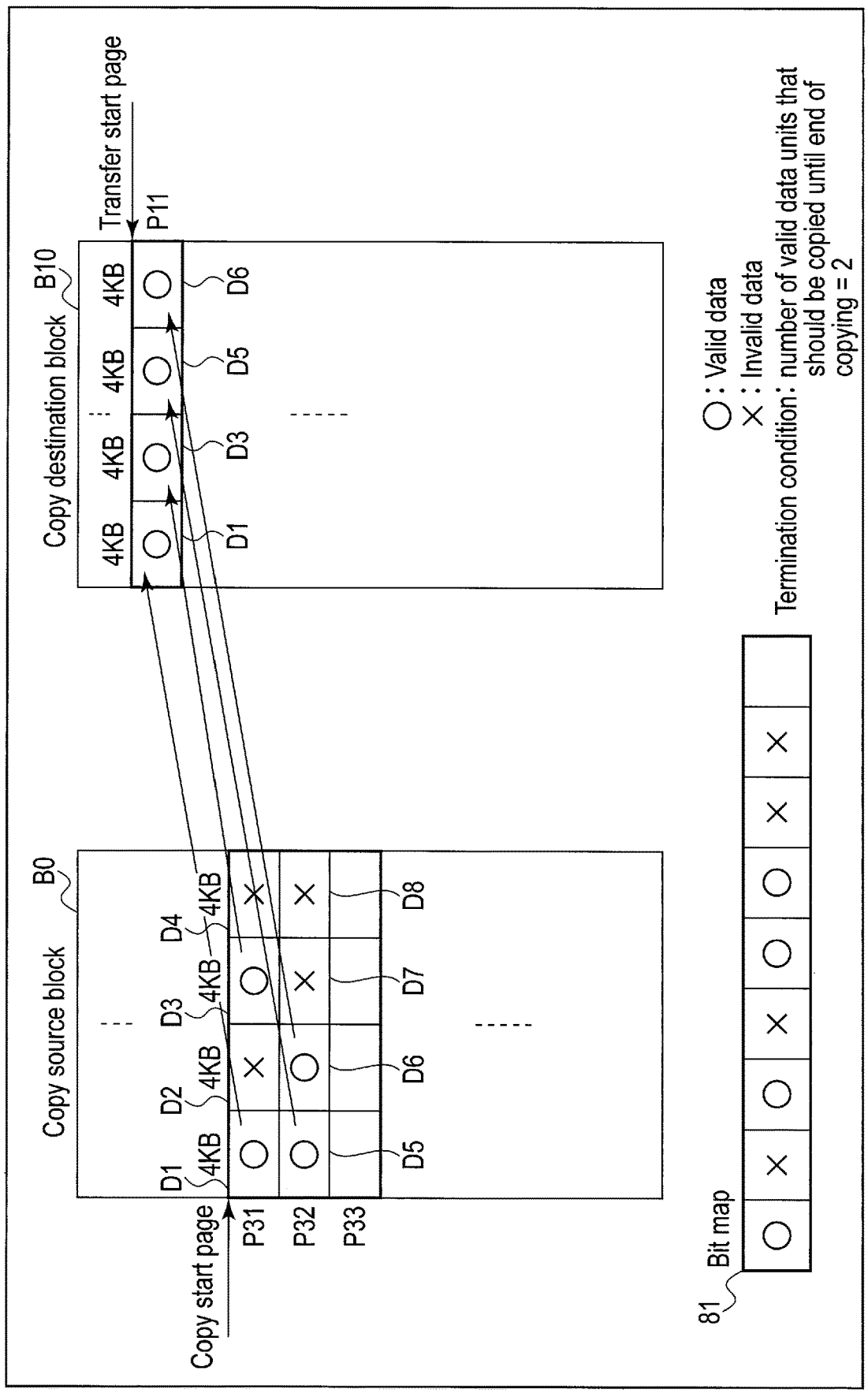
FIG. 45 illustrates an example of a data copy operation executed by the storage system of the embodiment when a data size is smaller than a page size and the number of valid data units to be copied is designated as termination condition.

FIG. 45 shows a data copy operation performed when the data size is smaller than the page size, and the number of valid data units to be copied is designated as a termination condition.

Assume here an example case where the page size is 16 Kbytes and the data size is 4 Kbytes. The data size corresponds to the above-mentioned management size for managing mapping between LBAs and respective physical addresses. Copy start page P31 of copy source block B0 stores data D1, data D2, data D3 and data D4 each having a data size of 4 Kbytes. Subsequent page P32 of copy source block B0 stores data D5, data D6, data D7 and data D8 each having a data size of 4 Kbytes. The bit map data 81 indicates validity/invalidity of each of data D1, data D2, data D3, data D4, data D5, data D6, data D7 and data D8.

As described above, if the data size is smaller than the page size, each page of copy source block B0 includes a plurality of data units each having its validity/invalidity indicated by the bit map data 81.

The controller 4 (1) reads data, in units of a page, from each page which contains one or more valid data units and is included in the copy source block B0, (2) extracts valid data units from the read data to thereby prepare a number of valid data units corresponding to the size of one page, and (3) writes, in units of a page, the prepared valid data units corresponding to the one page size to a copy destination area (beginning with a transfer start page) of copy destination block B10 to thereby copy them to the copy destination area, while skipping copying of invalid data. If the number of valid data units copied to the copy destination area is not less than the number of valid data to be copied until the end of copying, or if the number of invalid data units whose copying is skipped is not less than the number of invalid data units to be detected until the end of copying, the controller 4 finishes the data copy operation.

That is, regarding pages each including valid data, the controller 4 sequentially reads data from these pages page by page. After preparing valid data corresponding to one page (in this case, four valid data units), the controller 4 writes, in units of a page, the valid data corresponding to one page to the copy destination block. As a result, only valid data can be efficiently copied to the copy destination block, aligned to have a certain page size. If there is no more data in the copy source block before valid data corresponding to one page is prepared, the controller 4 performs an operation for padding the currently prepared valid data with dummy data, and writes the resultant one-page data to the copy destination block.

More specifically, the following copy operation is performed. In the description below, it is assumed for simplification of illustration that the number of valid data units to be copied until the end of copying is 2.

First, the controller 4 determines whether copy starting page P31 of copy source block B0 includes valid data. In the case of FIG. 45, page P31 includes valid data units D1 and D3. For this reason, the controller 4 reads data (D1 to D4) corresponding to one page from page P31. The read data may be temporarily stored in the copy buffer 32.

The number of the read valid data units is only two, i.e., D1 and D3, which means that four valid data units corresponding to one page are not yet prepared. Therefore, the controller 4 continues the processing of reading data from copy source block B0 page by page.

The controller 4 determines whether page P32 of copy source block B0 includes valid data. In the case of FIG. 45, page P32 includes valid data units D5 and D6. Accordingly, the controller 4 reads data (D5 to D8) corresponding to one page from page P32. The read data may be temporarily stored in the copy buffer 32.

The controller 4 extracts valid data units D1 and D3 from the data corresponding to one page and read from page P31, and extracts valid data units D5 and D6 from the data corresponding to one page and read from page P32, thereby generating valid data (D1, D3, D5 and D6) corresponding to one page. After that, the controller 4 copies the valid data (D1, D3, D5 and D6) corresponding to one page to transfer start page P11 of copy destination block B10. Thus, copies of invalid data units D2, D4, D7 and D8 are skipped, and only valid data units are copied to copy destination block B10 in units of a page. As described above, processing of preparing valid data corresponding one page size (i.e., processing of aligning a size of valid data a page size) is preferentially performed, and a determination associated with the termination condition is performed after the preparing of valid data corresponding one page size alignment of valid data in units of a page.

The number of valid data units copied to copy destination block B10 becomes 4. Since the number (=4) of valid data units copied to copy destination block B10 is not less than the number (in this case, 2) of valid data units designated by the termination condition, the copy operation is completed.

By virtue of the above-described copy operation, even if the size of each data unit is smaller than the page size, only valid data can be efficiently copied to a copy destination block in a state in which the size of the valid data is aligned with a page size.

The controller 4 notifies the host 2 of data copy information as a command completion response to the copy command. The data copy information is indicative of the ID of each copied data unit and the copy destination location of each copied data unit. The copy destination location may be expressed by a block address, a page address, and an offset in the corresponding page. The offset in the page corresponding to certain data of 4 Kbytes is in-page address that indicates an offset location in the page, which stores the 4 Kbyte data. Based on the data copy information, the host 2 updates the address translation table (LUT 45), and maps the LBAs of copied data units (in this case, D1, D3, D5, D6) to correct physical addresses. Data units D1 and D3 of page P31 of block B0, and data units D5 and D6 of page P32 of block B0 are invalidated.

Further, the controller 4 determines page P33 of copy source block B0 as a subsequent copy start page, and notifies the host 2 of the physical address (the block address of copy source block B0 and the page address of page P33) of the subsequent copy start page.

Furthermore, the controller 4 determines a latest page address indicating the latest readable page of copy destination block B10 that holds readable data, and notifies the host 2 of this latest page address.

FIG. 46 shows a data copy operation performed when the data size is smaller than the page size, and the number of invalid data units to be detected is designated by the termination condition. In the description below, it is assumed that the number of invalid data units to be detected until the end of copying is 2.

First, the controller 4 determines whether copy start page P31 of copy source block B0 includes valid data. In the case of FIG. 46, page P31 includes valid data units D1 and D3. Accordingly, the controller 4 reads data (D1 to D4) corresponding to one page from page P31. The read data may be temporarily stored in the copy buffer 32.

Since the number of valid data units included in the read data (D1 to D4) corresponding to one page is only two, i.e., D1 and D3, the controller 4 continues the processing of reading data from copy source block B0 page by page.

The controller 4 determines whether page P32 of copy source block B0 includes valid data. In the case of FIG. 46, page P32 includes valid data units D5 and D6. Accordingly, the controller 4 reads data (D5 to D8) corresponding to one page from page P32. The read data may be temporarily stored in the copy buffer 32.

The controller 4 extracts valid data units D1 and D3 from the data read from page P31 and corresponding to one page, extracts valid data units D5 and D6 from the data read from page P32 and corresponding to one page, thereby generating valid data (D1, D3, D5, D6) corresponding to one page. After that, the controller 4 copies the valid data (D1, D3, D5, D6) corresponding to one page to transfer start page P11 of copy destination block B10. As a result, copying of invalid data units D2, D4, D7 and D8 is skipped, and only the valid data is copied to copy destination block B10 in units of a page.

The number of the detected invalid data units, i.e., the number of the invalid data units whose copying has been skipped, becomes 4. Since the number (=4) of the detected invalid data units is greater than the number (in this case, 2) of invalid data units designated by the termination condition, the copy operation is completed.

Data Copy Command

FIG. 47 shows the input parameters of a data copy command applied to the SSD 3. The data copy command includes the following input parameters:

(1) Copy source block addresses (copy source block address list): The parameter value represents the block address of a copy source block. The block address of the copy source block may also be designated by a virtual block address and a block number in a corresponding virtual block. The copy source block address list includes the block addresses of a plurality of copy source blocks. That is, the host 2 can designate one or more copy source blocks.

(2) Copy start location in copy source block: This parameter value represents a start location (copy start page) in the copy source block to which data should be copied. When a plurality of copy source blocks are designated by the copy source block address list, only a copy start location in the first copy source block may be designated by the parameter value.

(3) Copy destination block address: The copy destination block address indicates the block address of a copy destination block. The block address of the copy destination block may also be designated by a virtual block address and a block number in a corresponding virtual block.

(4) Start location in copy destination block: The start location in the copy destination block indicates a start location (transfer start page) in the copy destination block to which data should be transferred.

(5) Valid/invalid bit map: The valid/invalid bit map is information (bit map data) that indicates arrangement of valid data and invalid data in each copy source block.

(6) Number of valid data units to be copied until end of copying: This parameter value designates the number of data units (for example, the number of pages) that should be transferred, i.e., copied to the copy destination block. This parameter value is used as a termination condition for the copy operation. In the data copy operation, only valid data is copied, while copying of invalid data is skipped.

(7) Number of invalid data units to be detected until end of copying: This parameter value may also be used as a termination condition for the copy operation. The host 2 can designate only one of the termination conditions (6) and (7) in one copy command.

(8) Size of data (data size)

In addition to the above, the data copy command may also include other input parameter values, such as processing priority.

FIG. 48 shows the output parameters of the data copy command. The data copy command includes the following output parameters:

(1) Number of invalid data units detected until end of copying (2) Total number of data units copied to copy destination block: This parameter value represents the total number of data units actually copied to the copy destination block. If the number of invalid data units to be detected until the end of copying is designated as a termination condition, the total number of data units actually copied to the copy destination block is indefinite. Accordingly, this parameter value is useful when the number of invalid data units to be detected until the end of copying is designated as the termination condition.

(3) Combination of identifier of data copied to copy destination block and copy destination location in copy destination block: These parameter values represent which valid data has been copied where in the copy destination block. These parameter values may represent identifiers of respective copied valid data units, and also represent locations in the copy destination block, where the respective valid data units are stored.

(4) Data location from which copying should be subsequently started: This parameter value represents a copy start location in the copy source block in a subsequent copying operation.

(5) Readable latest page address: This parameter value represents the page address of a latest readable page in the copy destination block, which holds readable data. The latest readable page is one of pages of the copy destination block, the pages of the copy destination block containing valid data which was copied by the data copy operation.

Procedure of Data Copy Processing

Figure 49:
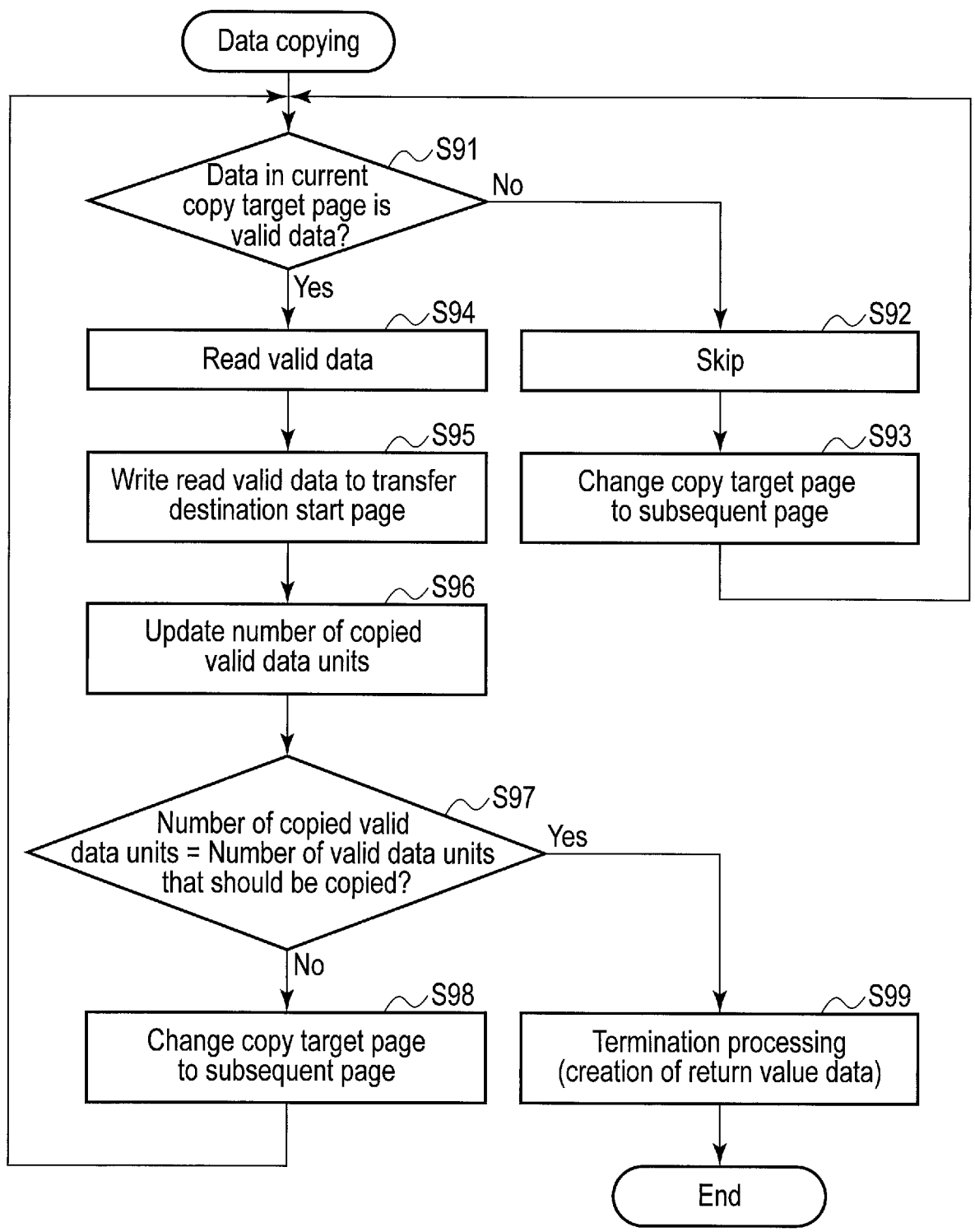
FIG. 49 is a flowchart illustrating a procedure of the data copy operation executed by the storage system of the embodiment when the number of valid data units to be copied is designated as the termination condition.

The flowchart of FIG. 49 shows the procedure of a data copy operation performed when the number of valid data units to be copied is designated as a termination condition.

First, the controller 4 sets, as a current copy target page, a copy start location (copy start page) in a copy source block designated by a data copy command. Subsequently, the controller 4 determines whether data in the current copy target page is valid data, based on bit map data (step S91).

If the data in the current copy target page is invalid data (NO in step S91), the controller 4 skips copying of the data in the current copy target page (step S92), and changes the current copy target page to a subsequent page (step S93).

If the data in the current copy target page is valid data (YES in step S91), the controller 4 reads the valid data from the current copy target page (step S94), and writes the read valid data to the transfer start page of a copy destination block (step S95). The controller 4 updates the number of copied valid data units (step S96), and determines whether the number of copied valid data units has reached the number of valid data units that should be copied (step S97).

If the number of copied valid data units has not yet reached the number of valid data units that should be copied (NO in step S97), the controller 4 changes the current copy target page to a subsequent page (step S98), and re-executes steps S91 to S97.

If the number of copied valid data units has reached the number of valid data units that should be copied (YES in step S97), the controller 4 performs termination processing (step S99). In step S99, the controller 4 creates return value data, and transmits, to the host 2, a command completion response including the return value data.

Figure 50:
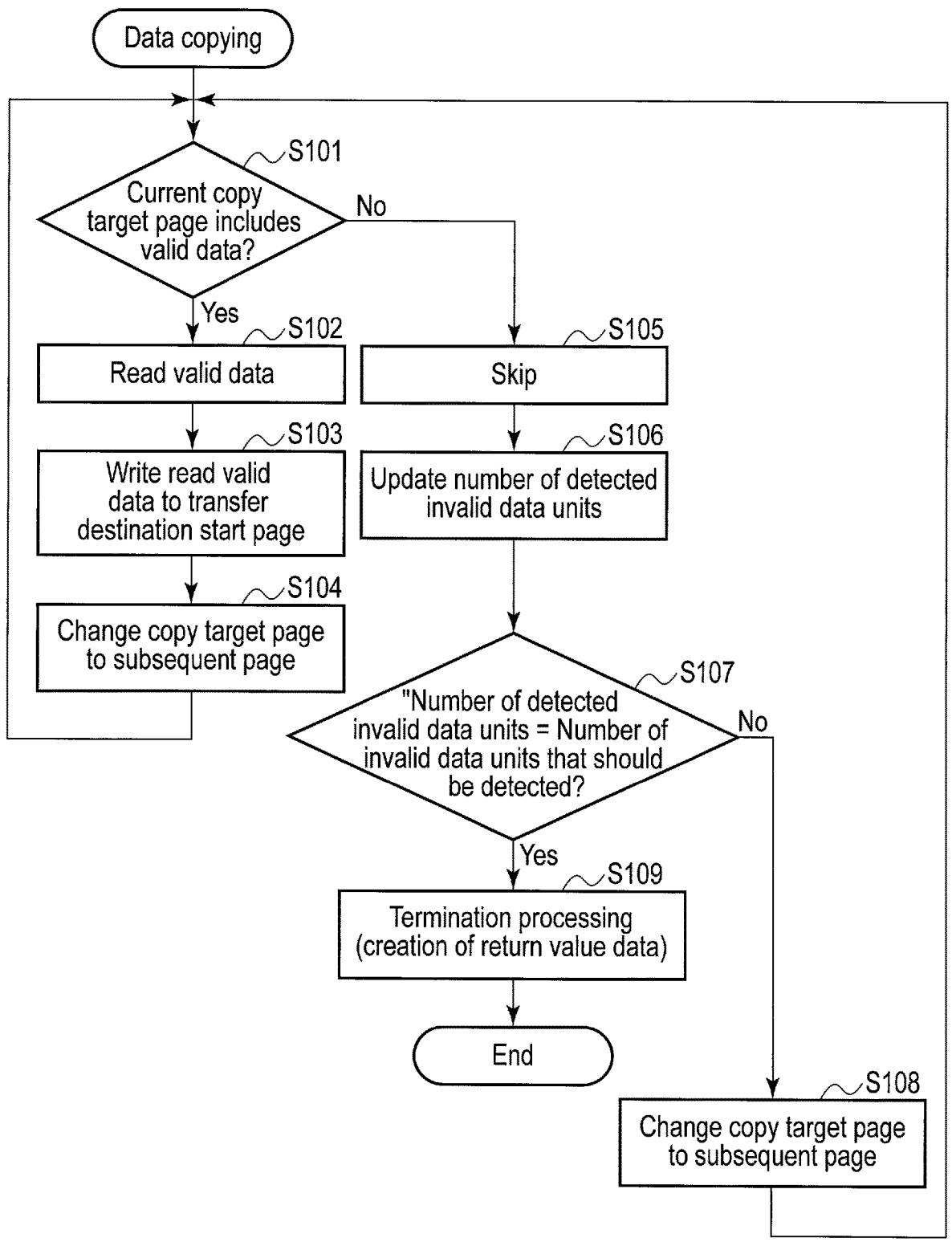
FIG. 50 is a flowchart illustrating a procedure of the data copy operation executed by the storage system of the embodiment when the number of invalid data units to be detected is designated as the termination condition.

The flowchart of FIG. 50 shows the procedure of a data copy operation performed when the number of invalid data units to be detected is designated as a termination condition.

First, the controller 4 sets, as a current copy target page, a copy start location (copy start page) in a copy source block designated by a data copy command. Subsequently, the controller 4 determines whether data in the current copy target page is valid data, based on bit map data (step S101).

If the data in the current copy target page is valid data (YES in step S101), the controller 4 reads the valid data from the current copy target page (step S102), and writes the read valid data to the transfer start page of a copy destination block (step S103). The controller 4 changes the current copy target page to a subsequent page (S104), and proceeds to step S101.

If the data in the current copy target page is invalid data (NO in step S101), the controller 4 skips copying of data in the current copy target page (S105), updates the number of detected invalid data units (S106), and determines whether the number of detected invalid data units has reached the number of invalid data units that should be detected (step S107).

If the number of detected invalid data units has not yet reached the number of invalid data units that should be detected (NO in step S107), the controller 4 changes the current copy target page to a subsequent page (step S108), and proceeds to step S101.

If the number of detected invalid data units has reached the number of invalid data units that should be detected (YES in step S107), the controller 4 performs termination processing (step S109).

In step S109, the controller 4 creates return value data, and transmits, to the host 2, a command completion response including the return value data.

Figure 51:
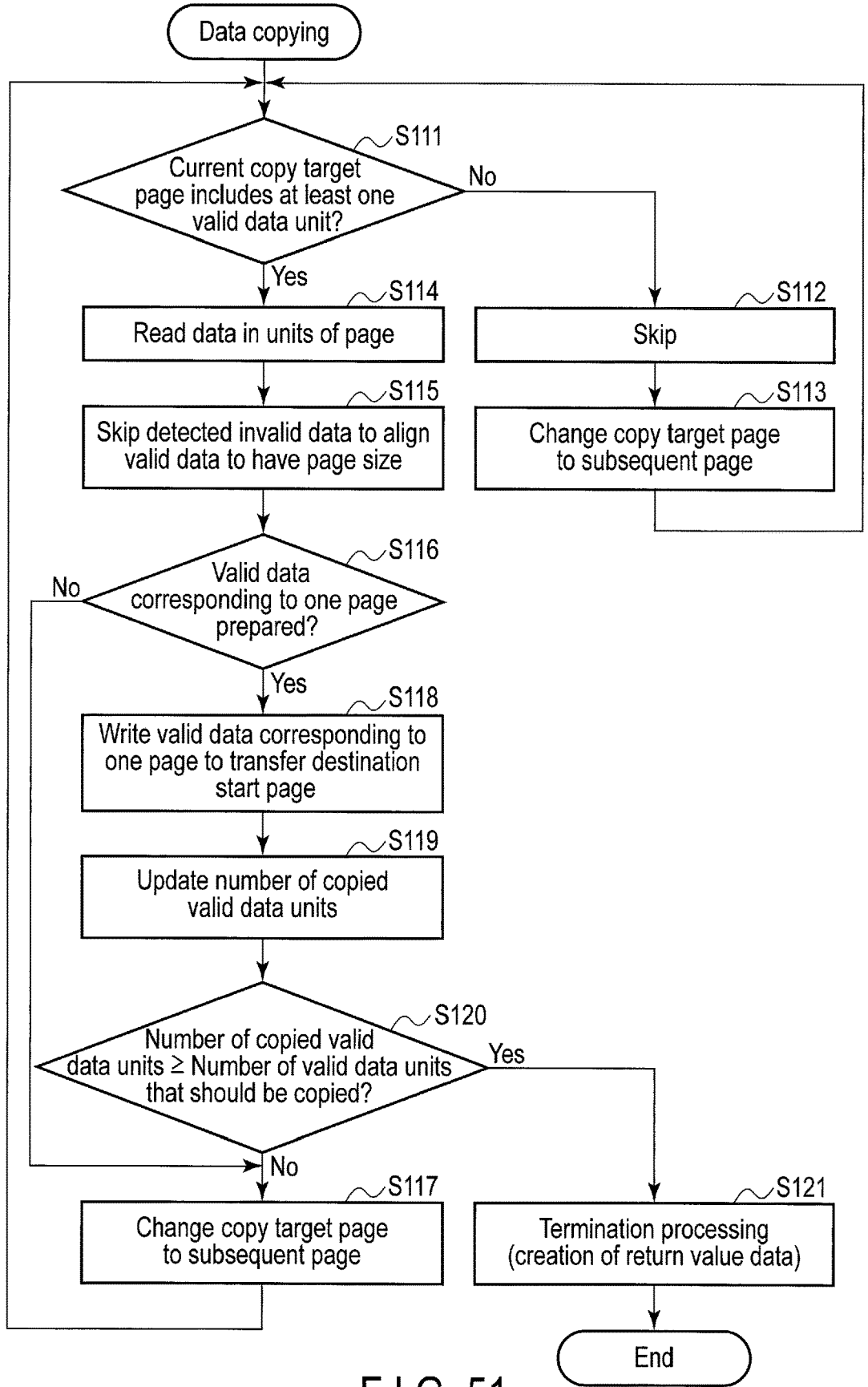
FIG. 51 is a flowchart illustrating a procedure of the data copy operation executed by the storage system of the embodiment when the data size is smaller than the page size and the number of valid data units to be copied is designated as the end condition.

The flowchart of FIG. 51 shows the procedure of a data copy operation performed when the data size is smaller than the page size, and the number of valid data units to be copied is designated as a termination condition.

First, the controller 4 sets, as a current copy target page, a copy start location (copy start page) in a copy source block designated by a data copy command. Subsequently, the controller 4 determines whether the current copy target page includes at least one valid data unit, based on bit map data (step S111).

If the current copy target page only includes invalid data (ON in step S111), the controller 4 skips copying of data of the current copy target page (step S112), changes the current copy target page to a subsequent page (step S113), and proceeds to step S111.

If the current copy target page includes at least one valid data unit (YES in step S111), the controller 4 reads data from the current copy target page in units of a page (i.e., reads all data from the current copy target page at a time), and stores the read data to the copy buffer 32 (S114). The controller 4 extracts only valid data from the read data to thereby skip invalid data, thereby preparing a set of valid data units aligned to have the page size (step S115). The controller 4 determines whether the set of valid data units aligned to have the page size (i.e., valid data having a size corresponding to one page) have been prepared (step S116).

If the size of the prepared valid data is smaller than that of one page (NO in step S116), the controller 4 changes the current copy target page to a subsequent page (step S117), and re-executes steps S111 to S115.

If the set of valid data units aligned to have the page size (valid data having the size corresponding to one page) have been prepared (YES in step S116), the controller 4 writes the valid data having the one page size to the transfer start page of the copy destination block (step S118). The controller 4 updates the number of the copied valid data units (step S119), and determines whether the number of copied valid data units is not less than the number of valid data units that should be copied (step S120).

If the number of copied valid data units is less than the number of valid data units that should be copied (NO in step S120), the controller 4 changes the current copy target page to a subsequent page (step S117), and re-executes step S111 and subsequent steps.

In contrast, if the number of copied valid data units is not less than the number of valid data units that should be copied (YES in step S120), the controller 4 performs termination processing (step S121). In step S121, the controller 4 creates return value data, and transmits, to the host 2, a command completion response including the return value data.

The flowchart of FIG. 52 shows the procedure of a data copy operation performed when the data size is smaller than the page size, and the number of invalid data units to be detected is designated as a termination condition.

In the processing of FIG. 52, steps S131 and S132 are executed, instead of steps S119 and S120 in FIG. 51.

That is, after writing a set of valid data units aligned to have the page size (i.e., valid data having a size corresponding to one page) to the transfer start page of the copy destination block (step S118), the controller 4 updates the number of detected invalid data units (step 131), and determines whether the number of detected invalid data units is not less than the number of invalid data units that should be detected (step S132).

If the number of detected invalid data units is less than the number of invalid data units that should be detected (NO in step S132), the controller 4 changes the current copy target page to a subsequent page (step S117), and re-executes step S111 and subsequent steps.

In contrast, if the number of detected invalid data units is not less than the number of invalid data units that should be detected (YES in step S132), the controller 4 performs termination processing (step S121).

Namespace Management

FIG. 53 shows the namespace management function of the SSD 3.

In the SSD 3, a certain number of blocks designated for the namespace of NSID #1 can be secured (reserved) for the namespace of NSID #1, and similarly, a certain number of blocks designated for the namespace of NSID #n can be secured (reserved) for the namespace of NSID #n. A certain client terminal 51 (user A) connected to the host 2 can access the SSD 3 (for read, write and/or erase operation), using NSID #1, and another client terminal 51 (user B) connected to the host 2 can access the SSD 3 (for read, write and/or erase operation), using NSID #n.

Suppose here a case where user A deals with data of a high update frequency, and user B deals with data of a low update frequency. In this case, write amplification may increase in the namespace of NSID #1. The write amplification (WA) is defined as follows:

$$WA = \text{"total amount of data written to SSD"} / \text{"total amount of data written to SSD in accordance with write commands from host"}$$

The "total amount of data written to SSD" is equivalent to the sum of the total amount of data written to the SSD in accordance with write commands from the host, and the total amount of data internally written to the SSD by a garbage collection (data copy operation), and the like.

The increase in write amplification (WA) causes the increase in the erase count of each block in the SSD 3. That is, the greater the write amplification (WA), the quicker the erase count reaching its upper limit. As a result, degradation in the endurance and life of the SSD 3 will be involved.

Thus, the amount of wear of the SSD 3 resulting from writes to the namespace of NSID #1 is greater than the amount of wear of the SSD 3 resulting from writes to the namespace of NSID #n.

The namespace management function of the SSD 3 can manage the total erase count of blocks (or virtual blocks) namespace by namespace, and can notify the host 2 of a total erase count corresponding to a specific namespace designated by the host 2, as an index indicating the amount of wear of the SSD 3 due to this specific namespace. The total erase count of the namespace of NSID #1 is counted by total erase count counter 300-1, and the total erase count of the namespace of NSID #n is counted by total erase count counter 300-n. The total erase count of a certain namespace having a certain NSID is obtained by counting the number of erase operations performed on the blocks allocated for the namespace of the NSID.

If the host 2 is notified of the total erase counts of namespaces, it can evaluate how much the SSD 3 is worn by respective namespaces. Based on the evaluation result, the host 2 can take, against a namespace having a larger total erase count, countermeasures, such as securing of a larger number of blocks for the namespace.

For example, the host software may request the SSD 3 to secure, for the namespace of NSID #1, a sufficient number of blocks exceeding a capacity (user data capacity) corresponding to the LBA range of the namespace of NSID #1. In response to this command, the controller 4 of the SSD 3 secures a designated number of blocks to the namespace of NSID #1.

If the capacity (user data capacity) corresponding to the LBA range of NSID #1 is 100 Gbytes, the host software may request the SSD 3 to add physical blocks equivalent to 100 Gbytes to thereby secure, for namespaces NSID #1, physical blocks equivalent to 200 Gbytes in total. The remaining physical resource of 100 Gbytes obtained by subtracting the user data capacity from 200 Gbytes functions as the over-provision area of the namespace of NSID #1.

In another embodiment, the host software may determine a storage use fee (rental fee) to be charged to user A who uses the namespace of NSID #1, based on the number of blocks secured for the namespace of NSID #1, and the total erase count corresponding to this namespace. A higher rental fee may be set for a greater total erase count.

Figure 54:
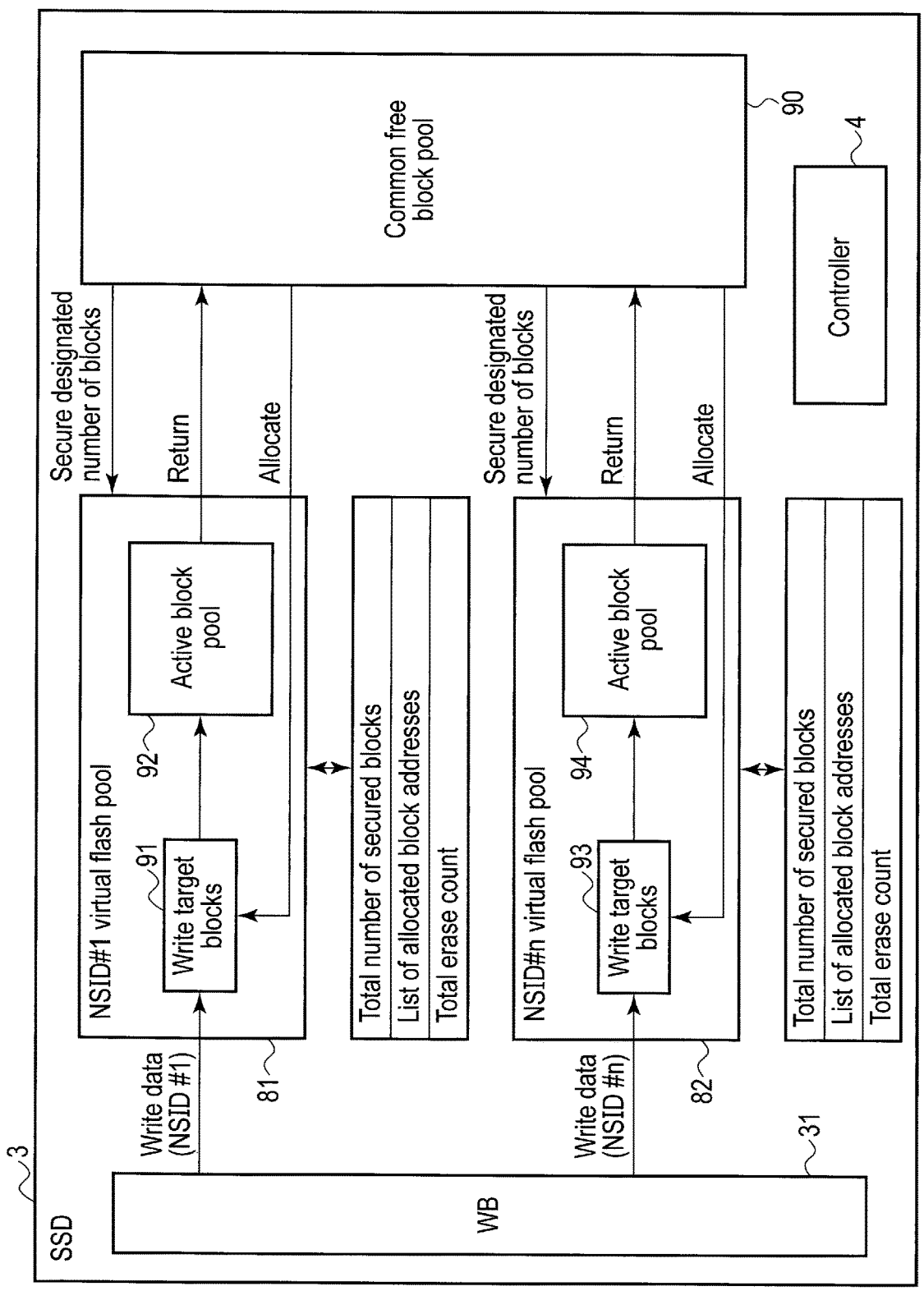
FIG. 54 illustrates a namespace management architecture of the storage system of the embodiment.

FIG. 54 shows the namespace management architecture of the SSD 3.

The controller 4 manages the free blocks of the NAND memory 4 using a common free block pool 90, and allocates some blocks in the common free block pool 90 for the namespace of NSID #1. These allocated blocks are used for storing data associated with the namespace of NSID #1. That is, the controller allocates, for the namespace of NSID #1, the blocks as those for storing data associated with the namespace of NSID #1. Upon receiving, from the host 2, a command to read, write or erase one of the blocks, the controller 4 performs a read, write or erase operation on the one block. The controller 4 counts the number of erase operations performed on these blocks. Upon receiving, from the host 2, a command to acquire an erase count associated with the namespace of NSID #1, the controller 4 notifies the host 2 of the count value of erase operations (i.e., the total erase count of the namespace of NSID #1). Also for the namespace of NSID #n, the controller 4 performs the same processing as that for the namespace of NSID #1.

The namespace management architecture will now be described.

In the SSD 3, virtual flash pools independent of each other are provided for the respective namespaces. Virtual flash pool 81 is used to manage the amount of physical resources secured (reserved) for the namespace of NSID #1, i.e., the total number of blocks secured (reserved) for the namespace of NSID #1. Similarly, virtual flash pool 82 is used to manage the amount of physical resources secured (reserved) for the namespace of NSID #n, i.e., the total number of blocks secured (reserved) for the namespace of NSID #n. In this case, it is not necessity to consider which block should be secured (reserved), and only the number of blocks to be secured (reserved) is managed by each virtual flash pool. In the physical NAND access management API 21, the number of blocks be secured is the number of physical blocks. In the virtual NAND access management API 22, the number of blocks be secured is the number of virtual blocks.

Each free block is managed by the common free block pool 90 shared among a plurality of namespaces. A block returned from the virtual flash pool of each namespace is managed by the common free block pool 90.

Wear leveling is performed when a new block (for example, a write target block or a write target virtual block) is allocated from the common free block pool 90 to each namespace. Upon receiving, from the host 2, a block allocate command (for example, the above-mentioned block allocate and erase command) including a specific NSID, the controller 4 selects one free block from the common free block pool 90. In the case of using the physical NAND access management API 21, the selected free block is a physical block, and in the case using the virtual NAND access management API 22, it is a virtual block. The controller 4 allocates the selected block for a namespace corresponding to the specific NSID, and subtracts 1 from the total number of blocks secured for this namespace. In the selection of a free block from the common free block pool 90, the controller 4 may select a block having a minimum erase count (a physical block having a minimum erase count or a virtual block having a minimum erase count). Since thus, a block having a small erase count returned from the namespace of NSID #n can be allocated for the namespace of NSID #1 in which data is rewritten frequently, wear leveling can be realized among the namespaces.

The controller 4 manages, as management information corresponding to the namespace of NSID #1, the total number of blocks secured for the namespace of NSID #1, a list of block addresses allocated for the namespace of NSID #1, the total erase count of the namespace of NSID #1, etc. The total erase count of the namespace of NSID #1 is obtained by counting the erase operations performed on the respective blocks allocated for the namespace of NSID #1.

The namespace management of NSID #1 may be performed as follows. A description will hereinafter be given of the namespace management for the physical NAND access management API 21.

When the controller 4 receives, from the host 2, a namespace allocate command including NSID #1, the controller 4 secures, for the namespace of NSID #1, a plurality of blocks whose the number is designated by the namespace allocate command. The total number of blocks secured for NSID #1 is managed by virtual flash pool 81. The upper limit of the number of blocks that can be allocated for the namespace of NSID #1 is restricted to not more than the total number of blocks secured for NSID #1.

Upon receiving, from the host 2, a block allocate and erase command including NSID #1, the controller 4 selects a free block having a minimum erase count from the common free block pool 90, allocates the selected free block for the namespace of NSID #1, erases the allocated free block, notifies the host 2 of the physical address of the allocated and erased block, and subtracts 1 from the total number of blocks managed by virtual flash pool 81, i.e., the number of remaining blocks that can be allocated for the namespace of NSID #1. The number of remaining blocks that can be allocated to the namespace of NSID #1 indicates the current number of blocks that can be allocated for the namespace of NSID #1. The allocated and erased block can be used as, for example, a write target block 91 for the namespace of NSID #1.

If the current total number of blocks (the number of remaining blocks) managed by virtual flash pool 81 is zero, the controller 4 does not allocate a new block for the namespace of NSID #1 even if it receives a block allocate and erase command including NSID #1 from the host 2.

Upon receiving a write command including NSID #1 from the host 2, the controller 4 writes, to the write target block 91, data designated by the write command. The write command may include the physical address (both the block address and the page address) to which data should be written (direct address designation mode). Alternatively, the write command may include only the block address to which data should be written (automatic address generation mode), or may include only NSID #1.

When the write command includes only NSID #1, the controller 4 automatically generates the physical address to which data should be written, as in the automatic address generation mode. In this case, data designated by the write command is written to the current write target block 91 in order of P0 to P255. The controller 4 notifies the host 2 of the physical address (both the block address and the page address) to which data has been written.

When the current write target block 91 is filled with data, the current write target block 91 may be moved to an active block pool 92. The active block pool 92 manages a list of blocks (active blocks) currently used by NSID #1. When the current write target block 91 is filled with data, the host 2 may transmit a block allocate and erase command including NSID #1 to the SSD 3 to request allocation and erasure of a new write target block.

The host 2 can read or erase an arbitrary block in the active block pool 92. Moreover, the host 2 can transmit, to the SSD 3, a block return command to return a block in the active block pool 92 to the common free block pool 90. For example, an erased block, a block including only data invalidated by data updating, a block including only data invalidated by, for example, the above-mentioned data copy operation, etc., are returned. Upon receiving the block return command, the controller 4 moves, to the common free block pool 90, a block designated by the block return command, and increments, by 1, the total number of blocks (the number of remaining blocks) managed by virtual flash pool 81.

The controller 4 also manages management information corresponding to the namespace of NSID #n, i.e., the total number of secured blocks, a list of allocated block addresses, the total erase count of the namespace of NSID #n, etc.

The namespace management of NSID #n is performed as follows.

Upon receiving, from the host 2, a namespace allocate command including NSID #n, the controller 4 secures, for the namespace of NSID #n, a plurality of blocks whose the number is designated by the namespace allocate command. The total number of blocks secured for the namespace of NSID #n is managed by virtual flash pool 82.

Upon receiving, from the host 2, a namespace allocate and erase command including NSID #n, the controller 4 selects a free block having a minimum erase count from the common free block pool 90, allocates the selected free block for the namespace of NSID #n, erases the allocated free block, notifies the host 2 of the physical address of the allocated and erased block, and subtracts 1 from the total number of blocks managed by virtual flash pool 82, i.e., the number of remaining blocks that can be allocated for the namespace of NSID #n. The allocated and erased block can be used as, for example, write target block 93 for the namespace of NSID #n.

If the current total number of blocks (the number of remaining blocks) managed by virtual flash pool 82 is zero, the controller 4 does not allocate a new block for the namespace of NSID #n even if it has received the block allocate and erase command including NSID #n.

Upon receiving a write command including NSID #n from the host 2, the controller 4 writes, to write target block 93, data designated by the write command. The write command may include a physical address (both a block address and a page address) to which data should be written (direct addressing mode), may include only a block address to which data should be written (automatic address generation mode), or may include only NSID #n.

When the write command includes only NSID #n, the physical address to which data should be written is automatically generated by the controller 4, as in the automatic address generation mode. In this case, the data designated by the write command is sequentially written to pages P0 to P255 in current write target block 93. The controller 4 notifies the host 2 of the physical address (both the block address and the page address) to which the data has been written.

When the current write target block 93 is filled with data, the current write target block 93 may be moved to an active block pool 94. The active block pool 94 manages a list of blocks currently used by the namespace of NSID #n. When current write target block 93 is filled with data, the host 2 may transmit, to the SSD 3, a block allocate and erase command including NSID #n to request allocation and erasure of a new write target block.

The host 2 can read or erase an arbitrary block in the active block pool 94. Moreover, the host 2 can transmit, to the SSD 3, a block return command to return a block in the active block pool 94 to the common free block pool 90. Upon receiving the block return command, the controller 4 moves a block designated by the block return command to the common free block pool 90, and increments, by 1, the total number of blocks (the number of the remaining blocks) managed by virtual flash pool 82.

Namespace management for the virtual NAND access management API 22 can also be performed in the same procedure as in the namespace management for the physical NAND access management API 21. In the namespace management for the virtual NAND access management API 22, the number of secured virtual blocks may be managed instead of the number of secured blocks, and a list of allocated virtual block addresses may be managed instead of the list of block addresses.

Also, in the namespace management for the virtual NAND access management API 22, a count value obtained by counting the number of erase operations executed on virtual blocks allocated for the namespace of NSID #1 may be managed as the total erase count of the namespace of NSID #1, and a count value obtained by counting the number of erase operations executed on virtual blocks allocated for the namespace of NSID #n may be managed as the total erase count of the namespace of NSID #n.

Namespace Allocate Command

Figures 55, 56:
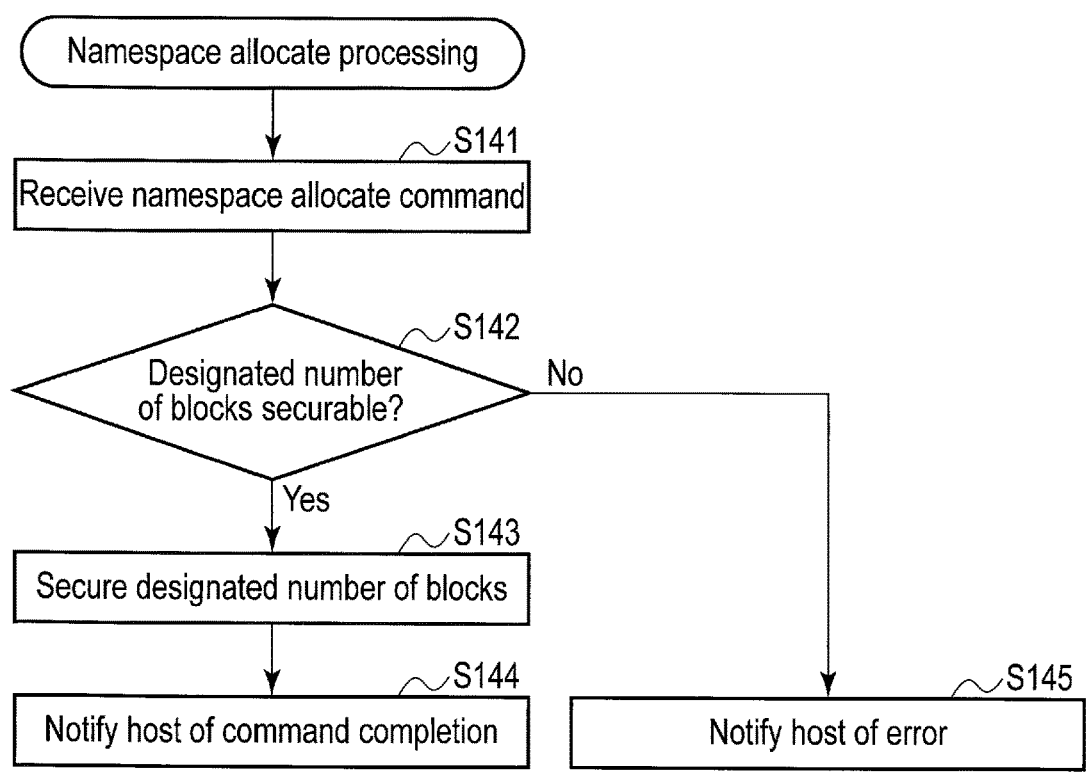
FIG. 55 illustrates a namespace allocate command used in the storage system of the embodiment.
FIG. 56 is a flowchart illustrating a procedure of namespace allocation processing executed by the storage system of the embodiment.

FIG. 55 shows a namespace allocate command. The namespace allocate command request the SSD 3 to secure (or add) a command-designated number of blocks.

The namespace allocate command includes the following input parameters:

(1) NSID: This input parameter value represents the identifier (ID) of a target namespace.

(2) Amount of physical resources: The physical resource amount represents the number of blocks to be secured. In the physical NAND access management API 21, the number of blocks to be secured is designated using the granularity of blocks (physical blocks). In the virtual NAND access management API 22, the number of blocks to be secured is designated as the granularity of virtual blocks (each virtual block including a plurality of physical blocks).

Further, the namespace allocate command may also include an input parameter representing a processing priority.

The namespace allocate command includes the following output parameters:
(1) Amount of physical resources: The physical resource amount represents the number of secured blocks. In the physical NAND access management API 21, the number of secured blocks is represented by the granularity of blocks (physical blocks). In the virtual NAND access management API 22, the number of secured blocks is represented by the granularity of virtual blocks.

Procedure of Namespace Allocate Processing

The flowchart of FIG. 56 shows a procedure of namespace allocate processing performed by the SSD 3.

The controller 4 of the SSD 3 receives a namespace allocate command from the host 2 (step S141). The controller 4 determines whether blocks, the number of which is designated by an input parameter (physical resources amount) in the namespace allocate command, can be secured, based on the number of remaining blocks in the common free block pool 90 (step S142). As described above, in the physical NAND access management API 21, the number of blocks to be secured is designated using the granularity of blocks (physical blocks), while in the virtual NAND access management API 22, the number of blocks to be secured is designated using the granularity of virtual blocks (each virtual block including a plurality of physical blocks).

If the number of remaining blocks (or remaining virtual blocks) is more than the designated number (YES in step S142), the controller 4 secures a designated number of blocks (or virtual blocks) for a namespace corresponding to NSID designated by the namespace allocate command (step S143), and transmits, to the host 2, a command completion response including an output parameter indicating the number of secured blocks (or virtual blocks) (step S144).

If the number of remaining blocks (or virtual blocks) is less than the designated one (NO in step S142), the controller 4 notifies the host 2 of an error (step S145). The host 2 notified of the error may change the number of blocks (or virtual blocks) to be secured.

Block allocate and erase command for namespaces FIG. 57 shows a block allocate and erase command for namespaces.

The block allocate and erase command for namespaces includes the following input parameters:
(1) Processing priority: The processing priority represents the priority of this command.
(2) NSID: NSID represents the ID of a namespace for which a block (or virtual block) should be allocated.

The block allocate and erase command for namespaces includes the following output parameters:
(1) Exit status: An exit status indicating the success or the failure (error) of the block allocate and erase command is returned to the host 2.
(2) Block address: The block address of the allocated block (or virtual block address of an allocated virtual block) is returned to the host 2.
(3) Number of remaining blocks: The number of remaining blocks (or the number of remaining virtual blocks) secured for this NSID is returned to the host 2.

Procedure of Block Allocate and Erase Processing for Namespaces

FIG. 58 shows a procedure of block allocate and erase processing performed by the SSD 3. Hereinafter, a description will be given of an example of block allocate and erase processing for the physical NAND access management API 21.

The controller 4 of the SSD 3 receives a block allocate and erase command including NSID from the host 2 (step S151). The controller 4 determines whether there is a remaining block for this NSID (step S152).

If there is a remaining block for the NSID (YES in step S152), the controller 4 allocates, as a write target block for the designated NSID, one block from the common free block pool 90, and automatically erases the allocated block (step S153). The controller 4 subtracts 1 from the number of remaining blocks for the designated NSID (step S154). The controller 4 updates the total erase count corresponding to the designated NSID (step S155). In step S155, the controller 4 increments, by 1, a total erase count corresponding to this NSID. After that, the controller 4 generates a return value (output parameter), and transmits, to the host 2, a command completion response including the return value (step S156).

In contrast, if there is no remaining block for the NSID (NO in step S152), the controller 4 transmits, to the host 2, a command completion response including an error status indicating that there is no more remaining block for the NSID and hence a new block cannot be allocated thereto (step S157).

In block allocate and erase processing for the virtual NAND access management API 22, the controller 4 determines whether there is a remaining virtual block for the NSID (step S152).

If there is a remaining virtual block for the NSID (YES in step S152), the controller 4 allocates, as a write target block (write target virtual block) for the designated NSID, one virtual block from the common free block pool 90, and automatically erases the allocated virtual block (step S152). The controller 4 subtracts 1 from the number of remaining virtual blocks for the designated NSID (step S154). The controller 4 updates the total erase count corresponding to the designated NSID (step S155). In step S155, the controller 4 increments, by 1, the total erase count corresponding to this NSID. Subsequently, the controller 4 generates a return value (output parameter), and transmits, to the host 2, a command completion response including the return value (step S156).

In contrast, if there is no remaining virtual block for the NSID (NO in step S152), the controller 4 transmits, to the host 2, a command completion response including an error status indicating that there is no more remaining virtual block secured for the NSID and hence a new block cannot be allocated thereto (step S157).

Erase Command for Namespaces

FIG. 59 shows an erase command for erasing a specific block allocated to a certain namespace. The erase command includes the following input parameters:
(1) Block address: This input parameter value represents the block address of a block, from which data should be erased. In an erase command for the virtual NAND access management API 22, this input parameter value represents, instead of the block address, the virtual block address of a virtual block, from which data should be erased.
(2) Processing priority: This input parameter value represents the priority of the command.
(3) NSID: This input parameter value represents NSID corresponding to a block (or virtual block) from which data should be erased.

The erase command includes the following output parameters:
- (1) Exit status: An exit status indicating the success or the failure (error) of the erase command is returned to the host 2.
- (2) Block address: This output parameter value represents the block address of an erased block. In the erase command for the virtual NAND access management API 22, this output parameter value represents the virtual block address of an erased virtual block.
- (3) Total erase count: This output parameter value represents the total of the erase counts of the blocks allocated for the NSID. In the erase command for the virtual NAND access management API 22, this output parameter value represents the total of the erase counts of the virtual blocks allocated for the NSID.

Procedure of Erase Processing

Figure 60:
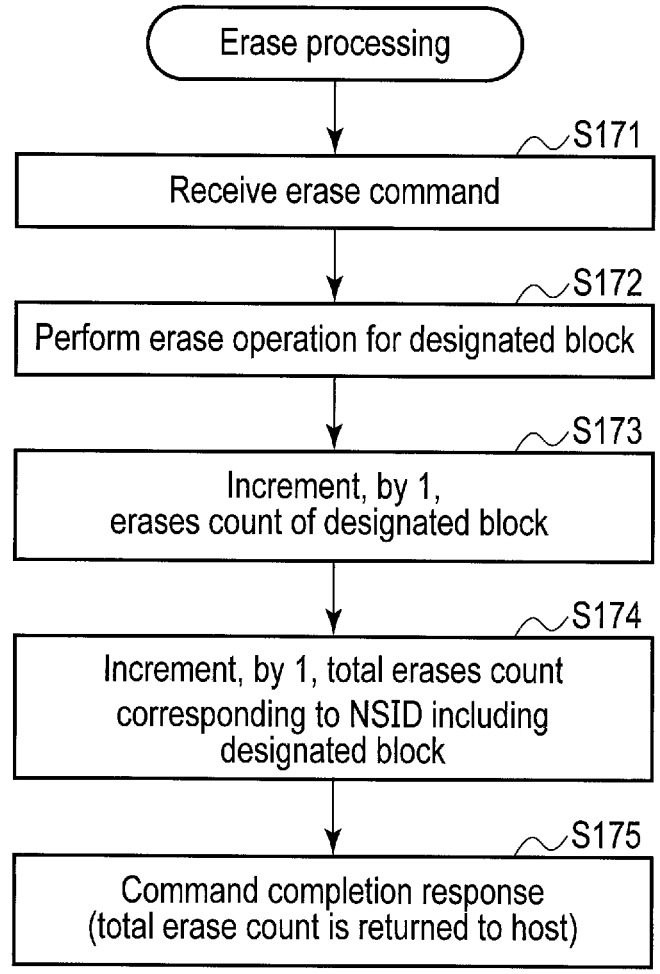
FIG. 60 is a flowchart illustrating a procedure of erase processing executed by the storage system of the embodiment upon receiving the erase command including a namespace identifier (NSID).

The flowchart of FIG. 60 shows a procedure of erase processing performed by the SSD 3. A description will hereinafter be given of, as an example, processing for the physical NAND access management API 21.

The controller 4 of the SSD 3 receives an erase command from the host 2 (step S171). The controller 4 performs an erase operation for erasing the data of a block designated by the erase command (step S172), increments, by 1, the erase count of this erased block (step S173), and increments, by 1, a total erase count corresponding to the NSID for which the erased block is allocated (step S174). If the erase command includes NSID, NSID, for which this erased block is allocated, is designated by the former NSID included in the erase command. In contrast, if the erase command does not include NSID, NSID, for which this erased block is allocated, may be specified based on the block address of the erased block and a list of block addresses allocated to respective NSIDs.

After that, the controller 4 generates a return value (output parameter), and transmits, to the host 2, a command completion response including the return value (step S175).

In erase processing for the virtual NAND access management API 22, the controller 4 performs erase operations of erasing data of all blocks included in the virtual block designated by the erase command (step S172), increments, by 1, the erase count of the erased virtual block (step S173), and increments, by 1, a total erase count corresponding to NSID for which the erased virtual block is allocated (step S174).

Block Return Command

FIG. 61 shows a block return command applied to the SSD 3. This block return command is used to return, to the common free block pool 90, a block in the active block pool corresponding to a specific namespace.

The block return command includes the following input parameters:
- (1) Block address: This input parameter value represents the block address of a block that should be returned. In a block return command for the virtual NAND access management API 22, this input parameter value represents the virtual block address of a virtual block that should be returned instead of a block address.
- (2) Processing priority: This input parameter value represents the priority of the command.
- (3) NSID: This input parameter value represents NSID corresponding to a block (or virtual block) that should be returned.

The block return command includes the following output parameters:
- (1) Exit status: An exit status indicating the success or the failure (error) of the block return command is returned to a host.
- (2) Number of remaining blocks: This output parameter value represents the number of remaining blocks after a block return. In a block return command for the virtual NAND access management API 22, this output parameter value represents the number of remaining virtual blocks after a virtual block return.

Procedure of Block Return Processing

The flowchart of FIG. 62 shows a procedure of block return processing performed by the SSD 3. A description will hereinafter be given of block return processing for the physical NAND access management API 21 as an example.

The controller 4 of the SSD 3 receives a block return command from the host 2 (step S181). The controller 4 moves a block, designated by the block return command, from an active block pool, corresponding to NSID designated by the block return command, to the common free block pool 90 (step 3182). As a result, allocation of this block for the designated NSID is released, and the block is managed as a free block with no valid data in the common free block pool 90.

The controller 4 increments, by 1, the number of remaining blocks corresponding to the designated NSID (step S183). After that, the controller 4 generates a return value (output parameter), and transmits, to the host 2, a command completion response including the return value (step S184).

In block return processing for the virtual NAND access management API 22, the controller 4 moves a virtual block, designated by the block return command, to the common free block pool 90 (step S182), increments, by 1, the number of remaining virtual blocks corresponding to the designated NSID (step S183), and transmits, to the host 2, a command completion response including a return value (step S184).

Get Erase Count Command

FIG. 63 shows a get erase count command for namespaces applied to the SSD 3. This get erase count command requests the SSD 3 to notify the total erase count of a specific namespace.

The get erase count command includes the following input parameters:
- (1) NSID: This input parameter value represents target NSID. When this input parameter value is a special value, all NSIDs may be determined as target NSIDs.
- (2) Processing priority: This input parameter value represents the priority of this command.

The get erase count command includes the following output parameters:
- (1) Exit status: An exit status indicating the success or the failure (error) of the get erase count command is returned to a host.
- (2) Total erase count: This output parameter value represents the total erase count of the designated NSID.

Erase Count Notify Processing

The flowchart of FIG. 64 shows a procedure of erase count notify processing performed by the SSD 3. A description will hereinafter be given of erase count notify processing for the physical NAND access management API 21 as an example.

When the controller 4 of the SSD 3 has received a get erase count command from the host 2, it determines whether the get erase count command designates specific NSID or whether all NSIDs (step S191).

If the specific NSID is designated (YES in step S191), the controller 4 acquires a current total erase count (count value) corresponding to the specific NSID (step S192), and transmits, to the host 2, a command completion response including the current total erase count corresponding to the specific NSID (step S194).

If all NSIDs have been designated (NO in step S191), the controller 4 acquires a list of current total erase counts corresponding to the respective ones of the all NSIDs (step S193), and transmits, to the host 2, a command completion response including the list of current total erase counts corresponding to the respective ones of the all NSIDs (step S194).

In erase count notify processing for the virtual NAND access management API 22, the number of erase operations performed on virtual blocks allocated for the designated NSID is counted, and the resultant count value is notified, to the host 2, as the total erase count corresponding to the designated NSID.

Although the processing of notifying the host 2 of the total erase count corresponding to the designated NSID, using the get erase count command, has been described above, a get erase count command including a parameter designating either a block address or a virtual block address, instead of NSID, may also be used.

The erase command for the physical NAND access management API 21 includes a block address (i.e., a physical address that specifies a block). The controller erases the data of a block designated by a block address included in an erase command received from the host 2, manages the erase counts of the blocks in group #Y, and notifies the host 2 of the erase count of a block designated by a block address included in a get erase count command when it has received this get erase count command from the host 2.

An erase command for the virtual NAND access management API 22 includes a virtual block address (i.e., a physical address that specifies a virtual block). The controller erases the data of a virtual block designated by a virtual block address included in an erase command received from the host 2, manages the erase counts of the virtual blocks in group #X, and notifies the host 2 of the erase count of a virtual block designated by a virtual block address included in a get erase count command when it has received this get erase count command from the host 2.

Other Commands for Namespace Management

The controller 4 also supports a namespace deallocate command. The namespace deallocate command request the controller 4 to delete (deallocate) a specified namespace. The namespace deallocate command may include an input parameter indicating a NSID and the number of blocks currently allocated for the specified NSID (i.e., the number of blocks to be deallocated). In the physical NAND access management API 21, the number of blocks is the number of physical blocks currently allocated for the specified NSID. In the virtual NAND access management API 22, the number of blocks is the number of virtual blocks currently allocated for the specified NSID. Upon receiving the namespace deallocate command form the host 2, the controller 4 moves, to the common free block 90 as free blocks, all blocks in a virtual flash pool corresponding to the specified NSID. Further, the controller 4 transmits, to the host 2, a command completion response to the namespace deallocate command. This command completion response may include a return value indicating the number of deallocated blocks.

The host 2 can vary the number of namespaces, using the above-mentioned namespace allocate command and namespace deallocate command.

Host Configuration

Figure 65:
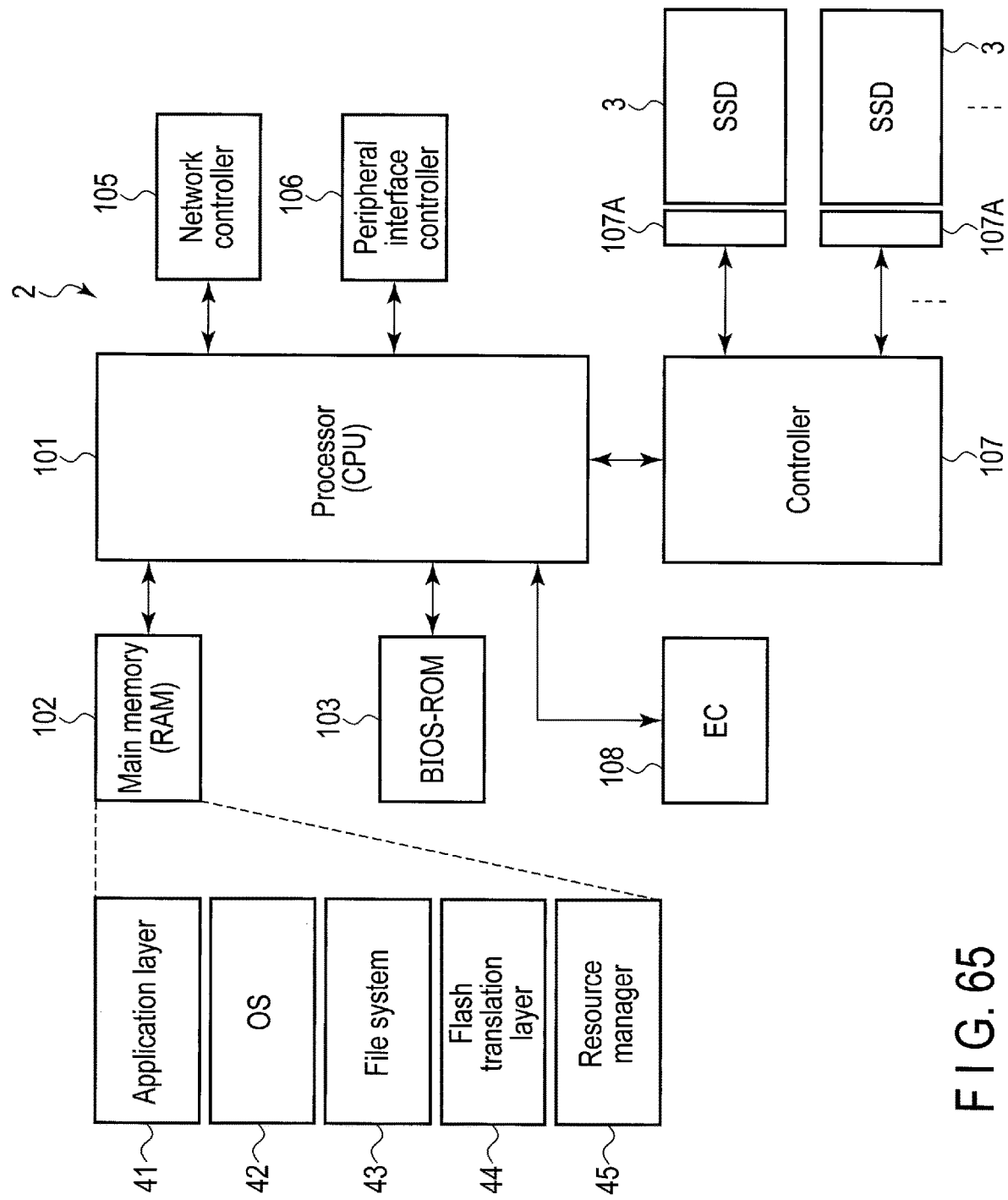
FIG. 65 is a block diagram illustrating a configuration example of the host.

FIG. 65 shows a hardware configuration example of the information processing apparatus that functions as the host 2.

This information processing apparatus is realized as a server computer or a personal computer. The information processing apparatus comprises a processor (CPU) 101, a main memory 102, a BIOS-ROM 103, a network controller 105, a peripheral interface controller 106, a controller 107, an embedded controller (EC) 108, etc.

The processor 101 is a CPU configured to control the operation of each component of the information processing apparatus. The processor 101 executes various programs loaded from any one of a plurality of SSDs 3 to the main memory 102. The main memory 102 comprises a random access memory such as a DRAM. The programs executed by the processor 101 include the above-described application software layer 41, OS 42, file system 43 and ETL 44. The programs executed by the processor 101 may further include a resource manager 45.

The resource manager 45 may transmit the get erase count command to the SSD 3 to acquire the total erase count of each namespace from the SSD 3, and to determine the amount of wear of the physical resources of the SSD 3 for each of the namespaces, based on the acquired total erase count of each namespace. If the amount of wear of physical resources of the SSD 3 due to a specific namespace is greater than a threshold, the resource manager 45 may perform processing for increasing the number of blocks to be secured for the specific namespace. In this case, the resource manager 45 may transmit, to the SSD 3, a namespace allocate command to add a designed number of blocks to the specific namespace. This increases the size of the over-provision area of the specific namespace, to thereby enable the write amplification of the specific namespace to be reduced, with the result that the amount of wear of physical resources of the SSD 3 due to the specific namespace can be reduced.

Moreover, as described above, the operator of the data center may determine a rental fee corresponding to the specific namespace, based on the number of blocks (or virtual blocks) secured for the specific namespace and the total erase count of the specific namespace. In this case, the resource manager 45 may provide services for supporting determination of the rental fee by the operator of the data center. For example, a basic rental fee associated with a certain namespace may be determined first from the capacity (the number of blocks) of an area corresponding to this namespace. Then, a total fee obtained by adding, to the basic rental fee, an additional fee determined by a function of the total erase count of the namespace may be calculated as a rental fee for the namespace.

If a user who rents the namespace has requested addition of blocks to be secured for the namespace, the resource manager 45 may dispense charge of additional fee, and may set a new rental fee, only based on the sum of the number of additional blocks and the number of blocks already secured. After that, the resource manager 45 may transmit, to the SSD 3, a namespace allocate command that requests the SSD 3 to add, for the specific namespace, blocks, the number of which is designated by the user.

Further, the resource manager 45 cooperates with the FTL 44 to enable each application to control the NAND memory 5 of the SSD 3, using the physical NAND access control API/virtual NAND access control API. For instance, the resource manager 45 receives a first read, write or erase request from the user (a certain application program or a client device). The first read, write or erase request may include a physical address designating one of the blocks for the physical NAND access control API 21. In response to receiving the first read, write or erase request, the resource manager 45 may transmit the above-mentioned read, write or erase command to the SSD 3 to control a read, write or erase operation on the designated block. Furthermore, the resource manager 45 receives a second read, write or erase request from the user (a certain application program or a client device). The second read, write or erase request may include a physical address (virtual block address) designating one of the virtual blocks in the NAND memory 5. In response to receiving the second read, write or erase request, the resource manager 45 may transmit the above-mentioned read, write or erase command to the SSD 3 to control a read, write or erase operation on the designated virtual block.

Furthermore, based on a latest page address indicating a latest readable page holding readable data and notified from the SSD 3, the resource manager 45 may perform control of automatically changing a storage area (a memory of the host 2 holding write data for a predetermined period, or the NAND memory 5 of the SSD 3) to which a read request from a user (a certain application program or a client device) should be directed. In this case, the resource manager 45 may perform read access to the memory in the host 2 in response to a read request to specific data written to the SSD 3, until this specific data becomes readable, and may perform read access to the NAND memory 5 of the SSD 3 in response to a read request to the specific data, after this specific data becomes readable.

Moreover, the resource manager 45 cooperates with the FTL 44 to enable manage of a plurality of namespaces. The resource manager 45 transmits, to the SSD 3, a command for a data read, write or erase on one of a plurality of first blocks allocated for a first namespace. Subsequently, the resource manager 45 transmits, to the SSD 3, a command to acquire an erase count associated with the first namespace, thereby acquiring, from the SSD 3, a count value obtained by counting the number of erase operations performed on the first blocks.

Also, the resource manager 45 transmits, to the SSD 3, a command for securing blocks for the first namespace, to thereby cause the SSD 3 to secure a first number of blocks for the first namespace. In this case, the upper limit of the number of first blocks that can be allocated for the first namespace is set to the first number. Moreover, the resource manager 45 transmits, to the SSD 3, a command to add blocks to be secured for the first namespaces, thereby adding a second number of blocks as the blocks to be secured for the first namespace. In this case, the upper limit of the number of first blocks that can be allocated for the first namespace is increased to the sum of the first number and the second number.

Yet further, the resource manager 45 controls a garbage collection (data copy operation) by transmitting the above-mentioned data copy command to the SSD 3.

That is, the processor 101 executes the FTL 44 to manage mapping between logical block addresses and the physical addresses of the NAND memory 5. Further, the processor 101 the resource manager 45 to control the garbage collection (data copy operation).

In this case, the processor 101 transmits, to the SSD 3, a data copy command to copy only valid data. As described above, the data copy command includes a copy source block, a copy start page in the copy source block, a copy destination block, a transfer start page (copy destination start page) in the copy destination block, bit map data indicating whether the data of each page of the copy source block is valid or invalid data, and a termination condition for designating either the number of valid data units to be copied until the end of copying, or the number of invalid data units to be detected until the end of copying.

Subsequently, the processor 101 receives, from the SSD 3, data copy information that indicates the identifiers of respective valid data units copied to the copy destination block, and locations in the copy destination block where the valid data units are stored. The processor 101 updates the address translation table based on the data copy information.

Furthermore, the processor 101 controls a subsequent garbage collection (data copy operation), based on the location of data whose copying is to be started next, which is notified by the SSD 3.

The processor 101 also executes the basic input/output system (BIOS) stored in the BIOS-ROM 103 as a nonvolatile memory. The BIOS is a system program for hardware control.

The network controller 105 is a communication device, such as a wired LAN controller or a wireless LAN controller. The peripheral interface controller 106 is configured to communicate with a peripheral, such as a USB device.

The controller 107 is configured to communicate with devices connected to a plurality of connectors 107A. In the embodiment, a plurality of SSDs 3 are connected to the respective connectors 107A. Examples of the controller 107 include an SAS expander, a PCIe Switch, a PCIe expander, a flash array controller, a RAID controller, etc.

The EC 108 functions as a system controller configured to perform power management of the information processing apparatus. The EC 108 turns on and off the power of the information processing apparatus in response to a user's operation of a power switch. The EC 108 is realized as a processing circuit such as a one-chip microcontroller. The EC 108 may contain a keyboard controller for controlling an input device such as a keyboard (KB).

Figure 66:
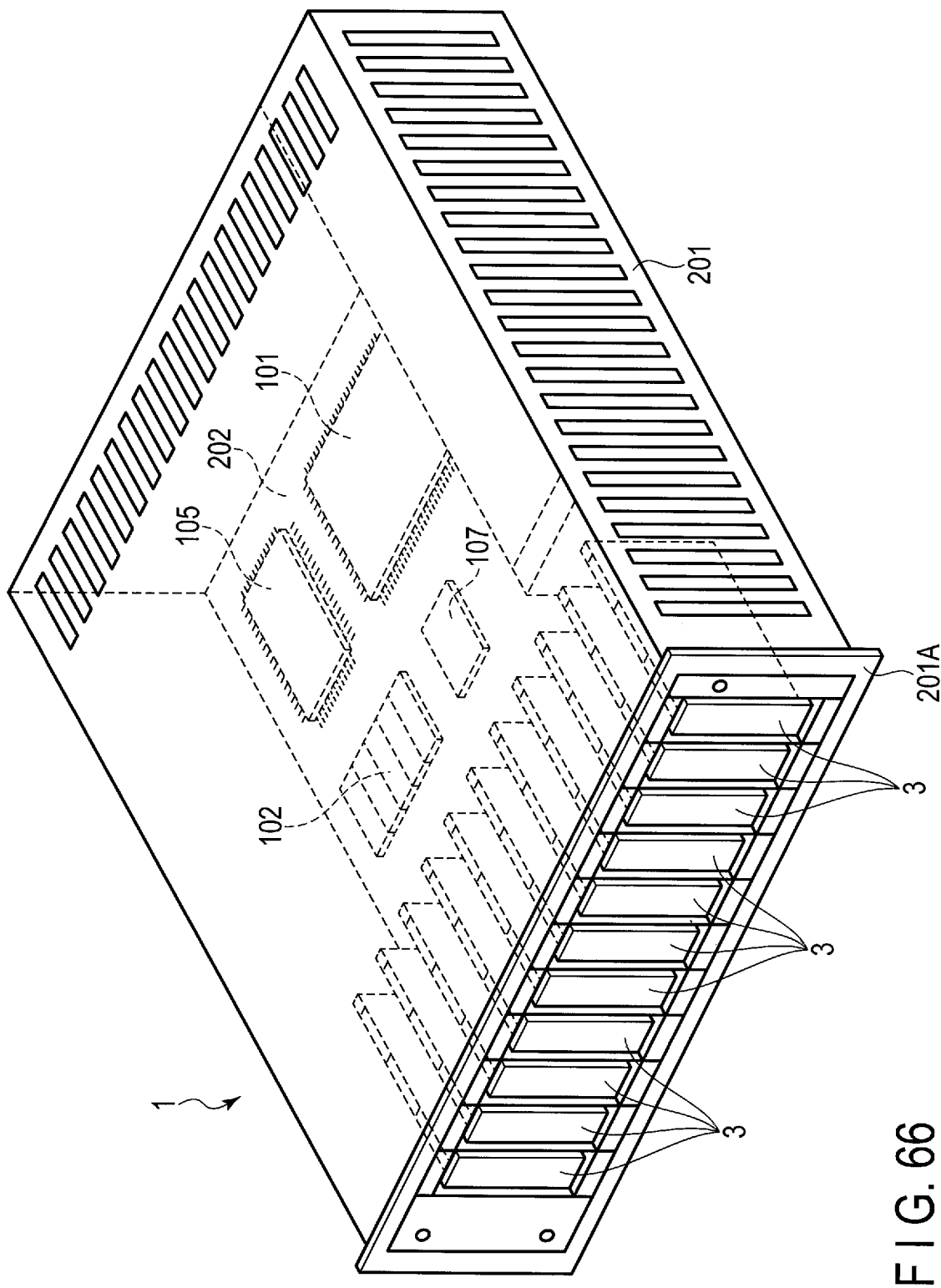
FIG. 66 is a perspective view illustrating a structure of a computer including the storage system of the embodiment and the host.

FIG. 66 shows a configuration example of the information processing apparatus including a plurality of SSDs 3 and the host 2.

This information processing apparatus comprises a thin box-shaped casing 201 that can be accommodated in a rack. The SSDs 3 may be arranged in the casing 201. In this case, the SSDs 3 may be detachably inserted in respective slots formed in the front surface 201A of the casing 201.

A system board (motherboard) 202 is placed in the casing 201. On the system board (motherboard) 202, various electronic components, which include the CPU 101, the memory 102, the network controller 105 and the controller 107, are mounted. These electronic components cooperate to function as the host 2.

As described above, in the namespace management function of the embodiments, the number (total number) of erase operations is counted namespace by namespace, and the erase count of each namespace can be reported to the host 2 in accordance with a request from the host 2. Accordingly, a measure associated with the amount of wear of the NAND memory 5 due to each namespace can be provided to the host 2, and hence the host 2 can perform a countermeasure for suppressing the wear of the NAND memory 5.

In addition, the embodiments employ a NAND memory as an example of the nonvolatile memory. However, the function of the embodiments is also applicable to other various nonvolatile memories, such as a magnetoresistive random access memory (MRAM), a phase-change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory; and
a controller electrically connected to the nonvolatile memory and configured to:
manage a plurality of command sets, different addressing methods being used in different command sets to specify access target data; and
in response to receiving a command from a host, the command requesting to create a namespace and specifying a command set among the plurality of command sets, allow the host to use the specified command set for the created namespace to issue an access command associated with the created namespace.

2. The memory system according to claim 1, wherein
the nonvolatile memory includes a plurality of blocks, each of the plurality of blocks being a unit of a data erase operation, and
the controller is further configured to:
manage a plurality of namespaces, the plurality of namespaces including at least a first namespace; and
allow the host to use, for the first namespace, a first command set as one of the plurality of command sets, the first command set including at least a first write command that specifies first data that is target data of the first write command by using at least an identifier of a block to which the first data is to be written.

3. The memory system according to claim 2, wherein
the controller is further configured to:
allocate one or more of the plurality of blocks to the first namespace, the allocated one or more of the plurality of blocks including at least a first block; and
in response to receiving the first write command from the host, the first write command requesting to write the first data and specifying an identifier of the first namespace and an identifier of the first block, write the first data to a first location of the first block, and
the allocation of the one or more of the plurality of blocks to the first namespace is executed before receiving the first write command that specifies the identifier of the first namespace and the identifier of the first block.

4. The memory system according to claim 3, wherein
the controller is configured to notify the host of the first location by using an offset address in the first block and the identifier of the first block.

5. The memory system according to claim 3, wherein
the allocated one or more of the plurality of blocks further include a second block, and
the controller is further configured to:
copy the first data to a second location of the second block; and
notify the host of the second location by using at least an identifier of the second block.

6. The memory system according to claim 1, wherein
the nonvolatile memory includes a plurality of blocks, each of the plurality of blocks being a unit of a data erase operation, and
the controller is further configured to:
manage one or more block groups, each of the one or more block groups including at least one of the plurality of blocks;
manage a plurality of namespaces, the plurality of namespaces including at least a second namespace; and
allow the host to use, for the second namespace, a second command set as one of the plurality of command sets, the second command set including at least a second write command that specifies second data that is target data of the second write command by using at least an identifier of a block group to which the second data is to be written.

7. The memory system according to claim 6, wherein
the controller is further configured to:
allocate one or more of a plurality of block groups to the second namespace, the allocated one or more of the plurality of block groups including at least a first block group; and
in response to receiving the second write command from the host, the second write command requesting to write the second data and specifying an identifier of the second namespace and an identifier of the first block group, write the second data to a third location of the first block group, and
the allocation of the one or more of the plurality of block groups to the second namespace is executed before receiving the second write command that specifies the identifier of the second namespace and the identifier of the first block group.

8. The memory system according to claim 7, wherein
the controller is configured to notify the host of the third location by using an offset address in the first block group and the identifier of the first block group.

9. The memory system according to claim 7, wherein
the allocated one or more of the plurality of block groups further include a second block group, and
the controller is further configured to:
copy the second data to a fourth location of the second block group; and
notify the host of the fourth location by using at least an identifier of the second block group.

10. The memory system according to claim 1, wherein
the nonvolatile memory includes a plurality of blocks, each of the plurality of blocks being a unit of a data erase operation, and
the controller is further configured to:
manage a plurality of free blocks among the plurality of blocks, each of the plurality of free blocks being common to a plurality of namespaces; and
in response to receiving a first command from the host, the first command specifying an identifier of a first namespace, allocate a first free block from the plurality of free blocks to the first namespace, a number of data erase operations performed on the first free block being smallest among numbers of data erase operations performed on the plurality of free blocks.

11. The memory system according to claim 1, wherein
the nonvolatile memory includes a plurality of blocks, each of the plurality of blocks being a unit of a data erase operation, and the controller is further configured to:
in response to receiving a second command from the host, the second command specifying an identifier of a first namespace, notify the host of a total number of data erase operations performed on one or more of the plurality of blocks allocated to the first namespace.

12. A method of controlling a nonvolatile memory, comprising:
managing a plurality of command sets, different addressing methods being used in different command sets to specify access target data;
receiving a command from a host, the command requesting to create a namespace and specifying a command set among the plurality of command sets; and
in response to receiving the command from the host, allowing the host to use the specified command set for the created namespace to issue an access command associated with the created namespace.

13. The method according to claim 12, wherein
the nonvolatile memory includes a plurality of blocks, each of the plurality of blocks being a unit of a data erase operation, and
the method further comprises:
managing a plurality of namespaces, the plurality of namespaces including at least a first namespace; and
allowing the host to use, for the first namespace, a first command set as one of the plurality of command sets, the first command set including at least a first write command that specifies first data that is target data of the first write command by using at least an identifier of a block to which the first data is to be written.

14. The method according to claim 13, further comprising:
allocating one or more of the plurality of blocks to the first namespace, the allocated one or more of the plurality of blocks including at least a first block;
receiving the first write command from the host, the first write command requesting to write the first data and specifying an identifier of the first namespace and an identifier of the first block; and
in response to receiving the first write command from the host,
writing the first data to a first location of the first block, wherein
the allocation of the one or more of the plurality of blocks to the first namespace is executed before receiving the first write command that specifies the identifier of the first namespace and the identifier of the first block.

15. The method according to claim 14, further comprising:
notifying the host of the first location by using an offset address in the first block and the identifier of the first block.

16. The method according to claim 14, wherein
the allocated one or more of the plurality of blocks further include a second block, and
the method further comprises:
copying the first data to a second location of the second block; and
notifying the host of the second location by using at least an identifier of the second block.

17. The method according to claim 12, wherein
the nonvolatile memory includes a plurality of blocks, each of the plurality of blocks being a unit of a data erase operation, and
the method further comprises:
managing one or more block groups, each of the one or more block groups including at least one of the plurality of blocks;
managing a plurality of namespaces, the plurality of namespaces including at least a second namespace; and
allowing the host to use, for the second namespace, a second command set as one of the plurality of command sets, the second command set including at least a second write command that specifies second data that is target data of the second write command by using at least an identifier of a block group to which the second data is to be written.

18. The method according to claim 17, further comprising:
allocating one or more of a plurality of block groups to the second namespace, the allocated one or more of the plurality of block groups including at least a first block group;
receiving the second write command from the host, the second write command requesting to write the second data and specifying an identifier of the second namespace and an identifier of the first block group; and
in response to receiving the second write command from the host, writing the second data to a third location of the first block group, wherein
the allocation of the one or more of the plurality of block groups to the second namespace is executed before receiving the second write command that specifies the identifier of the second namespace and the identifier of the first block group.

19. The method according to claim 18, further comprising:
notifying the host of the third location by using an offset address in the first block group and the identifier of the first block group.

20. The method according to claim 18, wherein
the allocated one or more of the plurality of block groups further include a second block group, and
the method further comprises:
copying the second data to a fourth location of the second block group; and
notifying the host of the fourth location by using at least an identifier of the second block group.

21. The method according to claim 12, wherein
the nonvolatile memory includes a plurality of blocks, each of the plurality of blocks being a unit of a data erase operation, and
the method further comprises:
managing a plurality of free blocks among the plurality of blocks, each of the plurality of free blocks being common to a plurality of namespaces;
receiving a first command from the host, the first command specifying an identifier of a first namespace; and
in response to receiving the first command from the host, allocating a first free block from the plurality of free blocks to the first namespace, a number of data erase operations performed on the first free block being smallest among numbers of data erase operations performed on the plurality of free blocks.

22. The method according to claim 12, wherein
the nonvolatile memory includes a plurality of blocks, each of the plurality of blocks being a unit of a data erase operation, and the method further comprises:
- receiving a second command from the host, the second command specifying an identifier of a first namespace; and
- in response to receiving the second command from the host, notifying the host of a total number of data erase operations performed on one or more of the plurality of blocks allocated to the first namespace.

* * * * *